(12) United States Patent
Nishihara et al.

(10) Patent No.: US 10,816,680 B2
(45) Date of Patent: Oct. 27, 2020

(54) DETECTION DEVICE AND ELECTRONIC EQUIPMENT

(71) Applicant: SONY SEMICONDUCTOR SOLUTIONS CORPORATION, Kanagawa (JP)

(72) Inventors: Toshiyuki Nishihara, Kanagawa (JP); Masao Matsumura, Kanagawa (JP); Tsutomu Imoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 2 days.

(21) Appl. No.: 16/316,665

(22) PCT Filed: Jul. 7, 2017

(86) PCT No.: PCT/JP2017/024892
§ 371 (c)(1),
(2) Date: Jan. 10, 2019

(87) PCT Pub. No.: WO2018/016345
PCT Pub. Date: Jan. 25, 2018

(65) Prior Publication Data
US 2019/0154850 A1  May 23, 2019

(30) Foreign Application Priority Data

Jul. 21, 2016 (JP) .................. 2016-143270

(51) Int. Cl.
*H01L 27/146* (2006.01)
*G01T 1/20* (2006.01)
(Continued)

(52) U.S. Cl.
CPC .......... *G01T 1/2018* (2013.01); *H01L 27/146* (2013.01); *H04N 5/357* (2013.01);
(Continued)

(58) Field of Classification Search
CPC ...... G01T 1/2018; H04N 5/357; H04N 5/378; G01N 15/1429; H01L 27/146
See application file for complete search history.

(56) References Cited

U.S. PATENT DOCUMENTS 9,433,338 B2 * 9/2016 Akahane ............... H04N 5/363
2006/0262209 A1   11/2006 Kishi
(Continued)

FOREIGN PATENT DOCUMENTS

JP   S60-257679    12/1985
JP   2002-217447   8/2002
(Continued)

OTHER PUBLICATIONS

International Search Report prepared by the Japan Patent Office dated Sep. 29, 2017, for International Application No. PCT/JP2017/024892.

*Primary Examiner* — Kiho Kim
(74) *Attorney, Agent, or Firm* — Sheridan Ross P.C.

(57) ABSTRACT

The present disclosure relates to a detection device and electronic equipment, in which a detection accuracy of minute light can be improved.
A detection device includes: a pixel array portion in which a plurality of first pixels including a photoelectric conversion unit, and a plurality of second pixels not including a photoelectric conversion unit, are arranged; and a driving unit configured to drive the first pixel and the second pixel. The present technology, for example, can be applied to a light detector, a radiation counter device performing radiation counting by using the light detector, and a biological examination device using the light detector, such as a flow cytometer.

20 Claims, 21 Drawing Sheets

(51) Int. Cl.
  *H04N 5/357*   (2011.01)
  *H04N 5/378*   (2011.01)
  *H04N 5/369*   (2011.01)
  *G01N 15/14*   (2006.01)

(52) U.S. Cl.
  CPC ............ *H04N 5/378* (2013.01); *H04N 5/379* (2018.08); *G01N 15/1429* (2013.01)

(56) References Cited

U.S. PATENT DOCUMENTS

| | | |
|---|---|---|
| 2012/0138807 A1 | 6/2012 | Kondou |
| 2012/0286139 A1 | 11/2012 | Tashiro et al. |
| 2014/0094993 A1 | 4/2014 | Johnson |
| 2016/0178768 A1 | 6/2016 | Tredwell |

FOREIGN PATENT DOCUMENTS

| | | | |
|---|---|---|---|
| JP | 2006-352843 | 12/2006 | |
| JP | 4424753 B2 * | 3/2010 | ............ H04N 5/361 |
| JP | 2012-090032 | 5/2012 | |
| JP | 2012-119956 | 6/2012 | |
| JP | 2012-253741 | 12/2012 | |

* cited by examiner

| PIXEL ROW | LIGHT DETECTION SIGNAL OF EACH PIXEL |
|---|---|
| R0 | (Acc0+n2) − (Rst0+n1) |
| R1 | (Acc1+n3) − (Rst1+n2) |
| R2 | (Acc2+n4) − (Rst2+n3) |
| R3 | (Acc3+n5) − (Rst3+n4) |

| PIXEL ROW | LIGHT DETECTION SIGNAL OF EACH PIXEL | REPLICA PIXEL ROW | NOISE DETECTION SIGNAL OF EACH REPLICA PIXEL |
|---|---|---|---|
| R0 | (Acc0+n5) - (Rst0+n1) | RF1 | n5 - n1 |
| R1 | (Acc1+n6) - (Rst1+n2) | RF0 | n6 - n2 |
| R2 | (Acc2+n7) - (Rst2+n3) | RF1 | n7 - n3 |

| PIXEL ROW | LIGHT DETECTION SIGNAL OF EACH PIXEL | NOISE DETECTION SIGNAL OF EACH REPLICA PIXEL |
|---|---|---|
| R0 | (Acc0+n5) - (Rst0+n1) | n5 - n1 |
| R1 | (Acc1+n6) - (Rst1+n2) | n6 - n2 |
| R2 | (Acc2+n7) - (Rst2+n3) | n7 - n3 |

DETECTION DEVICE AND ELECTRONIC EQUIPMENT

CROSS REFERENCE TO RELATED APPLICATIONS

This application is a national stage application under 35 U.S.C. 371 and claims the benefit of PCT Application No. PCT/JP2017/024892 having an international filing date of 7 Jul. 2017, which designated the United States, which PCT application claimed the benefit of Japanese Patent Application No. 2016-143270 filed 21 Jul. 2016, the entire disclosures of each of which are incorporated herein by reference.

TECHNICAL FIELD

A technology according to the present disclosure relates to a detection device and electronic equipment, and in particular, relates to a detection device and electronic equipment, in which weak light is detected.

BACKGROUND ART

In the related art, a radiation counter (a photon counter) counting radiation dose of a radiation incident on a detector, while performing each energy separation in incident photon unit, is applied to various types of equipment such as a survey meter or a gamma camera. In the detector, in general, a scintillator and a photomultiplier tube are used.

However, the photomultiplier tube is expensive, and is not suitable for a reduction in size and weight. In addition, the photomultiplier tube is easily affected by a magnetic field. For this reason, it has been proposed that an array of avalanche photo diodes (APD) or silicon photo multipliers (SiPM) is used instead of the photomultiplier tube (for example, refer to Patent Documents 1 and 2).

CITATION LIST

Patent Document

Patent Document 1: Japanese Patent Application Laid-Open No. 2009-25308
Patent Document 2: Japanese Unexamined Patent Application Publication (Translation of PCT Application) No. 2011-515676

SUMMARY OF THE INVENTION

Problems to be Solved by the Invention

However, in the case of using the array of the APD, an output signal is extremely weak, and an output variation due to a temperature is severe, and the detector is easily affected by the external environment. In addition, in the case of using the array of the SiPM, a high electric field is required, and thus, a dark current increases, and a floor noise increases due to an after pulse, a cross talk, or the like. Further, a high voltage is used in both of the APD and the SiPM, and thus, a separate power circuit is necessary, and the output is an analog signal. For this reason, it is necessary to externally attach a separate amplifier or an integration circuit, and an AD conversion circuit, and the detector is easily affected by the external noise during signal transmission.

A technology according to the present disclosure has been made in consideration of such circumstances, and an object thereof is to improve a detection accuracy of minute light.

Solutions to Problems

A detection device of a first aspect of the technology according to the present disclosure includes: a pixel array portion in which a plurality of first pixels including a photo electric conversion unit, and a plurality of second pixels not including a photoelectric conversion unit, are arranged; and a driving unit configured to drive the first pixel and the second pixel.

The second pixels can be arranged in a region in which the first pixels are arranged.

The second pixels can be arranged between the adjacent first pixels in a row in which the first pixels of performing sampling at the same timing, are arranged.

A control line of supplying a first selection signal for selecting the first pixel in the row, can be different from a control line of supplying a second selection signal for selecting the second pixel in the row.

The second pixel has a configuration in which at least the photoelectric conversion unit is deleted from the first pixel, and a transistor corresponding to a transfer transistor transferring a charge of the photoelectric conversion unit of the first pixel, can be constantly turned off.

The second pixels can be arranged out of a region in which the first pixels are arranged.

In the second pixel, a first transistor corresponding to an amplification transistor of the first pixel, and a second transistor corresponding to a selection transistor of the first pixel are provided, and a predetermined voltage can be applied to a gate of the first transistor.

A detection unit configured to perform sampling of a reset signal indicating a reset level of the first pixel, and an accumulation signal indicating an accumulated charge amount, and sampling of a replica signal, the replica signal being a signal of the second pixel, can further be provided.

The driving unit is capable of performing first driving of driving the first pixel and the second pixel such that a timing for sampling the reset signal of a first pixel group including the plurality of first pixels, is matched to a timing for sampling a first replica signal of a second pixel group including the plurality of second pixels, and a timing for sampling the accumulation signal of the first pixel group, is matched to a timing for sampling a second replica signal of the second pixel group.

The driving unit is capable of driving the first pixel and the second pixel such that sampling is performed in unit of a predetermined number of rows of the pixel array portion, and the first pixel group is capable of including the first pixels in the predetermined number of rows, and the second pixel group is capable of including the second pixels in the predetermined number of rows.

The driving unit is capable of switching the first driving to second driving of driving the first pixel and the second pixel such that the second pixel is fixed to be in a non-selected state, the sampling of the reset signal and the accumulation signal of each of the first pixels is performed in a predetermined order, and a timing for sampling the accumulation signal of one of a third pixel group and a fourth pixel group, and a timing for sampling the reset signal of the other of the third pixel group and the fourth pixel group, back and forth in a sampling order, are matched to each other.

An output control unit configured to generate a first differential signal based on a difference between the accumulation signal and the reset signal of one or the plurality of first pixels, and a second differential signal based on a difference between the second replica signal and the first replica signal of one or the plurality of second pixels, can further be provided.

The output control unit is capable of generating a third differential signal based on a difference between the first differential signal and the second differential signal.

Electronic equipment of a second aspect of the technology according to the present disclosure includes: a detection device; and a signal processing unit configured to process a signal of the detection device, in which the detection device includes: a pixel array portion in which a plurality of first pixels including a photoelectric conversion unit, and a plurality of second pixels not including a photoelectric conversion unit, are arranged; and a driving unit configured to drive the first pixel and the second pixel.

A detection device of a third aspect of the technology according to the present disclosure includes: a pixel array portion in which a plurality of pixels are arranged; a detection unit configured to perform sampling of a reset signal indicating a reset level of each of the pixels, and an accumulation signal indicating an accumulated charge amount; and a driving unit configured to drive the pixel such that the sampling of the reset signal and the accumulation signal of each of the pixels is performed in a predetermined order, and a timing for sampling the accumulation signal of one of a first pixel group and a second pixel group, and a timing for sampling the reset signal of the other of the first pixel group and the second pixel group, back and forth in a sampling order, are matched to each other.

The number of pixels of the first pixel group can be approximately identical to the number of pixels of the second pixel group.

The driving unit drives the pixel such that sampling of a signal of each of the pixels can be performed in unit of a predetermined number of rows, and the number of rows of the first pixel group can be identical to the number of rows of the second pixel group.

An output control unit configured to generate a differential signal based on a difference between the accumulation signal and the reset signal of one or the plurality of pixels, can further be provided.

Electronic equipment of a fourth aspect of the technology according to the present disclosure includes: a detection device; and a signal processing unit configured to process a signal of the detection device, in which the detection device includes: a pixel array portion in which a plurality of pixels are arranged; a plurality of detection units configured to perform sampling of a reset signal indicating a reset level of each of the pixels, and an accumulation signal indicating an accumulated charge amount; and a driving unit configured to drive the pixels such that the sampling of the reset signal and the accumulation signal of each of the pixels is performed in a predetermined order, and a timing for sampling the accumulation signal one of a first pixel group and a second pixel group, and a timing for sampling the reset signal of the other of the first pixel group and the second pixel group, back and forth in a sampling order, are matched to each other.

In a first aspect of the technology according to the present disclosure, a plurality of first pixels including a photo electric conversion unit, and a plurality of second pixels not including a photoelectric conversion unit, are driven.

In a second aspect of the technology according to the present disclosure, in a detection device, a plurality of first pixels including a photoelectric conversion unit, and a plurality of second pixels not including a photoelectric conversion unit, are driven, and a signal of the detection device is processed.

In a third aspect of the technology according to the present disclosure, sampling of a reset signal and an accumulation signal of each pixel is performed in a predetermined order, and a timing for sampling the accumulation signal of one of a first pixel group and a second pixel group, and a timing for sampling the reset signal of the other of the first pixel group and the second pixel group, back and forth in a sampling order, are matched to each other.

In a fourth aspect of the technology according to the present disclosure, in a detection device, sampling of a reset signal and an accumulation signal of each pixel is performed in a predetermined order, and a timing for sampling the accumulation signal of one of a first pixel group and a second pixel group, and a timing for sampling the reset signal of the other of the first pixel group and the second pixel group, back and forth in a sampling order, are matched to each other, and a signal of the detection device is processed.

Effects of the Invention

According to the first aspect to the fourth aspect of the technology according to the present disclosure, a detection accuracy of minute light is improved.

Furthermore, the effects described herein are not necessarily limited, and may be any of the effects described in the present disclosure.

MODE FOR CARRYING OUT THE INVENTION

Hereinafter, modes (hereinafter, referred to as embodiments) for carrying out the technology according to the present disclosure (hereinafter, also simply referred to as the present technology), will be described. Furthermore, the description will be given in the following order.

1. First Embodiment (Example Applied to Rolling Shutter Type Radiation Counter Device)
2. Second Embodiment (First Example Applied to Global Shutter Type Radiation Counter Device)
3. Third Embodiment (Second Example Applied to Global Shutter Type Radiation Counter Device)
4. Fourth Embodiment (Example Applied to Flow Cytometer)
5. Modification Example
6. Application Example

1. First Embodiment

First, a first embodiment of the present technology will be described with reference to FIG. 1 to FIG. 9.

<1-1. Configuration Example of Radiation Counter Device>

Figure 1:
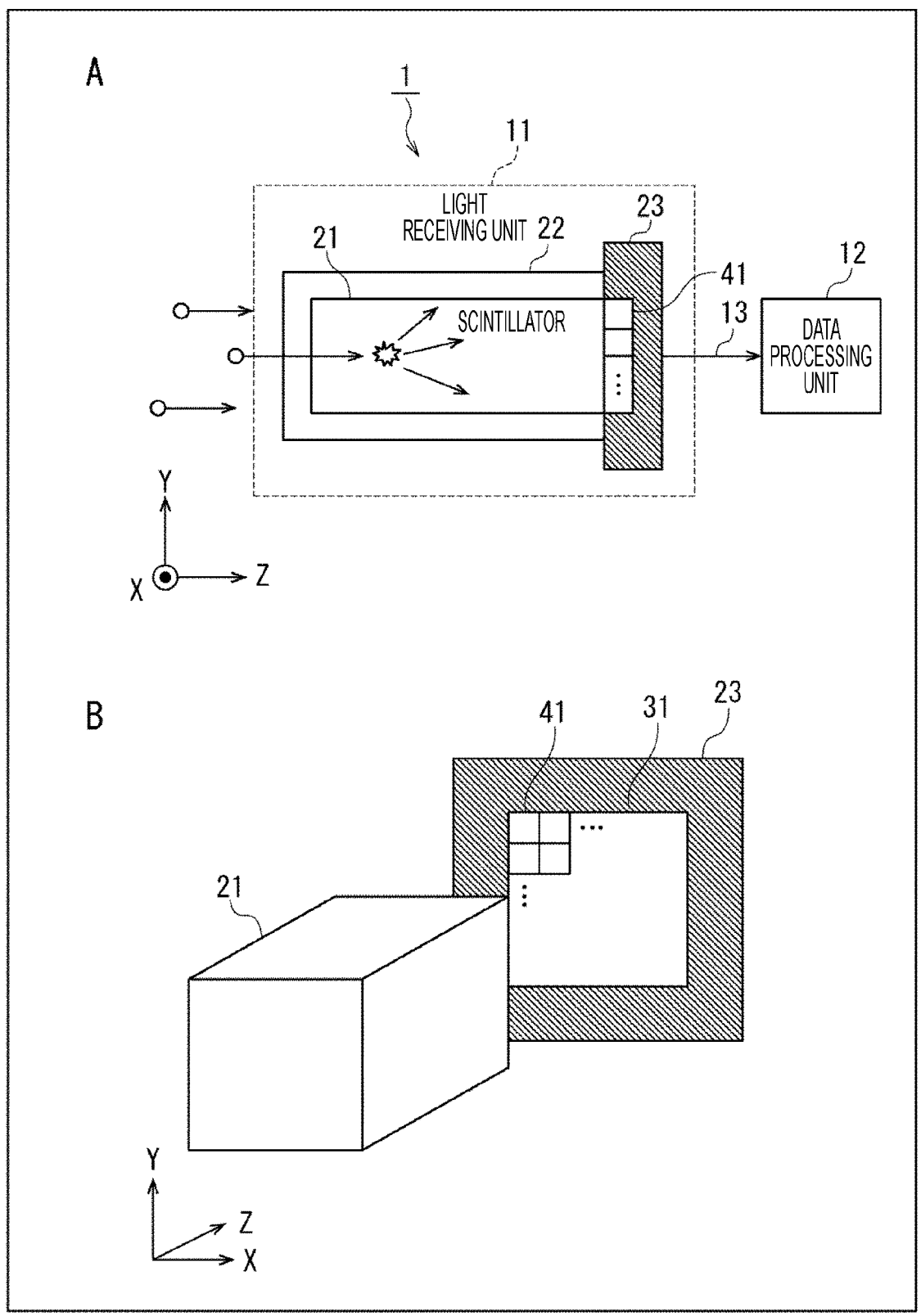
FIG. 1 is a diagram illustrating a configuration example of a radiation counter device, which is a first embodiment of the technology according to the present disclosure.

FIG. 1 is a configuration example of a radiation counter device 1 to which the present technology is applied. A of FIG. 1 schematically illustrates a sectional view of a light receiving unit 11 of the radiation counter device 1, and B of FIG. 1 schematically illustrates a perspective view of a scintillator 21 and a light detector 23 of the light receiving unit 11.

The radiation counter device 1 includes the light receiving unit 11 and a data processing unit 12. The light receiving unit 11 includes the scintillator 21, a partition wall 22, and a light detector 23.

The scintillator 21, for example, contains cesium iodide (CsI) or sodium iodide (NaI), and the size of a surface facing the light detector 23 is worked into the shape of a rectangular parallelepiped of 4 millimeter (mm) square. Then, in a case where a photon of a radiation is incident, the scintillator 21 generates a photon of visible light in proportion to the energy, and emits pulse light of visible light (hereinafter, also referred to as scintillation light).

The partition wall 22, for example, contains a reflective substance (for example, aluminum) reflecting light, covers the scintillator 21, and shields visible light. Here, the partition wall 22, only surfaces facing each other in the vicinity of the light detector 23, are opened. With this arrangement, most of the photons generated by the scintillator 21 are incident on the light detector 23.

The light detector 23 detects the scintillation light generated by the scintillator 21, and generates a digital signal according to a light amount of the scintillation light. Specifically, a pixel array portion 31 is provided on a light receiving surface of the light detector 23, facing the scintillator 21. In the pixel array portion 31, a plurality of pixels 41 are arrayed into the shape of a two-dimensional lattice. Each of the pixels 41 generates a charge according to the incident scintillation light. The light detector 23 generates a digital signal corresponding to the charge generated by each of the pixels 41, and supplies the generated digital signal to the data processing unit 12, through a signal line 13.

Furthermore, it is desirable that the scintillator 21 and the light detector 23 adhere to each other by an optical adhesive agent having a suitable refractive index. Alternatively, a light guide of fiber glass or the like, may be inserted between the scintillator 21 and the light detector 23.

In addition, hereinafter, it is assumed that in the pixel array portion 31, a total of 40000 of each 200 pixels 41 are arrayed in an X direction (a horizontal direction) and a Y direction (a vertical direction) 200 by 200. Furthermore, the details of the pixel 41 will be described later.

The data processing unit 12, for example, includes a computer provided with a central processing unit (CPU), a read only memory (ROM), a random access memory (RAM), and the like. Then, the data processing unit 12 reads out a program stored in the ROM, a semiconductor memory, or the like, and executes the program by the CPU, and thus, executes various signal processings. For example, the data processing unit 12 performs radiation counting by processing the digital signal supplied from the light detector 23. In addition, for example, the data processing unit 12 detects a light amount of a light emitting pulse, and determines the energy of the radiation incident on the light receiving unit 11 (specifies a radiation source on the basis of the energy).

Furthermore, in the radiation counter device 1, a set of the scintillator 21 and the light detector 23 is tiled in an X-Y direction (a plurality of scintillators 21 and the light detectors 23 are arrayed into the shape of an array), and thus, it is possible to configure a radiation counter device having spatial resolution, such as a gamma camera.

<1-2. First Embodiment of Light Detector>

Figure 2:
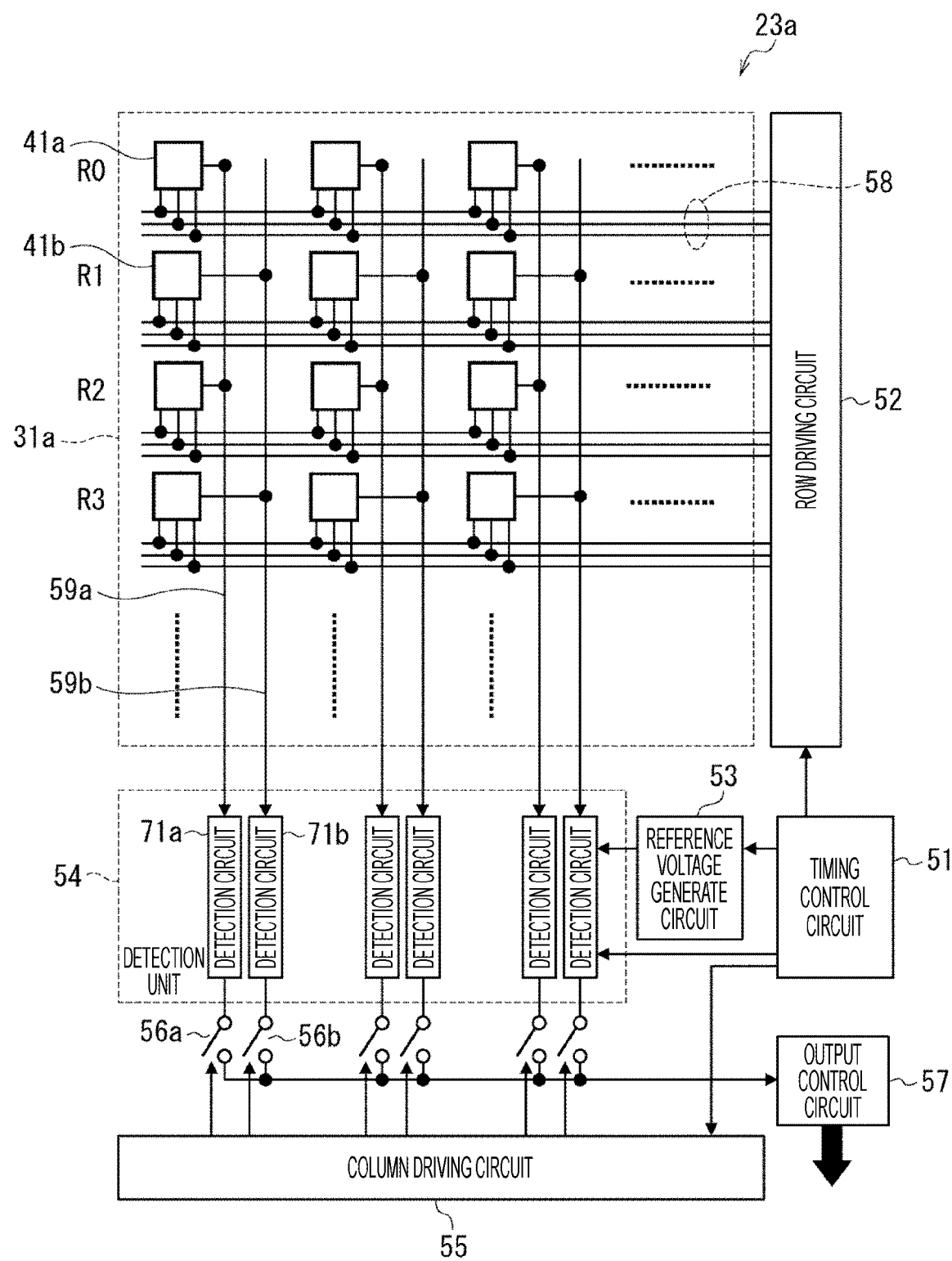
FIG. 2 is a block diagram illustrating a first embodiment of a light detector.

FIG. 2 illustrates an example of a circuit configuration of a light detector 23a, which is a first embodiment of the light detector 23 of FIG. 1.

The light detector 23a includes a pixel array portion 31a, which is a first embodiment of the pixel array portion 31 of FIG. 1, a timing control circuit 51, a row driving circuit 52, a reference voltage generate circuit 53, a detection unit 54, a column driving circuit 55, a plurality of switches 56a and switches 56b, an output control circuit 57, and the like. The detection unit 54 includes a plurality of detection circuits 71a and detection circuits 71b. Each circuit configuring the light detector 23a, for example, is provided on one chip.

In the pixel array portion 31a, as described above, the plurality of pixels 41 are arrayed into the shape of a two-dimensional lattice. Hereinafter, in a predetermined direction in which the plurality of pixels 41 are arrayed (the X direction of FIG. 1) will be referred to as a row direction, and a direction orthogonal to the row direction (the Y direction of FIG. 1) will be referred to as a column direction.

Furthermore, hereinafter, in the pixel 41 of the pixel array portion 31a, the pixel 41 of an odd row (an R0 row, an R2 row, an R4 row, . . . ) will be referred to as a pixel 41a, and the pixel 41 of an even row (an R1 row, an R3 row, an R5 row, . . . ) will be referred to as a pixel 41b. Here, it is not necessary to distinguish the pixel 41a from the pixel 41b, the pixel will be simply referred to as the pixel 41.

In each pixel column of the pixel array portion 31a, a detection circuit 71a and a detection circuit 71b, and a switch 56a and a switch 56b are provided. For example, in the 0-th column of the pixel array portion 31a, the pixel 41a of the odd row is connected to the detection circuit 71a and the switch 56a through a vertical signal line 59a, and the pixel 41b of the even row is connected to the detection circuit 71b and the switch 56b through a vertical signal line 59b. The same applies to the other pixel columns. In addition, each of the pixels 41 of the pixel array portion 31a is connected to the row driving circuit 52 through the control line 58.

The timing control circuit 51 controls an operation timing of the row driving circuit 52, the reference voltage generate circuit 53, the column driving circuit 55, the detection circuit 71a, the detection circuit 71b, and the like. For example, the timing control circuit 51 generates a timing control signal indicating a row scanning timing, and supplies the timing control signal to the row driving circuit 52. In addition, the timing control circuit 51 generates a digital to analog (DAC) control signal of controlling a supply operation of a reference voltage, and supplies the DAC control signal to the reference voltage generate circuit 53. Further, timing control circuit 51 generates a timing control signal indicating a column scanning timing, and supplies the timing control signal to the column driving circuit 55. In addition, the timing control circuit 51 supplies a detection control signal of controlling the operation of the detection circuit 71a and the detection circuit 71b, to the detection circuit 71a and the detection circuit 71b.

The row driving circuit 52 drives each of the pixels 41, according to the control of the timing control circuit 51.

The reference voltage generate circuit 53 generates a reference voltage Vref, according to the DAC control signal, and supplies the reference voltage Vref to each of the detection circuit 71a and the detection circuit 71b.

The detection circuit 71a compares a voltage of an analog pixel signal (hereinafter, simply referred to as an analog signal) to be output from the pixel 41a in the pixel array portion 31a, with the reference voltage Vref, according to the control of the timing control circuit 51, and thus, converts the analog signal into a digital pixel signal (hereinafter, simply referred to as a digital signal), and retains the digital signal. The detection circuit 71b compares a voltage of an analog signal to be output from the pixel 41b in the pixel array portion 31a, with the reference voltage Vref, according to the control of the timing control circuit 51, and thus, converts the analog signal into a digital signal, and retains the digital signal. With this arrangement, the analog signals of the pixels 41a and 41b can be approximately simultaneously sampled by the detection circuit 71a and the detection circuit 71b, and can be subjected to AD conversion. In addition, such sampling is performed with respect to the pixels 41 arranged in the same row, all at once.

The column driving circuit 55 controls the state of the switch 56a and the switch 56b, according to the control of the timing control circuit 51.

The switch 56a supplies the digital signal retained in the detection circuit 71a, which is a connection destination, to the output control circuit 57, according to the control of the column driving circuit 55. The switch 56b supplies the digital signal retained in the detection circuit 71b, which is a connection destination, to the output control circuit 57, according to the control of the column driving circuit 55.

Furthermore, each of the detection circuits 71a may sequentially perform the AD conversion with respect to the analog signal of each of the pixels 41a in the corresponding pixel column, may sum up the digital signals after the AD conversion, and may supply the sum to the output control circuit 57. That is, each of the detection circuits 71a may perform not only the AD conversion with respect to the analog signal of each of the pixels 41a in the corresponding pixel column, but also processing of summing up the digital signals after the AD conversion. Similarly, each of the detection circuits 71b may sequentially perform the AD conversion with respect to the analog signal of each of the pixels 41b in the corresponding pixel column, may sum up the digital signals after the AD conversion, and may supply the sum to the output control circuit 57.

The output control circuit 57, as necessary, performs an arithmetic operation with respect to the digital signals supplied from each of the detection circuits 71a and the detection circuits 71b, and supplies the obtained digital signals to the data processing unit 12 (FIG. 1).

Furthermore, hereinafter, in a case where it is not necessary to distinguish the switch 56a from the switch 56b, the switch will be simply referred to as a switch 56. Hereinafter, in a case where it is not necessary to distinguish the vertical signal line 59a from the vertical signal line 59b, the vertical signal line will be simply referred to as a vertical signal line 59. Hereinafter, in a case where it is not necessary to distinguish the detection circuit 71a from the detection circuit 71b, the detection circuit will be simply referred to as a detection circuit 71.

<1-3. Configuration Example of Substrate of Light Detector>

Figure 3:
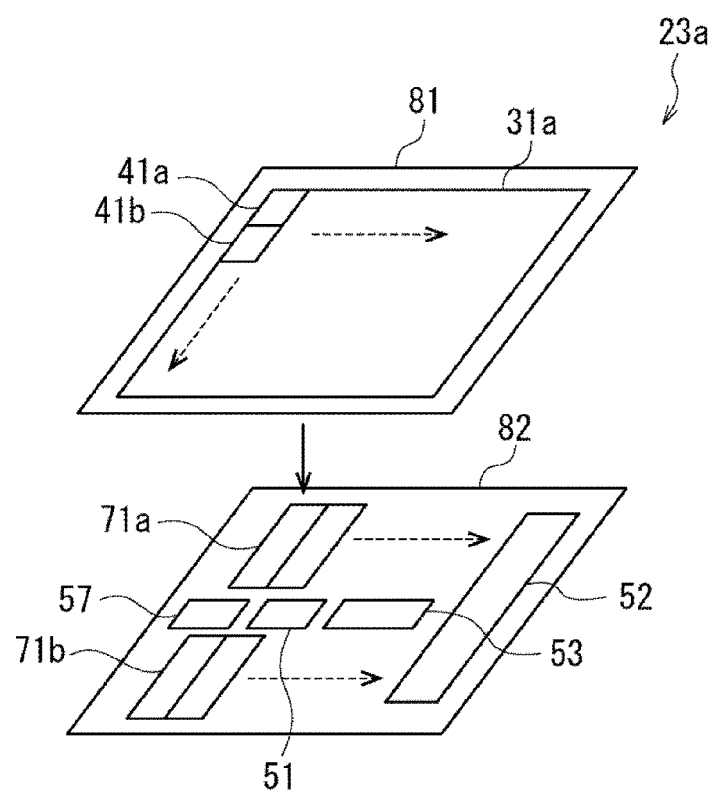
FIG. 3 is a schematic view illustrating a configuration example of a substrate of the light detector.

FIG. 3 schematically illustrates a configuration example of a substrate of the light detector 23a.

The light detector 23a may include one semiconductor substrate (for example, a silicon substrate), or may have a configuration in which a plurality of semiconductor substrates are laminated. For example, in FIG. 3, the light detector 23a has a laminated structure of two semiconductor substrates of an upper side substrate 81 and a lower side substrate 82.

The upper side substrate 81 and the lower side substrate 82 are laminated by using a substrate bonding technology such as adhesion of a silicon wafer. In addition, the upper side substrate 81 and the lower side substrate 82 are electrically connected to each other by a metallic bond such as a Cu—Cu bond, a through via, or the like.

The pixel array portion 31a is formed on the upper side substrate 81.

On the other hand, the timing control circuit 51, the row driving circuit 52, the reference voltage generate circuit 53, the column driving circuit 55 (not illustrated), the plurality of switches 56a and switches 56b, the output control circuit 57, the plurality of detection circuits 71a and detection circuits 71b, and the like are formed on the lower side substrate 82. For example, the plurality of detection circuits 71a are formed such that one detection circuit 71a corresponds to the plurality of pixels 41a in the same column of the pixel array portion 31a. Similarly, the plurality of detection circuits 71b are formed such that one detection circuit 71b corresponds to the plurality of pixels 41b in the same column of the pixel array portion 31a. That is, one detection circuit 71a and the detection circuit 71b of the lower side substrate 82, are shared in each of the plurality of pixels 41a and pixels 41b of the pixel array portion 31a. Furthermore, in this example, the detection circuit 71a and the detection circuit 71b are arranged to be separated up and down.

Thus, the light detector 23a has the laminated structure of the upper side substrate 81 and the lower side substrate 82, and thus, it is possible to increase a ratio (an aperture ratio) of the pixel array portion 31*a* in the light detector 23*a*. With this arrangement, even in a case where a large-size scintillator 21 is arranged on a front surface of the light receiving surface of the light detector 23*a*, it is possible to receive more scintillation light, and a radiation sensitivity of the light receiving unit 11 is improved. In particular, in a case where the tiling is performed as described above, it is possible to increase a light yield. Thus, incorporating more photons, is directly linked to a reduction in a ratio of a shot noise to the number of detected photons, and improvement in energy resolution.

<1-4. Circuit Configuration of Pixel>

Next, a circuit configuration of the pixel 41 will be described with reference to FIG. 4.

The pixel 41 includes a photodiode 111, an accumulation node 112, a transfer transistor 113, a detection node 114, a reset transistor 115, an amplification transistor 116, and a selection transistor 117. In the transfer transistor 113, the reset transistor 115, the amplification transistor 116, and the selection transistor 117, for example, an n type metal-oxide semiconductor (MOS) transistor is used.

An anode of the photodiode 111 is grounded, and a cathode is connected to a drain of the transfer transistor 113 through the accumulation node 112. A gate of the transfer transistor 113 is connected to the row driving circuit 52 through the control line 58, and a source is connected to the detection node 114. A gate of the reset transistor 115 is connected to the row driving circuit 52 through the control line 58, a drain is connected to a power source VDD, and a source is connected to the detection node 114. A gate of the amplification transistor 116 is connected to the detection node 114, a drain is connected to the power source VDD, and a source is connected to a drain of the selection transistor 117. A gate of the selection transistor 117 is connected to the row driving circuit 52 through the control line 58, and a source is connected to the vertical signal line 59.

The photodiode 111 is a photoelectric conversion element converting a photon into a charge. The photodiode 111 generates a pair of an electron and a hole, from a photon incident on a semiconductor substrate on which a circuit of the pixel 41 is formed, and the electrons (negative charges) are accumulated in the accumulation node 112.

Furthermore, incident light onto the light detector 23*a* is extremely weak compared to incident light onto an image sensor of a usual digital camera, and thus, it is desirable that a light receiving area of the photodiode 111 increases, compared to the image sensor of the usual digital camera.

When a driving signal TRG (a transfer signal) to be supplied from the row driving circuit 52 is at a high level (for example, a power source voltage VDD), the transfer transistor 113 is turned on (is in an active state), and when the driving signal TRG is at a low level (for example, a ground level), the transfer transistor 113 is turned off (is in a non-active state). In a case where the transfer transistor 113 is turned on, a charge is transferred from the accumulation node 112 to the detection node 114.

The detection node 114 accumulates the charges from the transfer transistor 113, and generates an analog voltage, according to the amount of the accumulated charges. The voltage is applied to the gate of the amplification transistor 116.

Furthermore, as described above, the incident light onto the light detector 23*a* is extremely weak compared to the incident light onto the image sensor of the usual digital camera, and thus, it is possible to decrease the size of the detection node 114, compared to the image sensor of the usual digital camera.

When a driving signal RST (a reset signal) to be supplied from the row driving circuit 52 is at a high level (for example, the power source voltage VDD), the reset transistor 115 is turned on (is in an active state), and when the driving signal RST is at a low level (for example, the ground level), the reset transistor 115 is turned off (is in a non-active state).

For example, the row driving circuit 52 turns on the reset transistor 115 along with the transfer transistor 113, and thus, the electrons accumulated in the accumulation node 112, are drawn to the power source VDD, and the pixel 41 is initialized to a dark state before accumulation, that is, a state in which light is not incident. Hereinafter, this will be referred to as photo diode (PD) reset.

In addition, the row driving circuit 52 turns on only the reset transistor 115, and thus, the charges accumulated in the detection node 114, are drawn to the power source VDD, and the charge amount is initialized. Hereinafter, this will be referred to as floating diffusion (FD) reset.

The amplification transistor 116 amplifies a charge signal of the gate, and transmits the charge signal to pixel output. Specifically, the amplification transistor 116 is connected to a constant current circuit 101 including a transistor 121, through the vertical signal line 59, and configures a source follower, and the voltage of the detection node 114 is output to the vertical signal line 59 at a predetermined gain (for example, less than 1.0). An analog signal indicating the voltage, is supplied to the detection circuit 71 including an AD converter 131, through the vertical signal line 59.

When a driving signal SEL (a selection signal) to be supplied from the row driving circuit 52, is at a high level (for example, the power source voltage VDD), the selection transistor 117 is turned on (is in an active state), and when the driving signal SEL is at a low level (for example, the ground level), the selection transistor 117 is turned off (is in a non-active state). In a case where the selection transistor 117 is turned on, the pixel 41 is in a selected state, and an analog signal indicating a voltage obtained by amplifying the voltage of the detection node 114 with the amplification transistor 116, is output to the vertical signal line 59.

The pixel 41 accumulates the photoelectrically converted charges therein, during a period after the photodiode 111 is reset until the reading is performed, and outputs a signal according to the accumulated charges at the time of the reading. The pixel 41 repeatedly executes the accumulation and the reading of such a unit period. With this arrangement, a result of a light pulse (the scintillation light) being incident during the accumulation, is obtained at the time of the reading.

Furthermore, an embedded type photodiode which is completely depleted when the charge is discharged due to the reset, is desirable as the type of photodiode 111. The characteristics of the embedded type photodiode 111 are that the detection node 114 and the accumulation node 112 of the photodiode 111 are not subjected to capacitive coupling at the time of the reading. As a result thereof, a conversion efficiency can be improved as parasitic capacitance of the detection node 114 is reduced, and a sensitivity with respect to the incidence of one photon, can be improved. In addition, even in a case where the photodiode 111 increases, the conversion efficiency is not degraded. Accordingly, a sensitivity per a pixel with respect to the same luminous flux density, is improved as the photodiode 111 increases. Furthermore, similar properties are observed even in a MOS type photoelectric conversion element.

In addition, the pixel 41, for example, does not perform electron multiplication as with an APD, an SiPM, and a high electron multiplier tube. Accordingly, an output signal of the pixel 41, is easily affected by reading noise due to the amplification transistor 116 or the AD converter 131 in the detection circuit 71, but as described above, the sensitivity is improved, and thus, the influence relatively decreases. That is, the parasitic capacitance of the detection node 114 is reduced as much as possible, and the photodiode 111 increases as much as possible within a range where one electron can be transferred, and thus, an SN ratio of the pixel 41 can be improved, and the pixel 41 as a high sensitivity detector, can be realized.

<1-5. Output Example of Pixel Signal>

The radiation counter device 1, for example, measures a weak light emitting pulse including several thousands of photons, for example, which are generated by photoelectric absorption of a photon of one radiation, in the scintillator 21. The light detector 23a receives the weak light emitting pulse, which is a measurement target, by the pixel array portion 31a including the plurality of pixels 41, and each of the pixels 41 outputs an analog signal independent according to a light receiving amount. The analog signal of the each of the pixels 41a, is converted by the AD converter 131, into a digital signal having a gradation larger than one bit.

In addition, in a case where weak pulse light is incident on the pixel array portion 31a of the light detector 23a, the light is received by being approximately homogeneously and randomly dispersed to each of the pixels 41a. Therefore, each pixel output in a case where the weak pulse light is received, also becomes approximately homogeneous.

Figure 5:
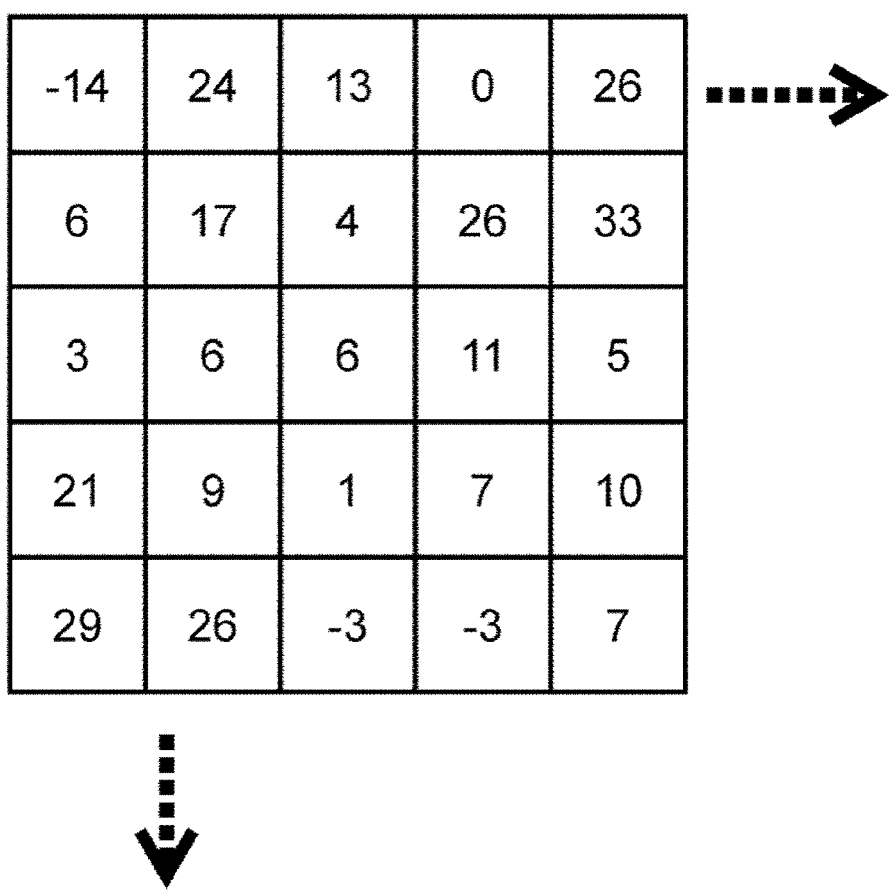
FIG. 5 is a diagram illustrating an example of a value of a signal of each of the pixels.

FIG. 5 illustrates an example of the value of the digital signal after the analog signal output from the each of the pixels 41 is subjected to AD conversion by the AD converter 131.

Furthermore, hereinafter, the AD converter 131 converts an analog electrical signal corresponding to one photon, into a digital signal having a gradation corresponding to 10LSB, and outputs the digital signal. Here, a least significant bit (LSB) is minimum output unit of a digital value.

Furthermore, the value of the digital signal to be output from the AD converter 131, includes a value corresponding to the reading noise, in addition to a value corresponding to a photon signal. That is, the value of the digital signal is a value in which the photon signal and the reading noise are synthesized. For this reason, there is a case where the digital signal due to the reading noise, has a negative value. In the example of FIG. 5, the value of the digital signal is illustrated as the negative value as it is, but homogeneous offset may be added to the digital signal of each of the pixels 41, or the negative value may be rounded up zero, such that the digital signal does not have the negative value.

The light detector 23a is an aggregate of the pixels 41, which are high sensitivity light detection cells respectively capable of outputting a signal according to a light receiving amount. Each of the pixels 41 of the light detector 23a does not perform the electron multiplication using a strong electric field, such as the APD or the Si-PM, and thus, the output signal is minute. For this reason, the reading noise included in the digital signal to be output from the AD converter 131, is significant, and thus, the number of incident photons in each of the pixels 41 is not capable of being accurately detected from the digital signal of each of the pixels 41. However, as described later, the digital signals of each of the pixels 41 are summed up, and thus, it is possible to detect a pulse light amount corresponding to one radiation, with a high accuracy.

<1-6. Influence of in-Phase Noise on Floor Noise of Light Detector>

However, in a case where the reading noise of each of the pixels 41 is an independent event, that is, in a case where there is no correlation in the reading noise between the pixels 41, the reading noise becomes a noise of square root multiple of the number of pixels summed up by an averaging effect, in the case of summing up the digital signals of the plurality of pixels 41.

On the other hand, in a case where the reading noise of each of the pixels 41 is a dependent event, that is, in a case where a similar noise is generated in the plurality of pixels 41, the averaging effect described above is not exhibited, and the reading noise becomes a noise of a multiple of the number of pixels, as it is. That is, as with the light detector 23a, in a case where all of the plurality of pixels 41 are used as one light detector, the influence of such a dependent event type noise is significant, and thus, easily becomes a dominant factor of the floor noise.

For example, a power source noise or a ground noise generated in the pixel 41 or the detection circuit 71, a noise superimposed on the reference voltage Vref to be supplied to each of the detection circuits 71 from the reference voltage generate circuit 53, a noise superimposed on the ground or the gate of the transistor 121 of the constant current circuit 101, and the like are exemplified as a representative example of such a dependent event type noise. Such noises appear as an in-phase noise component, in the signals of all of the pixels 41 which are simultaneously read.

The influence of such noises on a floor noise $\sigma_T$ (unit is electron rms), can be estimated by Equation (1) described below.

[Expression 1]

$$\sigma_T^2 = \underbrace{\sigma_P^2 \times (N \times M)}_{\substack{\text{Independent} \\ \text{noise component} \\ \text{for each pixel}}} + \underbrace{(\sigma_R \times N)^2 \times M}_{\substack{\text{In-phase noise} \\ \text{component for} \\ \text{each reading} \\ \text{processing}}} \qquad (1)$$

Furthermore, N represents the number of pixels which are simultaneously read (hereinafter, referred to as the number of simultaneously read pixels). M represents the number of times of reading necessary for reading a pixel signal of one frame (hereinafter, referred to as the total number of times of reading). That is, N×M corresponds to the total number of pixels in one frame. $\sigma_P$ represents a random noise component independently generated in each of the pixels 41 (unit is electron rms). $\sigma_R$ represents an in-phase noise component generated each time when the pixel signal is read (unit is electron rms).

For example, in the light detector 23a, the influence of the random noise component $\sigma_P$ and the in-phase noise component $\sigma_R$ in the case of summing up the pixel signals of the pixels 41 of 200 pixels×200 pixels of the pixel array portion 31a, is approximately calculated. As described later, the pixel signal is read every two rows, and thus, the number N of simultaneously read pixels is 400 pixels, and the total number M of times of reading is 100 times.

In an image sensor used for general imaging, the in-phase noise component is suppressed to approximately ⅕ to 1/10 of the random noise component, and thus, a brightness change or a tone change generated due to the in-phase noise component into the shape of a block, is at a visually inconspicuous level. Therefore, in a case where the random noise component $\sigma_P$ independently generated in each of the pixels 41 is set to 1 electron rms, the in-phase noise component $\sigma_R$ generated in each of the pixels 41, in reading processing for every two rows, is set to 0.1 electron rms of $\frac{1}{10}$ of the random noise component $\sigma_P$, the floor noise $\sigma_T$ is represented by Equation (2) described below.

[Expression 2]

$$\sigma_T^2 = \underbrace{1^2 \times (400 \times 100)}_{Electron} + \underbrace{(0.1 \times 400)^2 \times 100}_{Electron} \quad (2)$$

The random noise component $\sigma_P$ is a square root of $1^2 \times$Total Number of Pixels, and is 200 electron rms. On the other hand, in the in-phase noise component $\sigma_R$, the total of two rows is 0.1×400=40 electron rms. Then, the in-phase noise component $\sigma_R$ of the total rows is the total of the reading processings of 100 times, and thus, is a square root of $40^2 \times 100$, and is 400 electron rms.

Then, the total floor noise $\sigma_T^2$ is a square sum of both of the random noise component $\sigma_P$ and the in-phase noise component $\sigma_R$, and the floor noise $\sigma_T$ is a square root thereof.

Thus, in each of the pixel 41, even though the in-phase noise component $\sigma_R$ is $\frac{1}{10}$ of the random noise component $\sigma_P$, the in-phase noise component $\sigma_R$ is twice the random noise component $\sigma_P$, in the case of summing up the pixel signals of the total pixels 41. Accordingly, in the floor noise $\sigma_T$ of the light detector 23a, the in-phase noise component $\sigma_R$ is more dominant than the random noise component $\sigma_P$.

In the light detector 23a, as described later, processing of reducing the in-phase noise component, is performed.

<1-7. Reading Method of Pixel Signal>

Next, a reading method of the pixel signal in the light detector 23a, will be described with reference to FIG. 6 to FIG. 8.

First, the outline of a method of reducing the in-phase noise component in the light detector 23a, will be described with reference to FIG. 6.

Here, a signal to be output from the pixel 41, in a state where the charges accumulated in the accumulation node 112 are transferred to the detection node 114, that is, a signal indicating the accumulated charge amount of the pixel 41 (hereinafter, referred to as an accumulation signal), includes an signal component proportional to the accumulated charges, and an offset component including a reset noise or the like. A signal to be output from the pixel 41, in a state where the charge of the detection node 114 after the FD reset or the PD reset, is reset, that is, a signal indicating a reset level of the pixel 41 (hereinafter, referred to as a reset signal), corresponds to a dark signal including an offset component. Accordingly, a signal including a signal component of the pixel 41 (hereinafter, referred to as a pixel light detection signal), is obtained by taking a difference between the accumulation signal and the reset signal, and by canceling the offset component. The pixel light detection signal includes the in-phase noise component described above. Then, the light detector 23a uses the accumulation signal and the reset signal, as it is, and thus, reduces the in-phase noise component included in the pixel light detection signal.

For example, in the pixel array portion 31a of FIG. 2, pixel signals are sequentially read in each of the rows of the R0 row, the R1 row, the R2 row, . . . . In addition, in the reading processing of the pixel signal of each of the pixels 41, first, the FD reset is performed, and the reset signal is read and sampled. Next, the charges accumulated in the accumulation node 112, are transferred to the detection node 114, and then, the accumulation signal is read and sampled. Here, the pixel signal is read according to a procedure of FIG. 6, and thus, the in-phase noise component is reduced.

First, in each of the pixels 41a of the R0 row, the FD reset is performed, and in a period T1a, a reset signal Rst0 of each of the pixels 41a of the R0 row, is sampled, and is subjected to the AD conversion. At this time, an in-phase noise component n1 is superimposed on the reset signal Rst0 of each of the pixels 41a.

Next, in each of the pixels 41a of the R0 row, the accumulated charges are transferred, and in each of the pixels 41b of the R1 row, the FD reset is performed. Then, in a period T2a, an accumulation signal Acc0 of each of the pixels 41a of the R0 row, and a reset signal Rst1 of each of the pixels 41b of the R1 row, are simultaneously sampled, and are subjected to the AD conversion. At this time, an in-phase noise component n2 is superimposed on the accumulation signal Acc0 of each of the pixels 41a, and the reset signal Rst1 of each of the pixels 41b.

Next, in each of the pixels 41b of the R1 row, the accumulated charges are transferred, and in each of the pixels 41a of the R2 row, the FD reset is performed. Then, in a period T3a, an accumulation signal Acc1 of each of the pixels 41b of the R1 row, and a reset signal Rst2 of each of the pixels 41a of the R2 row, are simultaneously sampled, and are subjected to the AD conversion. At this time, an in-phase noise component n3 is superimposed on the accumulation signal Acc1 of each of the pixels 41b, and the reset signal Rst2 of each of the pixels 41a.

In the subsequent periods of a period T4a, a period T5a, . . . , similar processing is repeated, and sequentially, an accumulation signal Acc(i) of an R(i) row and a reset signal Rst(i) of an R(i+1) row, are simultaneously sampled, and are subjected to the AD conversion. At this time, an in-phase noise component n(i+1) is superimposed on the accumulation signal Acc(i) and the reset signal Rst(i+1).

Figures 6, 7:
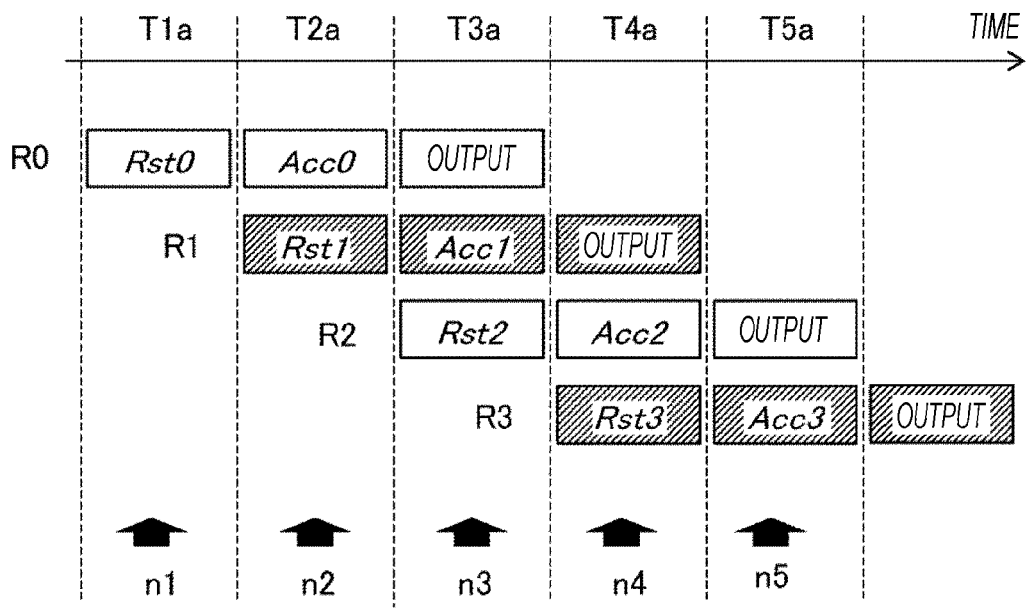
FIG. 6 is a diagram for describing the outline of a first reduction method of an in-phase noise component.
FIG. 7 is a diagram for describing the effect of the first reduction method of the in-phase noise component.

FIG. 7 illustrates the pixel light detection signal of the pixel 41 of each of the pixel rows. As described above, the pixel light detection signal of each of the pixels 41, is obtained on the basis of a difference between the accumulation signal and the reset signal. In addition, as described above, the in-phase noise component is superimposed on the accumulation signal and the reset signal. Accordingly, the pixel light detection signal of the pixel 41a of the R0 row is (Acc0+n2)−(Rst0+n1). The pixel light detection signal of the pixel 41b of the R1 row is (Acc1+n3)−(Rst1+n2). Similarly, the pixel light detection signal of the pixel 41 of the R(i) row is {Acc(i)+n(i+2)}−{Rst(i)+n(i+1)}.

That is, in the light detector 23a, the reset signal and the accumulation signal are continuously read in each of the pixels 41, and the pixel light detection signal based on a difference between the accumulation signal and the reset signal, is generated. That is, so-called rolling shutter type correlated double sampling (CDS) is performed.

Here, for example, in the data processing unit 12, in a case where the pixel light detection signals of the R0 row to the R3 row are summed up in order to detect the amount of light incident on the light receiving unit 11, the in-phase noise component n2 to an in-phase noise component n4 are canceled.

In such a method, the noise is canceled by using the output signal of each of the pixels 41 (the accumulation signal and the reset signal), and thus, it is possible to collectively cancel the in-phase noise components having a plurality of factors, which are superimposed on the output signal.

In addition, it is possible to reduce the overhead of a light receiving area due to an optical black (OPB) pixel, compared to a noise cancellation method using the OPB pixel. Further, it is possible to reduce the in-phase noise component with a higher accuracy, by using the adjacent pixels 41 existing in the adjacent pixel rows.

Further, the overhead of a reading time of the pixel signal rarely occurs.

Next, a specific reading operation of the pixel signal will be described with reference to a timing chart of FIG. 8.

Furthermore, hereinafter, in the reference numerals of each of the units in the pixel 41 of FIG. 4, the description will be given by adding a letter of "a" to the end of the reference numerals of each of the units in the pixel 41a, and by adding a letter of "b" to the end of the reference numerals of each of the units in the pixel 41b.

Figure 8:
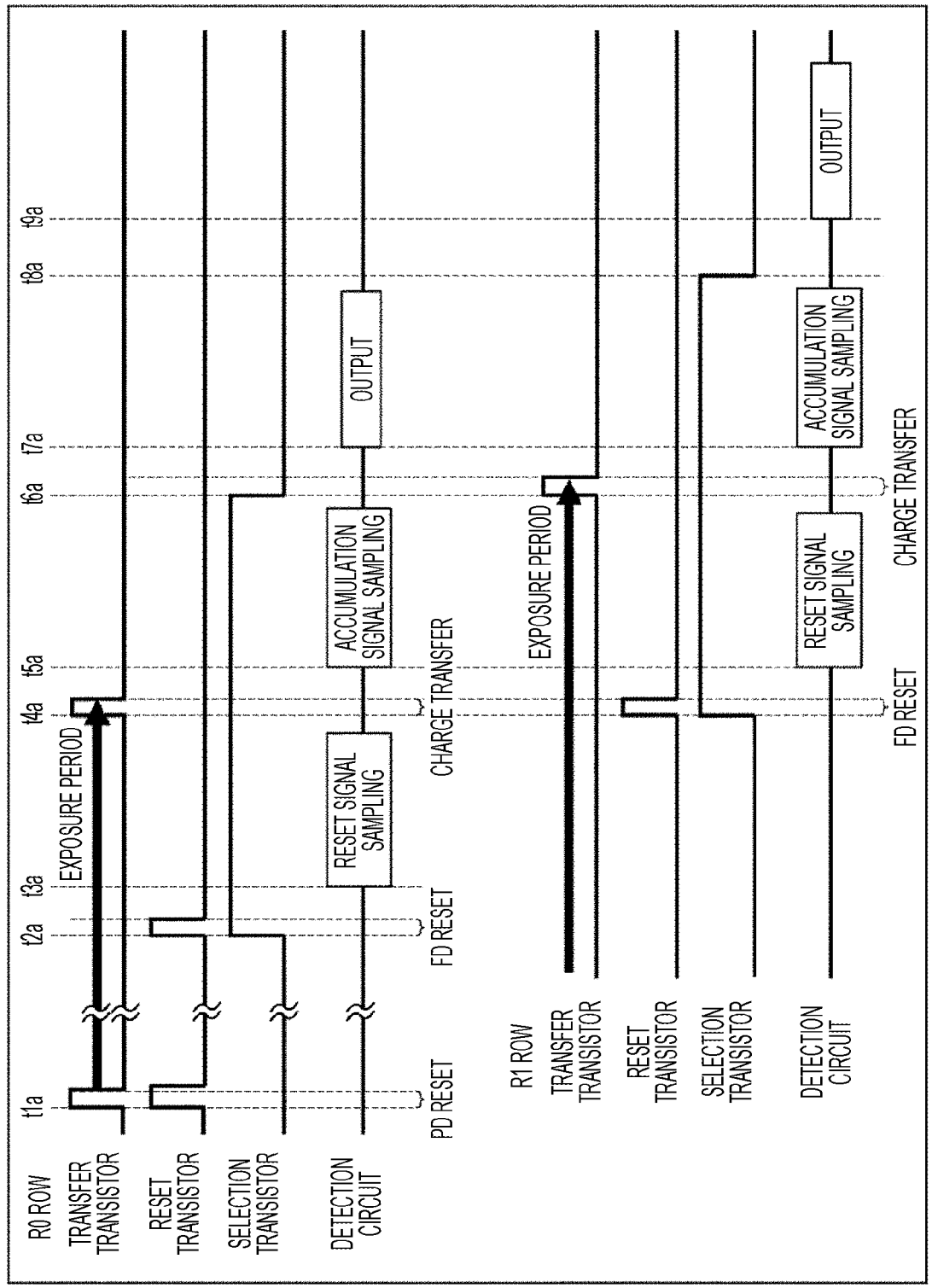
FIG. 8 is a timing chart for describing a reading operation of the pixel of the first embodiment of the light detector.

The timing chart of FIG. 8, illustrates the sequence of the reading operation of the pixel 41a of the R0 row and the pixel 41b of the R1 row. More specifically, the timing chart of FIG. 8 illustrates an operation sequence of a transfer transistor 113a, a reset transistor 115a, and a selection transistor 117a of the pixel 41a of the R0 row, and a detection circuit 71a, and a transfer transistor 113b, a reset transistor 115b, and a selection transistor 117b of the pixel 41b of the R1 row, and a detection circuit 71b.

First, the reading operation of the pixel 41a of the R0 row will be described.

At a time t1a, the row driving circuit 52 turns on both of the transfer transistor 113a and the reset transistor 115a. With this arrangement, all of the charges accumulated in the accumulation node 112a between the photodiode 111a and the transfer transistor 113a, are discharged to the power source VDD. That is, the PD reset is performed.

After that, the row driving circuit 52 turns off the transfer transistor 113a. With this arrangement, the accumulation node 112a is in a floating state, and new charges are started to be accumulated. That is, an exposure period of the pixel 41a is started.

In addition, the row driving circuit 52 turns off the reset transistor 115a after the PD reset. Furthermore, during the exposure period, the reset transistor 115a may be in a state of being turned on.

Next, at a time t2a before the exposure period is ended, the FD reset of the pixel 41a is performed.

Specifically, the row driving circuit 52 turns on the reset transistor 115a and the selection transistor 117a. The selection transistor 117a is turned on, and thus, the selected pixel 41a is connected to the vertical signal line 59a. In addition, the reset transistor 115a is turned on, and thus, the detection node 114a and the power source VDD, which are the input of the amplification transistor 116a, are short-circuited. With this arrangement, a reference potential is generated in the selected pixel 41a.

After a predetermined high pulse period has elapsed from the time t2a, the row driving circuit 52 turns off the reset transistor 115a. With this arrangement, the potential of the detection node 114a comparatively decreases from a reference potential, due to coupling with respect to the gate of the reset transistor 115a, and the detection node 114a is in a floating state. In addition, in the detection node 114a, a significant kTC noise is generated.

Thus, the potential of the detection node 114a is reset.

At a time t3a, the detection circuit 71a samples the reset signal of the pixel 41a. That is, an AD converter 131a of the detection circuit 71a converts an analog signal based on the potential of the vertical signal line 59a, into a digital signal, and generates the reset signal Rst0. The sampling of the reset signal Rst0 is the first reading of the correlated double sampling of the pixel 41a.

Next, at a time t4a immediately before the exposure period is ended, the row driving circuit 52 turns on the transfer transistor 113a. With this arrangement, the charges accumulated in the accumulation node 112a are transferred to the detection node 114a. At this time, in a case where the potential of the detection node 114a is sufficiently deep, all of the charges (electrons) accumulated in the accumulation node 112a, are transferred to the detection node 114a, and the accumulation node 112a is in a completely depleted state.

After a predetermined high pulse period has elapsed from the time t4a, the row driving circuit 52 turns off the transfer transistor 113a.

At this time, the potential of the detection node 114a decreases by the accumulated charge amount, compared to a potential before the transfer transistor 113a is driven (that is, the potential becomes shallow). The decreased voltage is amplified by the amplification transistor 116a, and is output to the vertical signal line 59a.

At a time t5a, the detection circuit 71a samples the accumulation signal. That is, the AD converter 131a of the detection circuit 71a converts an analog signal based on the potential of the vertical signal line 59a, into a digital signal, and generates the accumulation signal Acc0. The sampling of the accumulation signal Acc0 is the second reading of the correlated double sampling of the pixel 41a.

The detection circuit 71a compares the sampled accumulation signal Acc0 with the sampled reset signal Rst0, and calculates a pixel value corresponding to an incident photon amount, on the basis of a comparison result. That is, the detection circuit 71a generates the pixel light detection signal in which a difference between the accumulation signal Acc0 and the reset signal Rst0, is the pixel value. At this time, the kTC noise generated at the time of the FD reset, is offset by taking the difference between the accumulation signal Acc0 and the reset signal Rst0.

At a time t6a, the row driving circuit 52 turns off the selection transistor 117a. With this arrangement, the pixel 41a is separated from the vertical signal line 59a.

At a time t7a, the detection circuit 71a transfers the pixel light detection signal to an inner output register. Then, the column driving circuit 55 sequentially turns on the switches 56a in each of the pixel columns. With this arrangement, the pixel light detection signal of each of the pixels 41a of the R0 row, is output to the output control circuit 57 from the detection circuit 71a.

Here, the exposure period of each of the pixels 41a of the R0 row, is a period between the PD reset and the reading operation. More specifically, the exposure period of each of the pixels 41a of the R0 row, is a period from the transfer transistor 113a is turned on, and then, is turned off, at the time t1a, until the transfer transistor 113a is turned on, and then, is turned off, at the time t4a. In the exposure period, in a case where a photon is incident on the photodiode 111a, and thus, a charge is generated, a signal based on the generated charge, is generated by the detection circuit 71a according to the procedure described above, as the pixel light detection signal represented by a difference between the accumulation signal and the reset signal.

Furthermore, a period from the exposure period is ended, until the next exposure is started by performing again the PD reset, is a dead period in which the charge is not accumulated. Here, for example, at the time t4a, the charge of the accumulation node 112 is discharged by transferring the charge of the accumulation node 112 to the detection node 114, and thus, the PD reset can be omitted. With this arrangement, charge accumulation of the next frame is started in the accumulation node 112, immediately after charge transfer at which the exposure period is ended. As a result thereof, the dead period is almost eliminated, and one frame period is approximately the exposure period, and thus, the sensitivity is improved. In this case, an exposure time is approximately determined by a frame rate.

Next, the sequence of the reading operation of the pixel 41b of the R1 row will be described.

In the pixel 41b, the reading operation is executed in a sequence similar to that of the pixel 41a, while shifting a timing with respect to the pixel 41a.

Furthermore, in FIG. 8, the description of the start of the exposure period of the pixel 41b, that is, the timing of the PD reset, is omitted. Here, for example, a temporal difference in the PD reset between the pixel 41a and the pixel 41b, may be set to a time same as a temporal difference in the reading timing between the pixel 41a and the pixel 41b, and thus, the exposure time of the pixel 41a may be identical to the exposure time of the pixel 41b. Then, a temporal difference in the PD reset between the pixels 41 in the adjacent pixel rows, is similarly set, and thus, the exposure times of each of the pixels 41 are identical to each other.

Alternatively, in a case where the reading time of the entire pixel array portion 31a is sufficiently longer than the exposure time, for example, all of the pixels 41 of the pixel array portion 31a may be simultaneously started to be exposed.

Alternatively, in all of the pixels 41 of the pixel array portion 31a, as described above, the PD reset may be omitted, and the dead period may be almost eliminated.

At the time t4a, the row driving circuit 52 turns on the reset transistor 115b and the selection transistor 117b. The selection transistor 117b is turned on, and thus, the selected pixel 41b is connected to the vertical signal line 59b. In addition, the reset transistor 115b is turned on, and thus, the detection node 114b and the power source VDD, which are the input of the amplification transistor 116b, are short-circuited. With this arrangement, a reference potential is generated in the selected pixel 41b.

After a predetermined high pulse period has elapsed from the time t4a, the row driving circuit 52 turns off the reset transistor 115b.

Thus, the potential of the detection node 114b is reset. That is, the FD reset is performed.

At the time t5a, the detection circuit 71b samples the reset signal of the pixel 41b. That is, an AD converter 131b of the detection circuit 71b converts an analog signal based on the potential of the vertical signal line 59b, into a digital signal, and generates the reset signal Rst1. The sampling of the reset signal Rst1 is the first reading of the correlated double sampling of the pixel 41b.

That is, the sampling of the reset signal Rst1 of the pixel 41b, is performed at the same timing as that of the sampling of the accumulation signal Acc0 of the pixel 41a. At this time, for example, in a case where a noise is generated in the power source of the pixel 41 or the detection circuit 71, or the reference voltage to be supplied to the detection circuit 71, the in-phase noise component is superimposed on the accumulation signal Acc0 of the pixel 41a, and the reset signal Rst1 of the pixel 41b.

Next, at the time t6a immediately before the exposure period is ended, the row driving circuit 52 turns on the transfer transistor 113b. With this arrangement, the charges accumulated in the accumulation node 112b, are transferred to the detection node 114b. At this time, in a case where the potential of the detection node 114b is sufficiently deep, all of the charges (electrons) accumulated in the accumulation node 112b, are transferred to the detection node 114b, and the accumulation node 112b is in a completely depleted state.

After a predetermined high pulse period has elapsed from the time t6a, the row driving circuit 52 turns off the transfer transistor 113b.

At this time, the potential of the detection node 114b decreases by the accumulated charge amount, compared to a potential before the transfer transistor 113b is driven (that is, the potential becomes shallow). The decreased voltage is amplified by the amplification transistor 116b, and is output to the vertical signal line 59b.

At the time t7a, the detection circuit 71b samples the accumulation signal. That is, the AD converter 131b of the detection circuit 71b converts an analog signal based on the potential of the vertical signal line 59b, into a digital signal, and generates the accumulation signal Acc1. The sampling of the accumulation signal Acc1 is the second reading of the correlated double sampling of the pixel 41b.

The detection circuit 71b compares the sampled accumulation signal Acc1 with the sampled reset signal Rst1, and calculates a pixel value corresponding to an incident photon amount, on the basis of a comparison result. That is, the detection circuit 71b generates the pixel light detection signal in which a difference between the accumulation signal Acc1 and the reset signal Rst1, is the pixel value. At this time, the kTC noise generated at the time of the FD reset, is offset by taking the difference between the accumulation signal Acc1 and the reset signal Rst1.

At a time t8a, the row driving circuit 52 turns off the selection transistor 11b. With this arrangement, the pixel 41b is separated from the vertical signal line 59b.

At a time t9a, the detection circuit 71b transfers the pixel light detection signal to an inner output register. Then, the column driving circuit 55 sequentially turns on the switches 56b in each of the pixel columns. With this arrangement, the pixel light detection signal of each of the pixels 41b of the R0 row, is output to the output control circuit 57 from the detection circuit 71b.

Subsequent to the R2 row, a temporal difference in the sampling of the reset signal and the accumulation signal of the pixels 41 in the adjacent pixel rows, is set be similar to the temporal difference between the R0 row and the R1 row described above. That is, each of the pixels 41 and each of the detection circuits 71 are driven such that a timing for sampling the accumulation signal of the R(i) row, and a timing for sampling the reset signal of the R(i+1) row, back and forth in a sampling order, are matched to each other.

Then, the output control circuit 57 or the data processing unit 12, sums up the pixel light detection signals of the pixels 41 of one frame, and generates a frame light detection signal. For example, a memory is provided in the output control circuit 57, and the output control circuit 57 adds the pixel light detection signal while sequentially storing additional values of the pixel light detection signals to be output from each of the detection circuits 71, in the memory. Alternatively, the data processing unit 12 of FIG. 1 adds the pixel light detection signal of each of the pixels 41 to be supplied from the output control circuit 57.

Thus, the pixel light detection signals of one frame are summed up, and thus, as described above with reference to FIG. 6 and FIG. 7, it is possible to reduce the in-phase noise component included in the pixel light detection signal of each of the pixels 41. Then, it is possible to detect a light amount of minute light incident on the light detector 23c during the exposure period, with a high accuracy, on the basis of the frame light detection signal, without being affected by the in-phase noise component.

Furthermore, for example, a register retaining the additional value, may be provided in each of the detection circuits 71, and each of the detection circuits 71 may add the pixel light detection signals of the plurality of pixels 41 connected to the same vertical signal line 59. With this arrangement, it is possible to reduce a frequency of transferring the pixel light detection signal to the output control circuit 57 from each of the detection circuits 71 through the switch 56, and to reduce the power consumption.

Furthermore, the method described above is particularly effective in a case where the number of pixels 41 reading the reset signal is approximately identical to the number of pixels 41 reading the accumulation signal, at the same timing. Accordingly, for example, the reading of the reset signal and the reading of the accumulation signal, performed at the same timing, can be respectively set in n rows of two or more rows. That is, the reading of the reset signals of n rows, and the reading of the accumulation signals of the other n rows, may be executed at the same timing. In this case, for example, in each of the pixel columns, n vertical signal lines 59a and n vertical signal lines 59b, and n detection circuits 71a and n detection circuits 71b are provided.

<1-8. Second Embodiment of Light Detector>

Furthermore, the reading method of the pixel signal described above, can be used in combination with reduction processing of a dark current using an OPB pixel.

Figure 9:
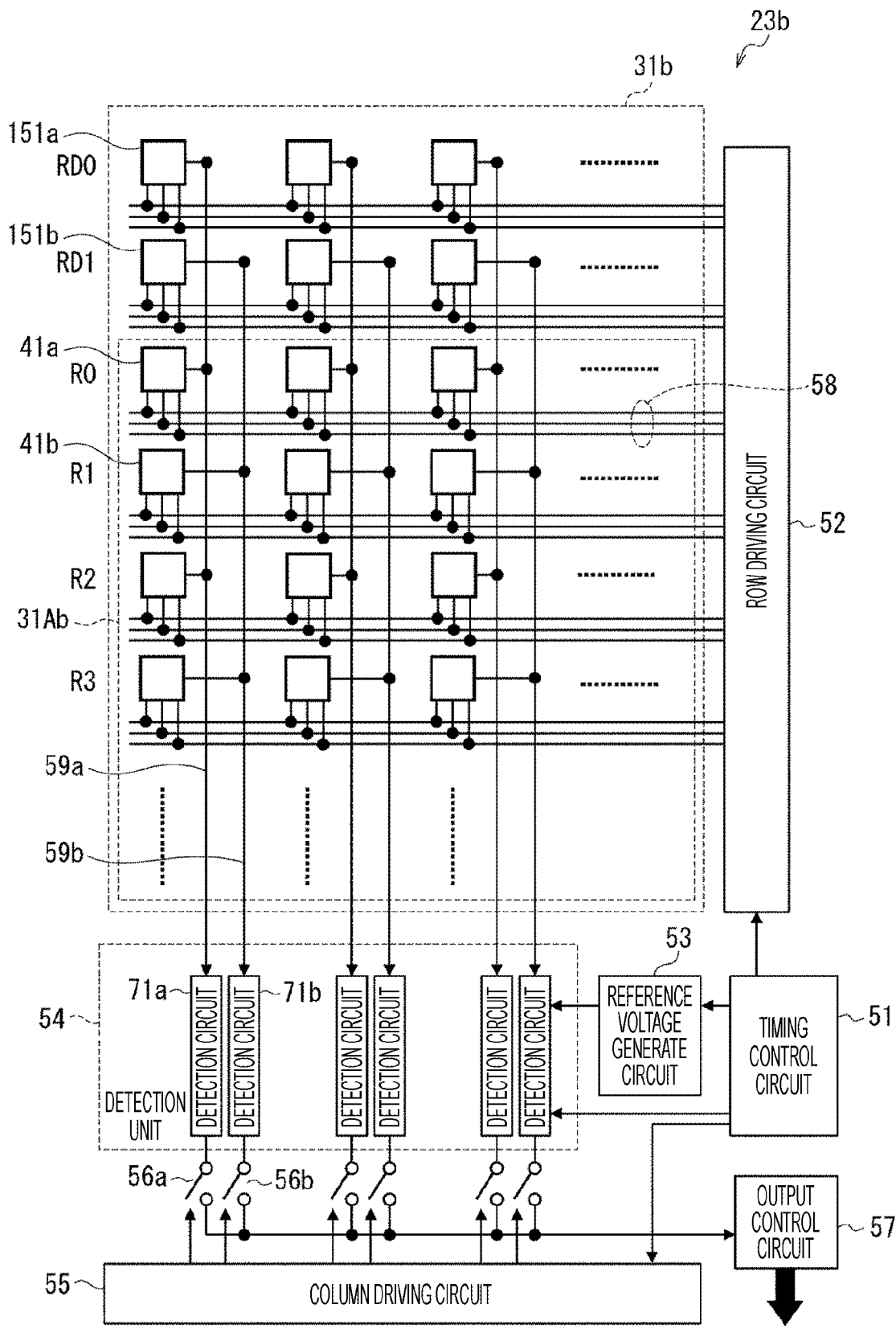
FIG. 9 is a block diagram illustrating a second embodiment of the light detector.

FIG. 9 illustrates an example of a circuit configuration of the light detector 23b, which is a second embodiment of the light detector 23 of FIG. 1. Furthermore, in the drawings, the same reference numerals are applied to parts corresponding to those of the light detector 23a of FIG. 2.

The light detector 23b is different from the light detector 23a, in that a pixel array portion 31b is provided instead of the pixel array portion 31a.

The pixel array portion 31b is different from the pixel array portion 31a, in that a dummy pixel 151a and a dummy pixel 151b are added. That is, as with the pixel array portion 31a, in the pixel array portion 31b, an RD0 row in which the dummy pixels 151a are arranged, and an RD1 row in which the dummy pixels 151b are arranged, are added onto a region 31Ab in which the pixels 41 are arranged.

Figure 4:
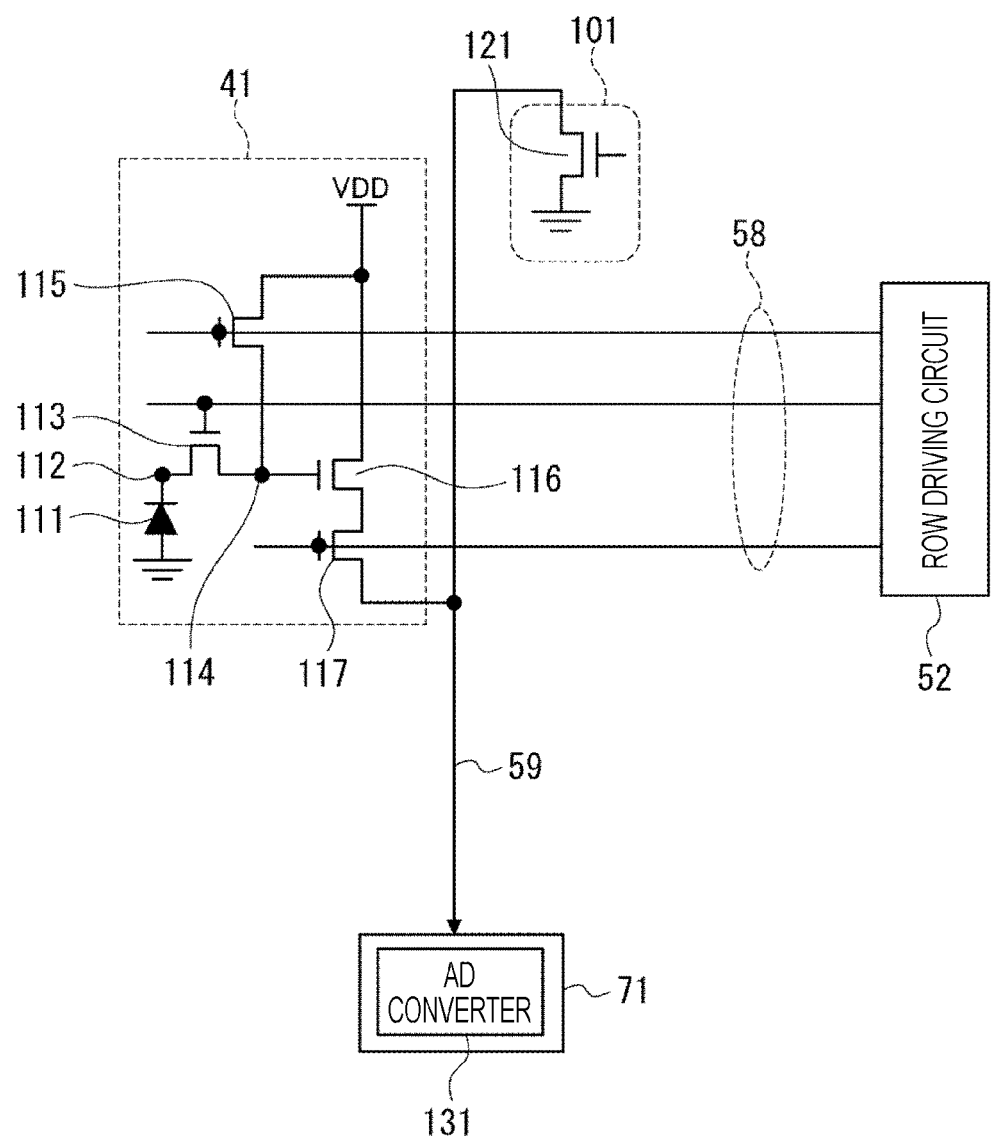
FIG. 4 is a circuit diagram illustrating a configuration example of a pixel.

A circuit configuration of the dummy pixel 151a and the dummy pixel 151b, is similar to the circuit configuration of the pixel 41 of FIG. 4. Here, the entire surface of the RD0 row and the RD1 row in which the dummy pixel 15a and the dummy pixel 151b are provided, is light-shielded, and thus, light is not incident on the dummy pixel 151a and the dummy pixel 151b.

For example, at the time of power activation or immediately before measurement, in the dummy pixel 151a of the RD0 row and the dummy pixel 151b of the RD1 row, the pixel signal is repeatedly read for the exposure time similar to that of the pixel 41 in the pixel array portion 31a, and the calibration of the dark current is performed on the basis of the result. A dark current signal obtained as described above, is subtracted from an actual measurement value of the pixel 41 (the pixel light detection signal), and thus, a dark current component is reduced.

2. Second Embodiment

Next, a second embodiment of the present technology will be described with reference to FIG. 10 to FIG. 13.

2-1. Third Embodiment of Light Detector

Figure 10:
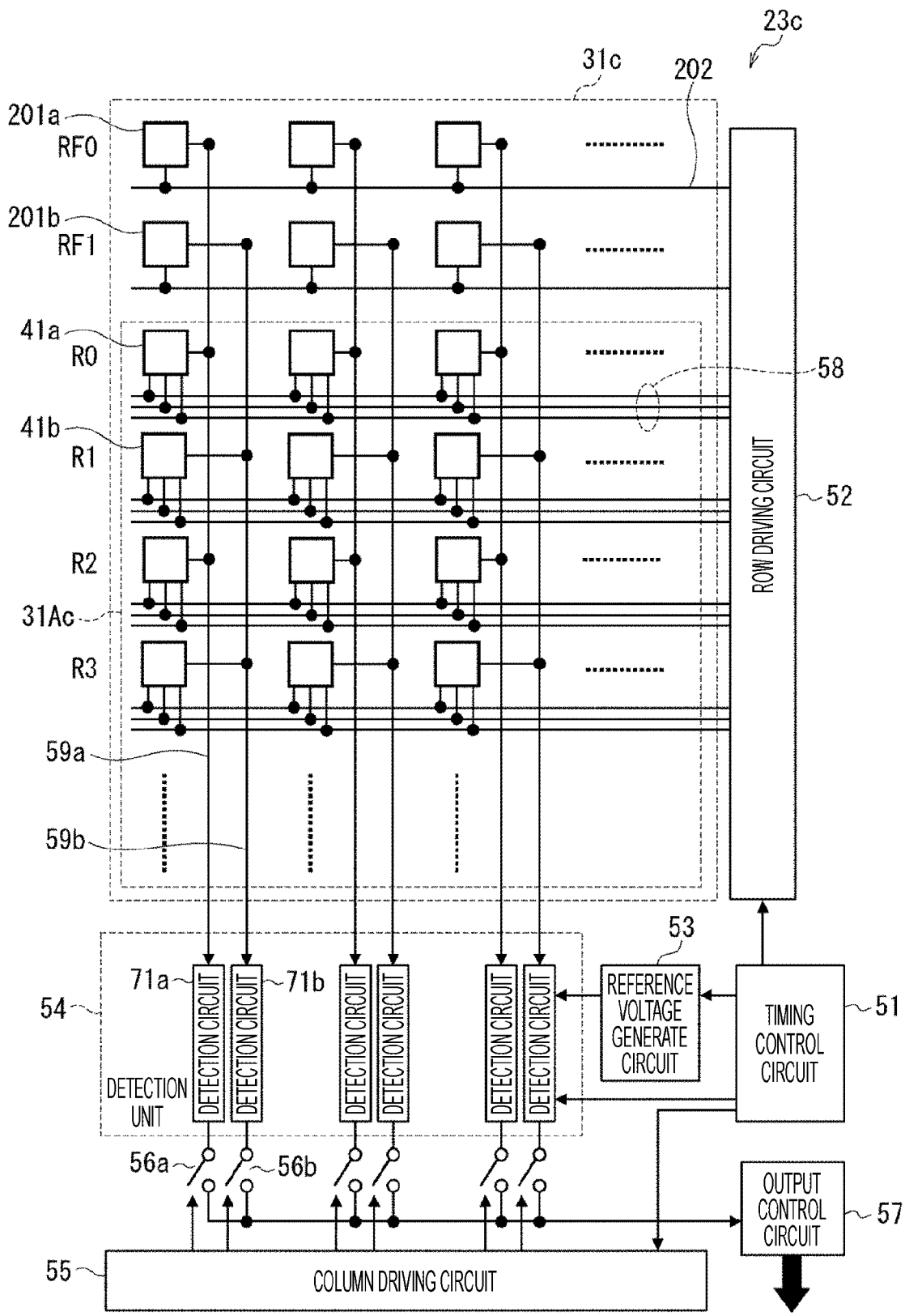
FIG. 10 is a block diagram illustrating a third embodiment of the light detector.

The second embodiment of the present technology is different from the first embodiment, in that a light detector 23c of FIG. 10 is provided as the light detector 23 of the radiation counter device 1 of FIG. 1, instead of the light detector 23a of FIG. 2. Furthermore, in FIG. 10, the same reference numerals are applied to parts corresponding to those of the light detector 23a of FIG. 2.

The light detector 23c is different from the light detector 23a, in that a pixel array portion 31c is provided instead of the pixel array portion 31a.

The pixel array portion 31c is different from the pixel array portion 31a, in that a replica pixel 201a and a replica pixel 201b are added. That is, as with the pixel array portion 31a, in the pixel array portion 31c, an RF0 row in which the replica pixels 201a are arranged, and an RF1 row in which the replica pixels 201b are arranged, are added onto region 31Ac in which the pixels 41 are arranged.

Each of the replica pixels 201a is connected to the detection circuit 71a through the vertical signal line 59a of each of the pixel columns in which the replica pixels 201a are arranged. In addition, each of the replica pixels 201a is connected to the row driving circuit 52 through a control line 202.

Each of the replica pixels 201b is connected to the detection circuit 71b through the vertical signal line 59b of each of the pixel columns in which the replica pixels 201b are arranged. In addition, each of the replica pixels 201b is connected to the row driving circuit 52 through a control line 202.

Furthermore, hereinafter, in a case where it is not necessary to distinguish the replica pixel 201a from the replica pixel 201b, the replica pixel 201a and the replica pixel 201b will be simply referred to as a replica pixel 201. In addition, hereinafter, in the replica pixel 201, there is a case where the pixel 41 is referred to as an effective pixel.

<2-2. Circuit Configuration of Replica Pixel>

Next, a circuit configuration of the replica pixel 201 will be described with reference to FIG. 11. Furthermore, in the drawings, the same reference numerals will be applied to parts corresponding to those of FIG. 4.

The replica pixel 201 is a pixel including a part of the circuit of the pixel 41, and reproduces the in-phase noise component in the pixel 41.

The replica pixel 201 includes an amplification transistor 231 and a selection transistor 232. The amplification transistor 231 is a transistor having the same size as that of the amplification transistor 116 of the pixel 41, and the selection transistor 232 is a transistor having the same size as that of the selection transistor 117 of the pixel 41.

A gate of the amplification transistor 231 is connected to a variable source 241 provided outside the replica pixel 201, a drain is connected to the power source VDD, and a source is connected to a drain of the selection transistor 232. Furthermore, the variable source 241 is shared in a plurality of replica pixels 201. A gate of the selection transistor 232 is connected to the row driving circuit 52, and a source is connected to the vertical signal line 59.

Then, the amplification transistor 231 configures the constant current circuit 101 and the source follower connected through the vertical signal line 59. In addition, the voltage of the variable source 241 to be applied to the gate of the amplification transistor 231, is adjusted to a voltage close to a voltage at the time of resetting the detection node 114 in the pixel 41, and is fixed.

<2-3. Reading Method of Pixel Signal>

Next, a reduction method of the in-phase noise component in the light detector 23c, will be described with reference to FIG. 12 and FIG. 13.

In the light detector 23c, a global shutter operation is performed in which all of the pixels 41 are simultaneously exposed, and the charges are accumulated.

Specifically, at a time t1c, the PD reset is performed in all of the pixels 41. With this arrangement, the charges accumulated in the accumulation node 112 of each of the pixels 41, are discharged, and new charges are started to be accumulated. In addition, the FD reset is performed in all of the pixels 41. With this arrangement, the detection node 114 of each of the pixels 41 is reset, and the reset signal is output from each of the pixels 41.

Next, in a period TR1c, the reset signal Rst0 of each of the pixels 41a of the R0 row, and a signal Fix1a of each of the replica pixels 201b of the RF1 row (hereinafter, referred to as a replica signal) are sampled, and are subjected to the AD conversion. At this time, the in-phase noise component n1 is superimposed on the reset signal Rst0 of each of the pixels 41a, and the replica signal Fix1a of each of the replica pixels 201b.

Next, in a period TR2c, the reset signal Rst0 of each of the pixels 41a of the R0 row, is output to the output control circuit 57 from the detection circuit 71a through the switch 56a. The replica signal Fix1a of each of the replica pixels 201b of the RF1 row, is output to the output control circuit 57 from the detection circuit 71b through the switch 56b.

In addition, the reset signal Rst1 of each of the pixels 41b of the R1 row, and a signal Fix0a of each of the replica pixels 201a of the RF0 row (hereinafter, referred to as a replica signal) are sampled, and are subjected to the AD conversion. At this time, the in-phase noise component n2 is superimposed on the reset signal Rst1 of each of the pixels 41b, and the replica signal Fix0a of the each of the replica pixels 201a.

Next, in a period TR3c, the reset signal Rst1 of each of the pixels 41b of the R1 row, is output to the output control circuit 57 from the detection circuit 71b through the switch 56b. The replica signal Fix0a of each of the replica pixels 201a of the RF0 row, is output to the output control circuit 57 from the detection circuit 71a through the switch 56a.

In addition, the reset signal Rst2 of each of the pixels 41a of the R2 row, and the replica signal Fix1a of each of the replica pixels 201b of the RF1 row are sampled, and are subjected to the AD conversion. At this time, the in-phase noise component n3 is superimposed on the reset signal Rst2 of each of the pixels 41a, and the replica signal Fix1a of the each of the replica pixels 201b.

Next, in a period TR4c, the reset signal Rst2 of each of the pixels 41a of the R2 row, is output to the output control circuit 57 from the detection circuit 71a through the switch 56a. The replica signal Fix1a of each of the replica pixels 201b of the RF1 row, is output to the output control circuit 57 from the detection circuit 71b through the switch 56b.

In addition, the reset signal Rst3 of each of the pixels 41b of the R3 row, and the replica signal Fix0a of each of the replica pixels 201a of the RF0 row are sampled, and are subjected to the AD conversion. At this time, the in-phase noise component n4 is superimposed on the reset signal Rst3 of the each of the pixels 41b, and the replica signal Fix0a of each of the replica pixels 201a.

In the subsequent periods of a period TR5c, a period TR6c, . . . , similar processing is repeated, and sequentially, the reset signal Rst(i) of the R(i) row, and the replica signal Fix0a or the replica signal Fix1a, are simultaneously sampled, and are subjected to the AD conversion. At this time, the in-phase noise component is superimposed on the reset signal Rst(i), and the replica signal Fix0a or the replica signal Fix1a.

Next, at a time t2c, the accumulated charges are transferred to the detection nodes 114 from the accumulation nodes 112 of all of the pixels 41, all at once. With this arrangement, the accumulation signal is output from each of the pixels 41.

Here, a period from the time t1c when each of the pixels 41 is started to accumulate the charges all at once, to the time t2c when each of the pixels 41 transfers the accumulated charges all at once, is the exposure period of each of the pixels 41.

Next, in a period TA1c, the accumulation signal Acc0 of each of the pixels 41a of the R0 row, and a replica signal Fix1b of each of the replica pixels 201b of the RF1 row are sampled, and are subjected to the AD conversion. At this time, an in-phase noise component n5 is superimposed on the accumulation signal Acc0 of each of the pixels 41a, and the replica signal Fix1b of each of the replica pixels 201b.

Next, in a period TA2c, the accumulation signal Acc0 of each of the pixels 41a of the R0 row, is output to the output control circuit 57 from the detection circuit 71a through the switch 56a. The replica signal Fix1b of each of the replica pixels 201b of the RF1 row, is output to the output control circuit 57 from the detection circuit 71b through the switch 56b.

In addition, the accumulation signal Acc1 of each of the pixels 41b of the R1 row, and a replica signal Fix0b of each of the replica pixels 201a of the RF0 row are sampled, and are subjected to the AD conversion. At this time, an in-phase noise component n6 is super imposed on the accumulation signal Acc1 of each of the pixels 41b, and the replica signal Fix0b of each of the replica pixels 201a.

In a period TA3c, the accumulation signal Acc1 of each of the pixels 41b of the R1 row, is output to the output control circuit 57 from the detection circuit 71b through the switch 56b. The replica signal Fix0b of each of the replica pixels 201a of the RF0 row, is output to the output control circuit 57 from the detection circuit 71a through the switch 56a.

In addition, an accumulation signal Acc2 of each of the pixels 41a of the R2 row, and the replica signal Fix1b of each of the replica pixels 201b of the RF1 row are sampled, and are subjected to the AD conversion. At this time, an in-phase noise component n7 is superimposed on the accumulation signal Acc2 of each of the pixels 41a, and the replica signal Fix1b of each of the replica pixels 201b.

In the subsequent periods of a period TA4c, a period TA5c, . . . , similar processing is repeated, and sequentially, the accumulation signal Acc(i) of the R(i) row, and the replica signal Fix0b or the replica signal Fix1b are simultaneously sampled, and are subjected to the AD conversion. At this time, the in-phase noise component is superimposed on the accumulation signal Acc(i), and the replica signal Fix0b or the replica signal Fix1b.

Figures 12, 13:
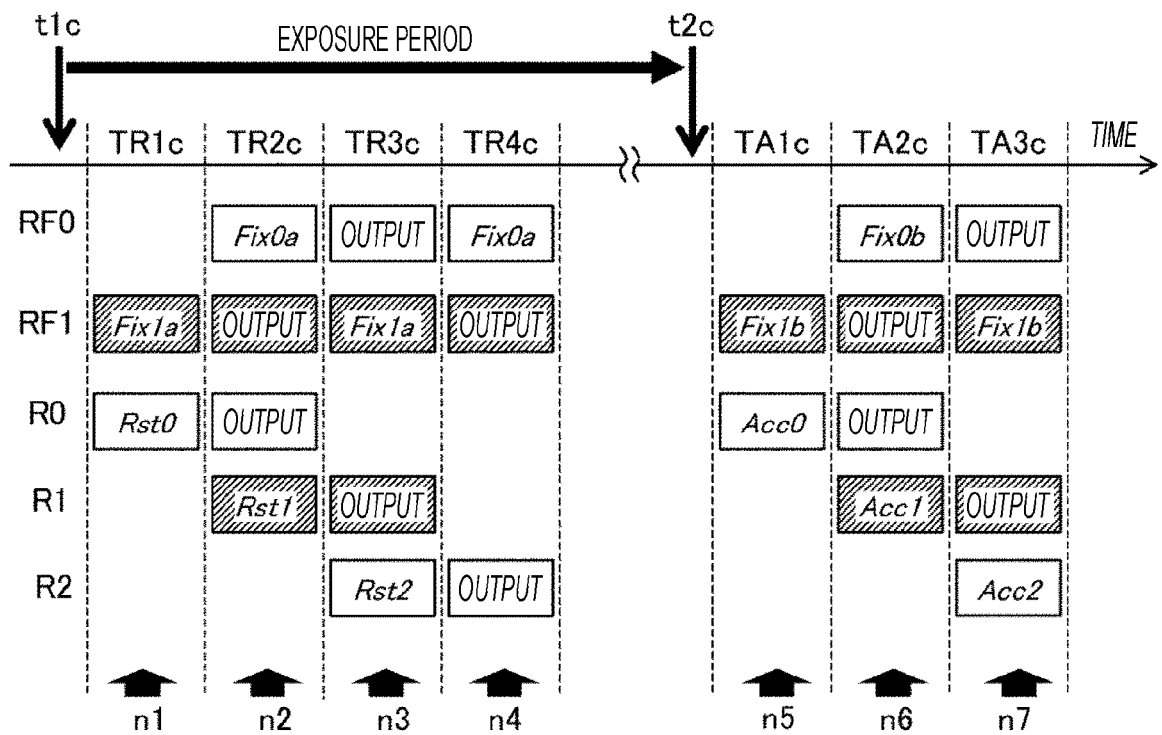
FIG. 12 is a diagram for describing the outline of a second reduction method of the in-phase noise component.
FIG. 13 is a diagram for describing the effect of the second reduction method of the in-phase noise component.

FIG. 13 illustrates an example of the pixel light detection signal of the pixel 41, and a differential signal of the replica pixel 201 (hereinafter, referred to as a pixel noise detection signal), which are read at the same timing. As described above, the pixel light detection signal of each of the pixels 41, is obtained by a difference between the accumulation signal and the reset signal. Here, as described above, the in-phase noise component is superimposed on the accumulation signal and the reset signal. Accordingly, for example, the pixel light detection signal of the pixel 41a of the R0 row, is (Acc0+n5)−(Rst0+n1)=(Acc0−Rst0)+(n5−n1).

On the other hand, an output level of the replica signal of each of the replica pixels 201a, and the replica signal of each of the replica pixels 201b, is fixed. For this reason, a signal component is offset by taking a difference between the replica signal Fix1b of the replica pixel 201b of the RF1 row, which is read at the same timing as that of the accumulation signal Acc0 of the pixel 41a of the R0 row, and the replica signal Fix1a of the replica pixel 201b of the RF1 row, which is read at the same timing as that of the reset signal Rst0 of the pixel 41a of the R0 row, and thus, only the in-phase noise component appears. That is, the pixel noise detection signal, which is a differential signal of the replica pixel 201b, read at the same timing as that of the pixel 41a of the R0 row, is n5−n1.

Accordingly, the in-phase noise component is eliminated from the pixel light detection signal by taking a difference between the pixel light detection signal of the pixel 41a of the R0 row and the noise detection signal of the pixel of the replica pixel 201b, and only the signal component (Acc0−Rst0) is extracted.

The same applies to the pixel light detection signal of the pixel 41 of the row subsequent to the R1 row.

Accordingly, for example, the noise component is eliminated from the frame light detection signal by taking a difference between a frame light detection signal in which the pixel light detection signals of each of the pixels 41 of one frame are summed up, a frame noise detection signal in which the pixel noise detection signals of the replica pixel 201 of one frame are summed up, and thus, only the signal component is extracted.

Furthermore, at the time t1c, only the FD reset is performed, and at the time t2c, the charges of the accumulation node 112 are discharged by transferring the charges of the accumulation node 112 of the pixel 41 to the detection node 114, and thus, the PD reset can be omitted. With this arrangement, charge accumulation of the next frame is started immediately after the time t2c, and thus, it is possible to perform light detection almost without a dead period.

In addition, the vertical signal line 59 may be short-circuited at the time of reading the replica signal of the replica pixel 201. For example, the vertical signal line 59a of each of the pixel columns may be short-circuited at the time of reading the replica signal of each of the replica pixels 201a of the RF0 row. Similarly, the vertical signal line 59b of each of the pixel columns may be short-circuited at the time of reading the replica signal of each of the replica pixels 201b of the RF1 row. With this arrangement, the influence of the random noise independently generated in each of the replica pixels 201, is reduced.

3. Third Embodiment

Next, a third embodiment of the present technology will be described with reference to FIG. 14 to FIG. 18.

<3-1. Fourth Embodiment of Light Detector>

Figure 14:
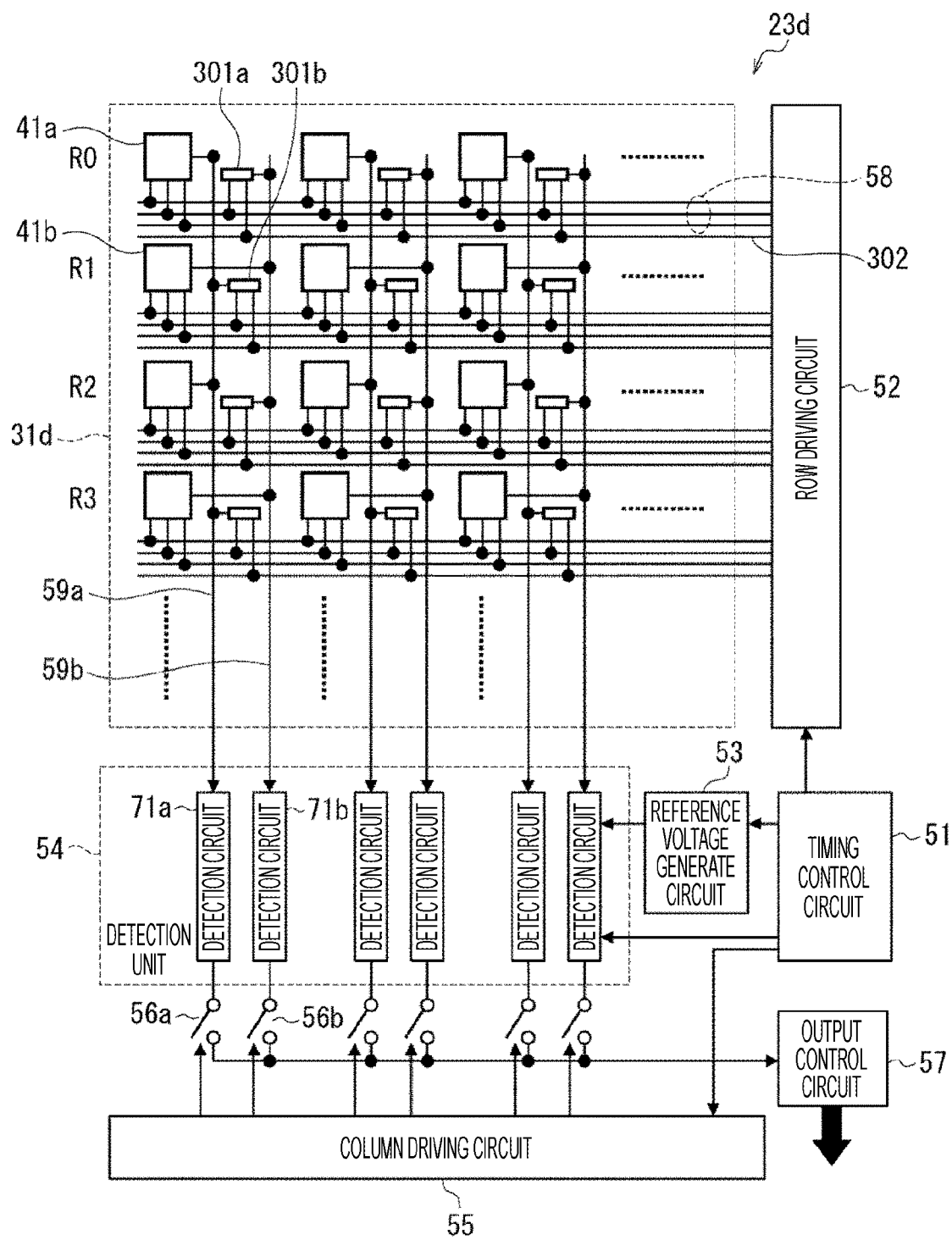
FIG. 14 is a block diagram illustrating a fourth embodiment of the light detector.

The third embodiment of the present technology is different from the first embodiment, in that a light detector 23d of FIG. 14 is provided as the light detector 23 of the radiation counter device 1 of FIG. 1, instead of the light detector 23a of FIG. 2. Furthermore, in FIG. 14, the same reference numerals are applied to parts corresponding to those of the light detector 23a of FIG. 2.

The light detector 23d is different from the light detector 23a, in that a pixel array portion 31d is provided instead of the pixel array portion 31a.

The pixel array portion 31d is different from the pixel array portion 31a, in that replica pixels 301a and replica pixels 301b are arranged in a region where each of the pixels 41 is arrange. More specifically, the pixel array portion 31d is different from the pixel array portion 31a, in that the replica pixels 301a and the replica pixels 301b are arranged between the pixel columns of each of the pixels 41.

The replica pixels 301a are arranged to be adjacent to the right side of each of the pixels 41a. The replica pixels 301b are arranged to be adjacent to the right side of each of the pixels 41b. Accordingly, in the pixel column, the replica pixel 301a and the replica pixel 301b are alternately arranged. In addition, in the pixel rows where the pixel signals are sampled at the same timing, pixel 41a and the replica pixel 301a, or the pixel 41b and the replica pixel 301b are alternately arranged.

Each of the replica pixels 301a is connected to the detection circuit 71b through the vertical signal line 59b in a row of the pixel 41 adjacent to the left side of the drawing. In addition, each of the replica pixels 301a is connected to the row driving circuit 52 through a part of the control line 58 and the control line 302.

Each of the replica pixels 301b is connected to the detection circuit 71a through the vertical signal line 59a in a row of the pixel 41 adjacent to the left side of the drawing. In addition, each of the replica pixels 201b is connected to the row driving circuit 52 through a part of the control line 58 and the control line 302.

Furthermore, hereinafter, in a case where it is not necessary to distinguish the replica pixel 301a from the replica pixel 301b, the replica pixel 301a from the replica pixel 301b will be simply referred to as a replica pixel 301. In addition, hereinafter, in the replica pixel 301, there is a case where the pixel 41 is referred to as an effective pixel.

<3-2. Circuit Configuration of Replica Pixel>

Next, a circuit configuration of the replica pixel 301 will be described with reference to FIG. 15. Furthermore, in the drawings, the same reference numerals will be applied to parts corresponding to those of FIG. 4.

The replica pixel 301 is different from the pixel 41 of FIG. 4, in that the photodiode 111 is deleted, and a portion corresponding to the accumulation node 112, is fixed to the power source voltage VDD.

Specifically, the replica pixel 301 includes a transfer transistor 321, a detection node 322, a reset transistor 323, an amplification transistor 324, and a selection transistor 325. The size and the layout of the transfer transistor 321, the reset transistor 323, the amplification transistor 324, and the selection transistor 325, are respectively similar to those of the transfer transistor 113, the reset transistor 115, the amplification transistor 116, and the selection transistor 117 of the pixel 41. In addition, the position of the detection node 322 is similar to the position of the detection node 114 of the pixel 41.

In addition, the driving signal RST is supplied to a gate of the reset transistor 323 from the row driving circuit 52, through the control line 58 common to the pixel 41. On the other hand, the driving signal SEL is supplied to a gate of the selection transistor 325 from the row driving circuit 52, through a control line 302 separated from the control line 58. That is, in the pixel 41 and the replica pixel 301, the driving signal SEL is supplied through different control lines. On the other hand, a gate of the transfer transistor 321 is connected to the ground or is fixed to a negative bias such that the transfer transistor 321 is constantly turned off.

The replica pixel 301 does not include a photodiode, and thus, has an extremely small occupied area, compared to the pixel 41. Accordingly, it is possible to arrange the replica pixels 301 in a gap between the arranged pixels 41 almost without compressing the occupied area of each of the pixels 41.

In addition, the replica pixel 301 is close to the pixel 41, and shares the power source VDD with the pixel 41, and the configuration of a detection node, a reset method, or the like, is similar to that of the pixel 41. Accordingly, in the replica pixel 301, an output noise approximately similar to that of the adjacent pixel 41, is generated.

<3-3. Reading Method of Pixel Signal>

Next, a reading method of the pixel signal in the light detector 23d, will be described with reference to FIG. 16 to FIG. 18.

First, the outline of a method of reducing the in-phase noise component in the light detector 23d, will be described with reference to FIG. 16.

In the light detector 23d, a global shutter operation is performed in which all of the pixels 41 are simultaneously exposed, and the charges are accumulated.

Specifically, at a time t1d, the PD reset is performed in all of the pixels 41. With this arrangement, the charges accumulated in the accumulation node 112 of each of the pixels 41, are discharged, and new charges are started to be accumulated. In addition, the FD reset is performed in all of the pixels 41. With this arrangement, the detection node 114 of the each of the pixels 41 is reset, and the reset signal is output from each of the pixels 41.

Next, as described below, the FD reset is sequentially performed with respect to the pixel 41 and the replica pixel 301 of each of the rows, and the reading of the reset level is further performed. Furthermore, in Example 2, for the sake of simplicity, the FD reset is performed all at once, but in this example, the FD reset is performed for each of the rows. This is because a period in which the FD is in a floating state until the reading, is matched with respect to all of the pixels 41 and the replica pixels 301. Accordingly, it is possible to reduce a variation in a signal offset for each of the pixels due to an FD dark current.

First, in a period TR1d, the FD reset of each of the pixels 41a of the R0 row, and the reset of the detection node 322 of each of the replica pixels 301a are performed, and the output signal is sampled. That is, the reset signal Rst0 of each of the pixels 41a of the R0 row, and a replica signal Rp0a of each of the replica pixels 301a of the R0 row are sampled, and are subjected to the AD conversion. At this time, the in-phase noise component n1 is superimposed on the reset signal Rst0 of each of the pixels 41a, and the replica signal Rp0a of each of the replica pixels 301a.

Next, in a period TR2d, the reset signal Rst0 of each of the pixels 41a of the R0 row, is output to the output control circuit 57 from the detection circuit 71a through the switch 56a. The replica signal Rp0a of each of the replica pixels 301a of the R0 row, is output to the output control circuit 57 from the detection circuit 71b through the switch 56b.

In addition, the FD reset of each of the pixels 41b of the R1 row, and the reset of the detection node 322 of each of the replica pixels 301b are performed, and the output signal thereof is sampled. That is, the reset signal Rst1 of each of the pixels 41b of the R1 row, and a replica signal Rp1a of each of the replica pixels 301b of the R1 row are sampled, and are subjected to the AD conversion. At this time, the in-phase noise component n2 is superimposed on the reset signal Rst1 of the each of the pixels 41b, and the replica signal Rp1a of each of the replica pixels 301b.

Next, in a period TR3d, the reset signal Rst1 of each of the pixels 41b of the R1 row, is output to the output control circuit 57 from the detection circuit 71b through the switch 56b. The replica signal Rp1a of each of the replica pixels 301b of the R1 row, is output to the output control circuit 57 from the detection circuit 71a through the switch 56a.

In addition, the FD reset of each of the pixels 41a of the R2 row, and the reset of the detection node 322 of each of the replica pixels 301a are performed, and the output signal thereof is sampled. That is, the reset signal Rst2 of each of the pixels 41a of the R2 row, and a replica signal Rp2a of each of the replica pixels 301a of the R2 row are sampled, and are subjected to the AD conversion. At this time, the in-phase noise component n3 is superimposed on the reset signal Rst2 of each of the pixels 41b, and the replica signal Rp2a of each of the replica pixels 301b.

In the subsequent periods of a period TR4d, a period TR5d, . . . , similar processing is repeated, and sequentially, the reset signal Rst(i) of the R(i) row, and a replica signal Rp(i)a are sampled at the same timing, and are subjected to the AD conversion. In other words, each of the pixels 41 and each of the detection circuits 71 are driven such that a timing when the reset signal Rst(i) of the R(i) row is sampled, and is subjected to the AD conversion, is matched to a timing when the replica signal Rp(i)a of the R(i) row is sampled, and is subjected to the AD conversion. At this time, the in-phase noise component is superimposed on the reset signal Rst(i) and the replica signal Rp(i)a.

Next, at a time t2d, the accumulated charges are transferred to the detection nodes 114 from the accumulation nodes 112 of all of the pixels 41, all at once. With this arrangement, the accumulation signals are output from each of the pixels 41.

Here, a period from the time t1d when each of the pixels 41 is started to accumulate the charges all at once, to the time t2d when the each of the pixels 41 transfers the accumulated charges all at once, is the exposure period of each of the pixels 41.

On the other hand, the state of each of the replica pixels 301 is not changed. Accordingly, the replica signal similar to that of the period from the time t1d to the time t2d (the exposure period), is continuously output from each of the replica pixels 301.

Next, in a period TA1d, the accumulation signal Acc0 of each of the pixels 41a of the R0 row, and a replica signal Rp0b of each of the replica pixels 301a of the R0 row are sampled, and are subjected to the AD conversion. At this time, the in-phase noise component n5 is superimposed on the accumulation signal Acc0 of each of the pixels 41a, and the replica signal Rp0b of each of the replica pixels 301a.

Next, in a period TA2d, the accumulation signal Acc0 of each of the pixels 41a of the R0 row, is output to the output control circuit 57 from the detection circuit 71a through the switch 56a. The replica signal Rp0b of each of the replica pixels 301a of the R0 row, is output to the output control circuit 57 from the detection circuit 71b through the switch 56b.

In addition, the accumulation signal Acc1 of each of the pixels 41b of the R1 row, and a replica signal Rp1b of each of the replica pixels 301b of the R1 row are sampled, and are subjected to the AD conversion. At this time, the in-phase noise component n6 is super imposed on the accumulation signal Acc1 of each of the pixels 41b, and the replica signal Rp1b of each of the replica pixels 301b.

Next, in a period TA3d, the accumulation signal Acc1 of each of the pixels 41b of the R1 row, is output to the output control circuit 57 from the detection circuit 71b through the switch 56b. The replica signal Rp1b of each of the replica pixels 301b of the R1 row, is output to the output control circuit 57 from the detection circuit 71a through the switch 56a.

In addition, in a period TA3d, the accumulation signal Acc2 of each of the pixels 41a of the R2 row, and a replica signal Rp2b of each of the replica pixels 301a of the R2 row are sampled, and are subjected to the AD conversion. At this time, the in-phase noise component n7 is superimposed on the accumulation signal Acc2 of each of the pixels 41a, and the replica signal Rp2b of each of the replica pixels 301a.

In the subsequent periods of a period TA4d, a period TA5d, . . . , similar processing is repeated, and sequentially, the accumulation signal Acc(i) of the R(i) row, and the replica signal Rp(i)b are sampled at the same timing, and are subjected to the AD conversion. In other words, each of the pixels 41 and each of the detection circuits 71 are driven such that a timing when the accumulation signal Acc(i) of the R(i) row is sampled, and is subjected to the AD conversion, is matched to a timing when the replica signal Rp(i)b of the R(i) row is sampled, and is subjected to the AD conversion. At this time, the in-phase noise component is superimposed on the accumulation signal Acc(i) and the replica signal Rp(i)b.

Figures 16, 17:
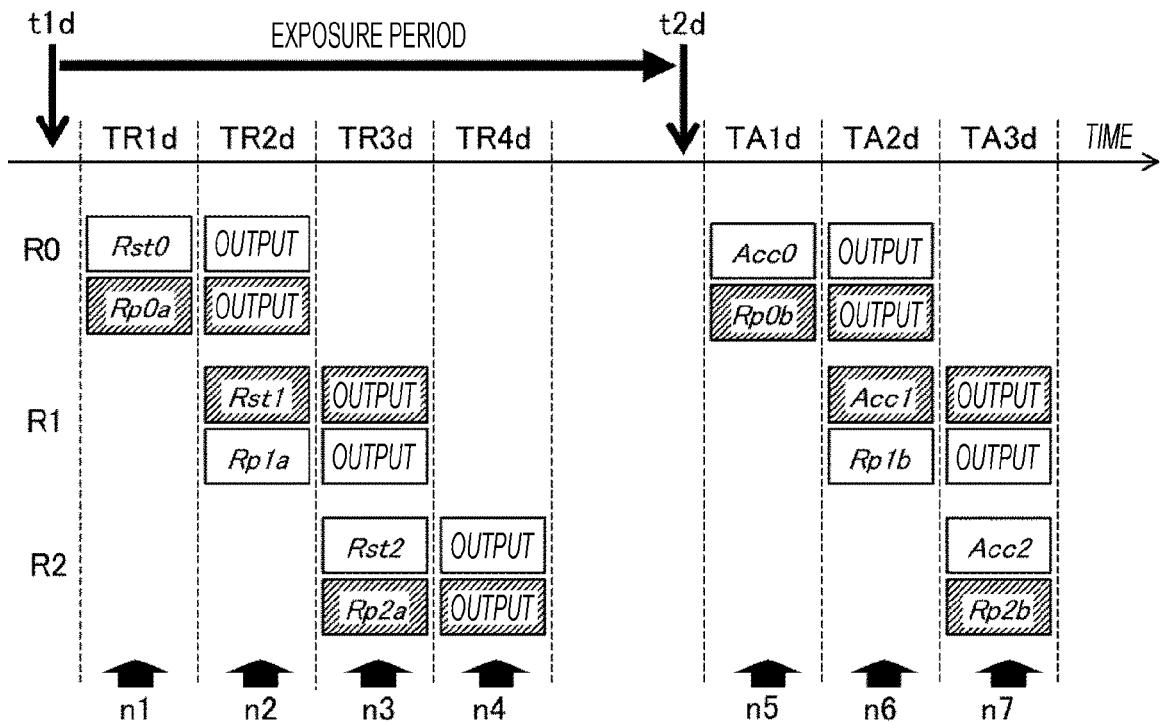
FIG. 16 is a diagram for describing the outline of a third reduction method of the in-phase noise component.
FIG. 17 is a diagram for describing the effect of the third reduction method of the in-phase noise component.

FIG. 17 illustrates an example of the pixel light detection signal of the pixel 41, and a differential signal of the replica pixel 301 (hereinafter, referred to as a pixel noise detection signal), which are read at the same timing. As described above, the pixel light detection signal of each of the pixels 41, is obtained by a difference between the accumulation signal and the reset signal. Here, as described above, the in-phase noise component is superimposed on the accumulation signal and the reset signal. Accordingly, for example, the pixel light detection signal of the pixel 41a of the R0 row, is (Acc0+n5)−(Rst0+n1)=(Acc0−Rst0)+(n5−n1).

On the other hand, the replica signal to be output from each of the replica pixels 301, is not changed before and after the charge transfer of the pixel 41. Accordingly, the signal component is offset by taking a difference between the replica signal Rp0a read at the same timing as that of the accumulation signal Acc0 of the pixel 41a of the R0 row, and the replica signal Rp0b read at the same timing as that of the reset signal Rst0 of the pixel 41a of the R0 row, and thus, only the in-phase noise component appears. That is, the pixel noise detection signal, which is a differential signal of the replica pixel 301a, read at the same timing as that of the pixel 41a of the R0 row, is n5−n1.

Accordingly, the in-phase noise component is eliminated from the pixel light detection signal by taking a difference between the pixel light detection signal of the pixel 41a of the R0 row and the pixel noise detection signal of the replica pixel 301a, and only the signal component (Acc0−Rst0) is extracted.

The same applies to the pixel light detection signal of the pixel 41 of the row subsequent to the R1 row.

Next, a specific reading operation of the pixel 41 and the replica pixel 301, will be described with reference to a timing chart of FIG. 18.

Figure 18:
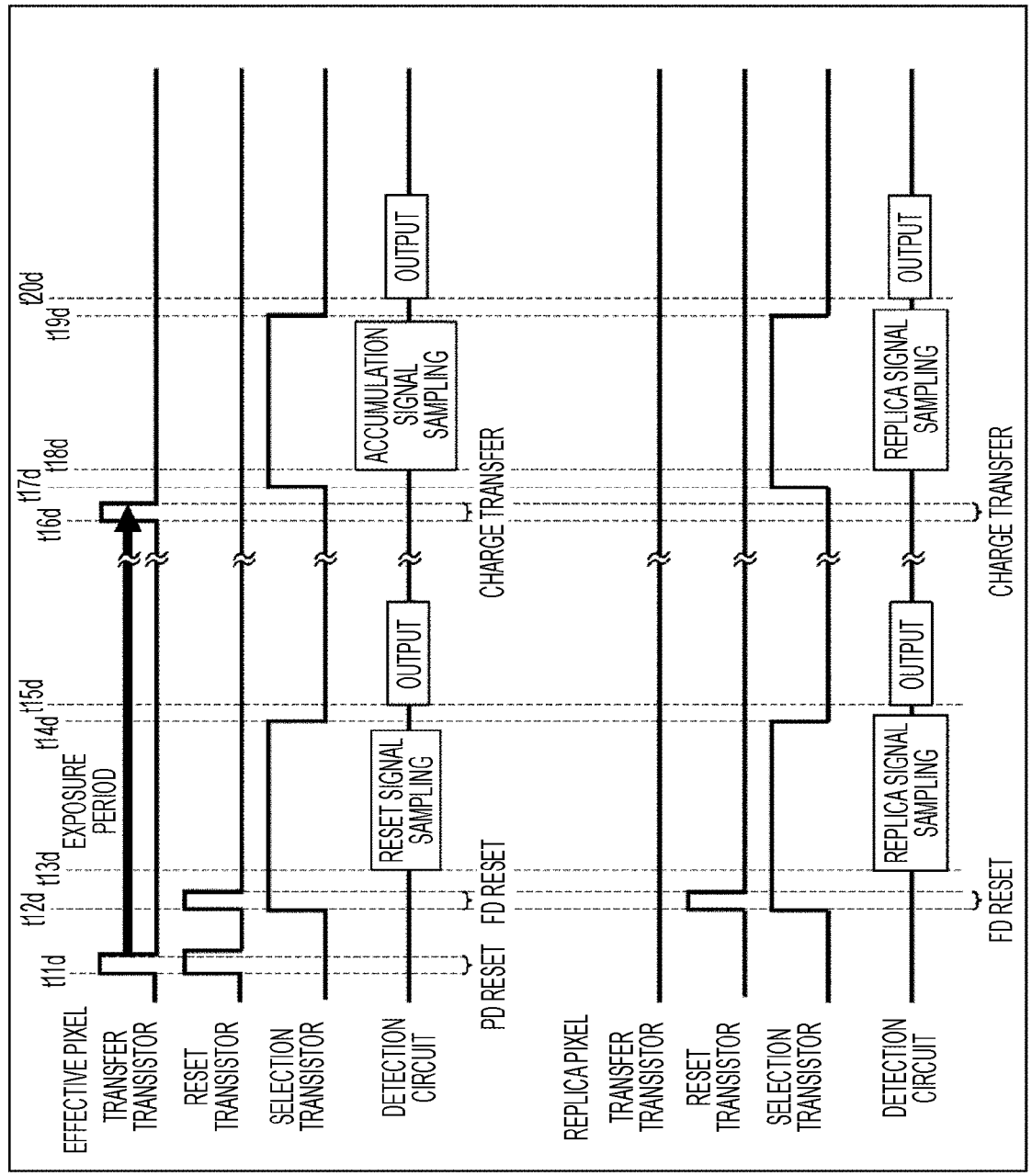
FIG. 18 is a timing chart for describing a reading operation of a pixel of the third embodiment of the light detector.

The timing chart of FIG. 18 illustrates the sequence of the reading operation of the pixel 41a (the effective pixel) and the replica pixel 301 of the R0 row. More specifically, the timing chart of FIG. 18 illustrates the operation sequence of the transfer transistor 113, the reset transistor 115, and the selection transistor 117 of the pixel 41a of the R0 row, and the detection circuit 71a, and the transfer transistor 321, the reset transistor 323, and the selection transistor 325 of the replica pixel 301a of the R0 row, and the detection circuit 71b.

In a time t11d, the row driving circuit 52 turns on both of the transfer transistor 113 and the reset transistor 115 of the pixel 41a. With this arrangement, all of the charges accumulated in the accumulation node 112a between the photodiode 111 and the transfer transistor 113, are discharged to the power source VDD. That is, the PD reset is performed.

After that, the row driving circuit 52 turns off the transfer transistor 113. With this arrangement, the accumulation node 112 is in a floating state, and new charges are started to be accumulated. That is, the exposure period of the pixel 41a is started.

In addition, the row driving circuit 52 turns off the reset transistor 115 after the PD reset.

The operation of the time t11d is performed in all of the pixels 41, all at once, and the exposure periods of all of the pixels 41 are started all at once.

On the other hand, the transfer transistor 321 of the replica pixel 301 is constantly turned off. In addition, the replica pixel 301 does not include a photodiode, and thus, the charge is not accumulated.

After that, the reset signal of the pixel 41, and the replica signal of the replica pixel 301 are sequentially read for each of the pixel rows.

First, at a time t12d, the FD reset of the pixel 41a and the replica pixel 301a of the R0 row, is performed.

Specifically, the row driving circuit 52 turns on the reset transistor 115 and the selection transistor 117 of the pixel 41a. The selection transistor 117 is turned on, and thus, the selected pixel 41a is connected to the vertical signal line 59a. In addition, the reset transistor 115 is turned on, and thus, the detection node 114 and the power source VDD, which are the input of the amplification transistor 116, are short-circuited. With this arrangement, a reference potential is generated in the selected pixel 41a. After a predetermined high pulse period has elapsed from the time t12d, the row driving circuit 52 turns off the reset transistor 115. Thus, the potential of the detection node 114 is reset.

In addition, the row driving circuit 52 turns on the reset transistor 323 and the selection transistor 325 of the replica pixel 301a. The selection transistor 325 is turned on, and thus, the selected replica pixel 301a is connected to the vertical signal line 59b. In addition, the reset transistor 323 is turned on, and thus, the detection node 322 and the power source VDD, which are the input of the amplification transistor 324, are short-circuited. With this arrangement, a reference potential is generated in the selected replica pixel 301a. After a predetermined high pulse period has elapsed from the time t12d, the row driving circuit 52 turns off the reset transistor 323. Thus, the potential of the detection node 322 is reset.

At a time t13d, the reset signal of the pixel 41a of the R0 row, and the replica signal of the replica pixel 301a are sampled.

Specifically, the AD converter 131 of the detection circuit 71a, converts an analog signal based on the potential of the vertical signal line 59a, into a digital signal. That is, the AD converter 131a of the detection circuit 71a, converts an analog signal based on the potential of the vertical signal line 59a, into a digital signal, and generates the reset signal Rst0. The sampling of the reset signal Rst0, is the first reading of the correlated double sampling of the pixel 41a.

In addition, the AD converter 131 of the detection circuit 71b, converts an analog signal based on the potential of the vertical signal line 59b, into a digital signal. That is, the AD converter 131b of the detection circuit 71b, converts an analog signal based on the potential of the vertical signal line 59b, into a digital signal, and generates the replica signal Rp0a. The sampling of the replica signal Rp0a, is the first reading of the correlated double sampling of the replica pixel 301a.

At a time t14d, the row driving circuit 52 turns off the selection transistor 117 of the pixel 41a, and the selection transistor 325 of the replica pixel 301a.

At a time t15d, the reset signal Rst0 of the pixel 41a of the R0 row, and the replica signal Rp0a of the replica pixel 301a are output. Specifically, the detection circuit 71a transfers the reset signal Rst0 to the inner output register. Then, the switches 56a are sequentially turned on for each of the pixel columns, and the reset signal Rst0 of each of the pixels 41a of the R0 row, is output to the data processing unit 12 through the output control circuit 57, and is stored in a memory or the like.

In addition, the detection circuit 71b transfers the replica signal Rp0a to the inner output register. Then, the switches 56b are sequentially turned on for each of the pixel columns, and the replica signal Rp0a of each of the replica pixels 301a of the R0 row, is output to the data processing unit 12 through the output control circuit 57, and is stored in a memory or the like.

Furthermore, at the time t15d, the FD reset and the reading operation of the pixel 41b and the replica pixel 301b of the next R1 row, are started.

Hereinafter, similarly, the FD reset and the reading operation of the pixel 41 and the replica pixel 301 of each of the pixel rows are sequentially performed. Then, the reset signal of all of the pixels 41, and the replica signal of the replica pixel 301 are read, and are stored in a memory or the like of the output control circuit 57.

Next, at a time t16d immediately before the exposure period is ended, the row driving circuit 52 turns on the transfer transistor 113 of the pixel 41a. With this arrangement, the charges accumulated in the accumulation node 112, are transferred to the detection node 114. That is, all of the electrons accumulated in the accumulation node 112, are transferred to the detection node 114, and the accumulation node 112 is in a completely depleted state.

After a predetermined high pulse period has elapsed from the time t16d, the row driving circuit 52 turns off the transfer transistor 113.

With this arrangement, the potential of the detection node 114 decreases by the accumulated charge amount, compared to a potential before the transfer transistor 113 is driven (that is, the potential becomes shallow).

The operation of the time t16d is performed in all of the pixels 41, all at once. Accordingly, in all of the pixels 41, the accumulated charges are transferred to the detection node 114 all at once, and the exposure periods are ended all at once.

On the other hand, the transfer transistor 321 of the replica pixel 301 is retained in a state of being constantly turned off, and the state of the detection node 322 is not changed.

After that, the accumulation signal of the pixel 41, and the replica signal of the replica pixel 301, are sequentially read for each of the pixel rows.

First, at a time t17d, the row driving circuit 52 turns on the selection transistor 117 the pixel 41a of the R0 row, and the selection transistor 325 of the replica pixel 301a.

Next, at a time t18d, the accumulation signal of the pixel 41a of the R0 row, and the replica signal of the replica pixel 301a, are sampled.

Specifically, the AD converter 131 of the detection circuit 71a, converts an analog signal based on the potential of the vertical signal line 59a, into a digital signal. That is, the AD converter 131a of the detection circuit 71a, converts an analog signal based on the potential of the vertical signal line 59a, into a digital signal, and generates the accumulation signal Acc0. The sampling of the accumulation signal Acc0, is the second reading of the correlated double sampling of the pixel 41a.

In addition, the AD converter 131 of the detection circuit 71b, converts an analog signal based on the potential of the vertical signal line 59b, into a digital signal. That is, the AD converter 31b of the detection circuit 71b, converts an analog signal based on the potential of the vertical signal line 59b, into a digital signal, and generates the replica signal Rp0b. The sampling of the replica signal Rp0b, is the second reading of the correlated double sampling of the replica pixel 301a. Furthermore, the state of the detection node 322 of the replica pixel 301a, is not basically changed from the first reading.

At a time t19d, the row driving circuit 52 turns off the selection transistor 117 of the pixel 41a, and the selection transistor 325 of the replica pixel 301a.

At a time t20d, the accumulation signal Acc0 of the pixel 41a of the R0 row, and the replica signal Rp0b of the replica pixel 301a are output. Specifically, the detection circuit 71a transfers the accumulation signal Acc0 to the inner output register. Then, the switches 56a are sequentially turned on for each of the pixel columns, and the accumulation signal Acc0 of each of the pixels 41a of the R0 row, is output to the data processing unit 12 through the output control circuit 57, and is stored in a memory or the like.

In addition, the detection circuit 71b transfers the replica signal Rp0b to the inner output register. Then, the switches 56b are sequentially turned on for each of the pixel columns, and the replica signal Rp0b of each of the replica pixels 301a of the R0 row, is output to the data processing unit 12 through the output control circuit 57, and is stored in a memory or the like.

The data processing unit 12 compares the accumulation signal Acc0 with the reset signal Rst0 for each of the pixels 41a of the R0 row, and calculates a pixel output value corresponding to an incident photon amount, on the basis of a comparison result. That is, the data processing unit 12 generates the pixel light detection signal indicating the pixel output value corresponding to the incident photon amount, by taking a difference between the accumulation signal Acc0 and the reset signal Rst for each of the pixels 41a of the R0 row.

In addition, the data processing unit 12 compares the replica signal Rp0b with the replica signal Rp0a for each of the replica pixels 301a of the R0 row, and extracts the in-phase noise component, on the basis of a comparison result. That is, the data processing unit 12 generates the pixel noise detection signal indicating the in-phase noise component, by taking a difference between the replica signal Rp0b and the replica signal Rp0a for each of the replica pixels 301a of the R0 row. Then, the data processing unit 12 reduces the in-phase noise component of the pixel light detection signal, by taking a difference between the pixel light detection signal of each of the pixels 41a of the R0 row, and the pixel noise detection signal of the corresponding replica pixel 301a.

Accordingly, a pixel light detection signal Sp0 of each of the pixels of the R0 row, is finally obtained by Equation (3) described below.

$$Sp0 = (Acc0 - Rst0) - (Rp0b - Rp0a) \quad (3)$$

Further, the data processing unit 12 adds the pixel light detection signal Sp0 of all of the pixels in the R0 row, and calculates a row light detection signal Sr0.

Furthermore, at a time t20d, the reading operation of the accumulation signal of the pixel 41b of the next R1 row, and the replica signal of the replica pixel 301b, is started.

Hereinafter, similarly, the reading operations of the accumulation signal of the pixel 41 of each of the pixel rows, and the replica signal of the replica pixel 301 are sequentially performed. In addition, arithmetic operation processing is performed for each of the pixel rows, and the row light detection signal is calculated.

Then, the data processing unit 12 adds the pixel light detection signal of each of the pixels 41 of one frame by adding the row light detection signals of all of the pixel rows, and generates the frame light detection signal. According to the frame light detection signal, it is possible to detect a light amount of minute light incident on the light detector 23d during the exposure period, with a high accuracy, without being affected by the in-phase noise component.

In addition, in the light detector 23d, the replica pixel 301 used for detecting the in-phase noise component of each of the pixels 41, is arranged close to the corresponding pixel 41, compared to the light detector 23c of FIG. 10. In addition, in the light detector 23c, a fixed voltage is supplied to each of the replica pixels 201 from the variable source 241, and thus, in each of the replica pixels 201, there is a case where a noise due to the variable source 241, which is not generated in the pixel 41, is generated. On the other hand, in the light detector 23d, the power source voltage VDD common to the pixel 41 is supplied to each of the replica pixels 301. Accordingly, the light detector 23d is capable of detecting the in-phase noise component of each of the pixels 41, with a higher accuracy, and of eliminating the in-phase noise component, compared to the light detector 23c.

Furthermore, at the time t11d, only the FD reset is performed, and at the time t16d, the charges of the accumulation node 112 are discharged by transferring the charges of the accumulation node 112 of the pixel 41, to the detection node 114, and thus, the PD reset can be omitted. With this arrangement, the charge accumulation of the next frame is started immediately after the time t16d, and thus, it is possible to perform light detection almost without a dead period.

In addition, in the above description, an example has been described in which all of the arithmetic operations of the signals sampled by the detection circuit 71 are performed in the data processing unit 12, but the arithmetic operation may be performed by other than the data processing unit 12, or the arithmetic operation processing may be dispersed.

For example, the output control circuit 57 may generate the pixel light detection signal of each of the pixels 41, and the pixel noise detection signal of each of the replica pixels 301, and may supply the obtained signals to the data processing unit 12. Further, the output control circuit 57 may supply the obtained pixel light detection signal of each of the pixels 41, to the data processing unit 12, by taking a difference between the pixel light detection signal of each of the pixels 41, and the pixel noise detection signal of the corresponding replica pixel 301.

In addition, for example, the output control circuit 57 may add the pixel light detection signal of one row, may add the pixel noise detection signal of one row, and may supply the obtained row light detection signal and the obtained row noise detection signal, to the data processing unit 12. Further, the output control circuit 57 may supply the obtained row light detection signal of each of the rows, to the data processing unit 12, by taking a difference between the row light detection signal of each of the rows, and the row noise detection signal of the corresponding row.

In addition, for example, a register may be provided in the output control circuit 57, and the output control circuit 57 may add the row light detection signal of one frame, may add the row noise detection signal of one frame, and may supply the obtained frame light detection signal and the obtained frame noise detection signal, to the data processing unit 12. Further, the output control circuit 57 may supply the obtained frame light detection signal to the data processing unit 12, by taking a difference between the frame light detection signal and the frame noise detection signal.

Thus, a part or all of the arithmetic operation processing is performed by the output control circuit 57, and thus, it is possible to considerably reduce the number of times of transferring the signal to the data processing unit 12 from the light detector 23d.

Further, the vertical signal line 59 may be short-circuited at the time of reading the replica signal of the replica pixel 301. For example, the vertical signal line 59b of each of the pixel columns may be short-circuited at the time of reading the reset signal of each of the replica pixels 301a of the R0 row. Similarly, the vertical signal line 59a of each of the pixel columns may be short-circuited at the time of reading the replica signal of each of the replica pixels 201b of the R1 row. With this arrangement, the influence of a random noise independently generated in each of the replica pixels 301, is reduced.

In addition, as described above, the control line 302 of supplying the driving signal SEL to the replica pixel 301, is wired independently from the control line 58 of the pixel 41. Accordingly, for example, the replica pixel 301 is controlled such that the replica pixel 301 is not constantly selected, and it is possible for the light detector 23d to perform a reading operation similar to that of the light detector 23a described above with reference to FIG. 6 to FIG. 8, without using the replica pixel 301. With this arrangement, for example, in the light detector 23d, the replica pixel 301 is fixed to be in a non-selected state, and thus, it is possible to switch a high-speed operation mode in which access with respect to the pixel 41 is performed in unit of two rows, as described above with reference to FIG. 6 to FIG. 8, and a low noise operation mode in which the access with respect to the pixel 41 is performed in unit of one row by using the replica pixel 301, as described above with reference to FIG. 16 to FIG. 18.

Furthermore, for example, in the light detector 23d, each of the pixels 41 can be connected to the detection circuit 71a through the vertical signal line 59a, and each of the replica pixels 301 can be connected to the detection circuit 71b through the vertical signal line 59b. In this case, the light detector 23d does not correspond to the high-speed operation mode.

Furthermore, the light detector 23a to the light detector 23d described above, can be mass-produced in the same manufacturing line as that of a CMOS image sensor, according to a manufacturing process similar to that of the CMOS image sensor.

In addition, the radiation counter device 1 to which the light detector 23a to the light detector 23d are applied, has a small size and light weight, and thus, is also strong in an environment variation, has stable characteristics, and is easily maintained. Further, the output of the radiation counter device 1 is a digital signal, and thus, in the devices on the later stage, only the digital signal is processed, and thus, it is difficult to receive the influence of a disturbing noise from the surroundings. In addition, in a case where a plurality of light receiving units 11 are provided in the radiation counter device 1, it is possible to easily process data output from the plurality of light receiving units 11.

4. Fourth Embodiment

Next, a fourth embodiment of the present technology will be described with reference to FIG. 19 and FIG. 20.

<4-1. Configuration Example of Flow Cytometer>

The light detector 23 described above, for example, can also be applied to other types of electronic equipment such as a biological examination device, in addition to the radiation counter device.

Figure 19:
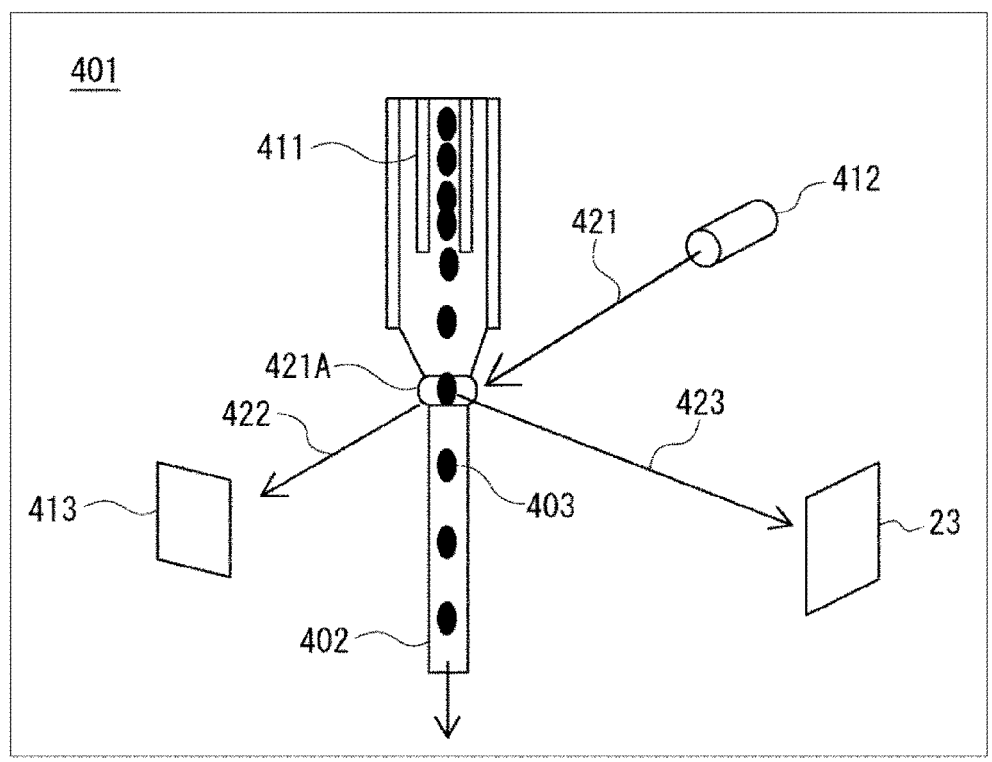
FIG. 19 is a diagram illustrating a configuration example of a flow cytometer, which is a fourth embodiment of the technology according to the present disclosure.

FIG. 19 illustrates a configuration example of a flow cytometer 401, as a biological examination device to which the present technology is applied.

The flow cytometer 401 includes at least the light detector 23, a sample tube 411, a laser light source 412, and a photodiode 413.

Furthermore, in the light detector 23a to the light detector 23d described above, the light detector 23c or the light detector 23d, in which the global shutter operation can be performed, is used in the light detector 23. In addition, the light detector 23 is set such that the global shutter operation is performed almost without a dead period.

Specimens 403 such as cells, flowing from the sample tube 411, are arranged on a line in the sample flow 402, and are irradiated with laser light 421 from the laser light source 412. In a case where the specimen 403 passes through an irradiation spot 421A of the laser light 421, scattering light, and fluorescent light excited from a fluorescent marker or the like, attached to the specimen 403, are generated.

Then, forward-scattered light 422 having a large light amount, is incident on the photodiode 413. The photodiode 413, for example, detects the size of the specimen 403, a timing when the specimen 403 passes through the irradiation spot 421A, or the like, on the basis of the received forward-scattered light 422. In addition, the photodiode 413 generates an event signal indicating the timing when the specimen 403 passes through the irradiation spot 421A, and supplies the even signal to the light detector 23.

On the other hand, detection light 423 including weak pulse light, is incident on the light detector 23. The detection light 423 includes lateral-confused light, and the fluorescent light emitted from the fluorescent marker attached to the specimen 403.

<4-2. Operation of Flow Cytometer>

Next, the operation of the flow cytometer 401 will be described with reference to FIG. 20.

Figure 20:
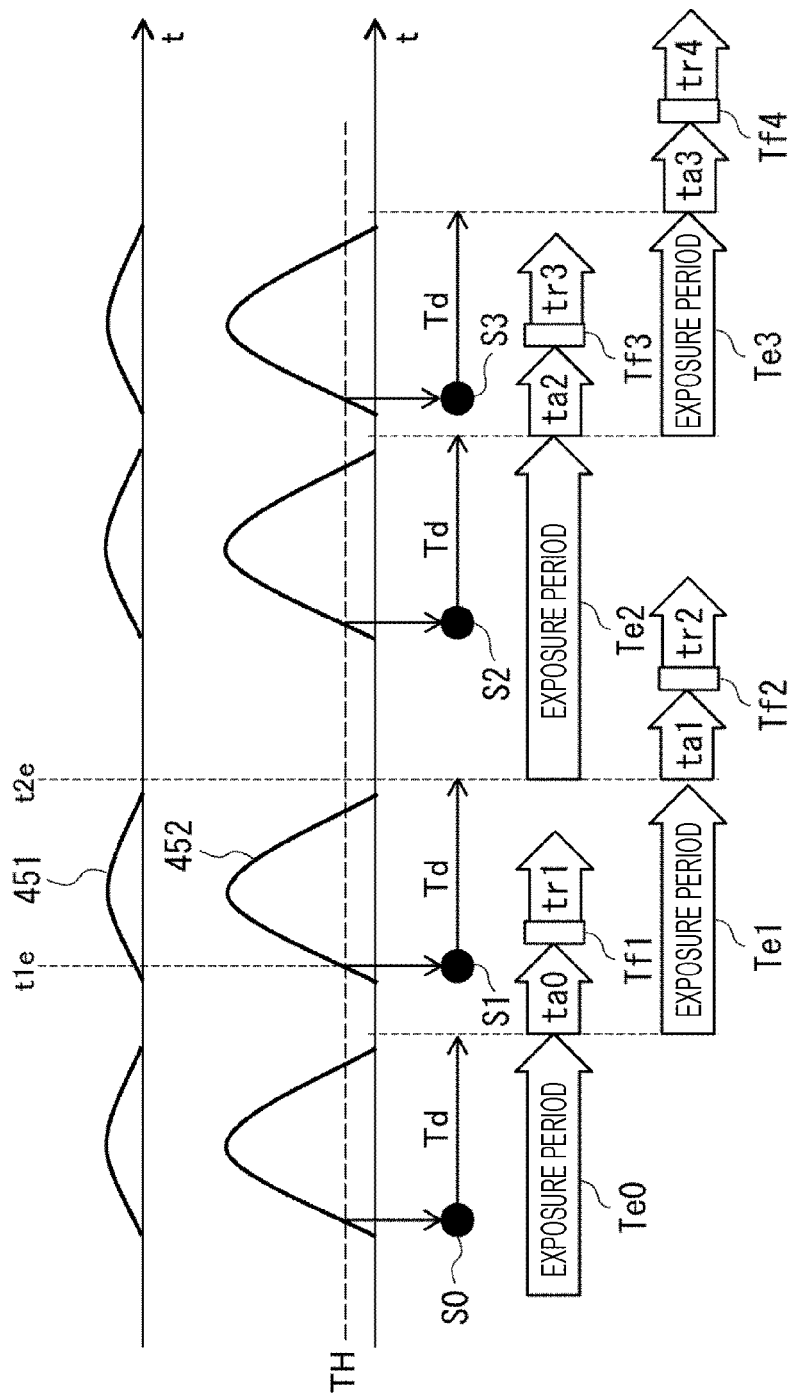
FIG. 20 is a timing chart for describing the operation of the flow cytometer.

An upper waveform 451 in FIG. 20, illustrates a chronological transition of the intensity of the detection light 423 to be detected by the light detector 23. A center waveform 452 in FIG. 20, illustrates a chronological transition of the intensity of the forward-scattered light 422 to be detected by the photodiode 413.

The fluorescent light to be emitted when the specimen 403 passes through the irradiation spot 421A of the laser light 421, is in the shape of a pulse. Accordingly, the waveform 451 representing the intensity of the detection light 423 including the fluorescent light, is in the shape of a pulse, and a timing when one specimen 403 passes through the irradiation spot 421A, is represented by each of the pulses.

On the other hand, the forward-scattered light 422 to be emitted when the specimen 403 passes through the irradiation spot 421A of the laser light 421, is also in the shape of a pulse. Accordingly, the waveform 452 representing the intensity of the forward-scattered light 422, is in the shape of a pulse, and a timing when one specimen 403 passes through the irradiation spot 421A, is represented by each of the pulses. In addition, in the waveform 451 and the waveform 452, the pulses appear approximately at the same timing.

The photodiode 413 compares the intensity of the forward-scattered light 422 with a predetermined threshold value TH. Then, the photodiode 413 determines that the specimen 403 passes through the irradiation spot 421A at a time t1e when the intensity of the forward-scattered light 422 is greater than or equal to the threshold value TH, generates an event signal S1, and supplies the event signal S1 to the light detector 23.

The light detector 23 ends the exposure period in synchronization with the event signal S1, and samples the accumulation signal. Specifically, the light detector 23 ends an exposure period Te1 of each of the pixels 41, at a time t2e when a predetermined delay time Td has elapsed from the time t1e when the event signal S1 is supplied, and starts a reading period Ta1 of the accumulation signal. In addition, at the time t2e, the light detector 23 starts the next exposure period Te2.

Furthermore, it is necessary to read the reset signal for eliminating the offset component of the accumulation signal, before the accumulation signal is read. The reset signal is read in a period Tr1, after the FD reset is executed in a period Tf1 immediately after a reading period Ta0 of the previous accumulation signal.

In addition, in a period Tf2 and a period Tr2 immediately after the light detector 23 reads the accumulation signal in the period Ta1, the FD reset for reading the next accumulation signal, and the reading of the reset signal are executed.

Then, the light detector 23, or a data processing unit (not illustrated) on the later stage of the light detector 23, generates the frame light detection signal to which the pixel light detection signal of one frame is added, on the basis of the accumulation signal read from each of the pixels 41, and the replica signal read from each of the replica pixels 201 or each of the replica pixels 301, in the period Ta1, and the reset signal read from each of the pixels 41, and the replica signal read from each of the replica pixels 201 or each of the replica pixels 301, in the period Tr1.

The frame light detection signal corresponds to the total amount of the detection light 423 to be generated by one specimen 403 passing through the irradiation spot 421A. Accordingly, it is possible to detect the intensity of the lateral-scattering light and the fluorescent light of each of the specimens 403, with a high accuracy, on the basis of the frame light detection signal.

5. Modification Example

Hereinafter, a modification example of the embodiments of the technology according to the present disclosure, described above, will be described.

The configuration example of the pixel 41 of FIG. 4 is an example, and in the technology according to the present disclosure, a pixel having an arbitrary configuration, can be used. For example, in the light detector 23c and the light detector 23d performing the global shutter operation, a memory may be provided between the transfer transistor 113 and the detection node 114 in the pixel 41, and the charges transferred from the accumulation node 112 may be temporarily retained in the memory, while the accumulation signal is read. Here, the light detector 23c and the light detector 23d have less number of pixels, and has a high frame rate, compared to an image sensor of a usual digital camera, and thus, a period in which the charges are accumulated in the detection node 114, is shortened. Accordingly, in a case where it is necessary that the memory is provided, it is possible to reduce the influence of the noise during a charge accumulation period.

Figure 11:
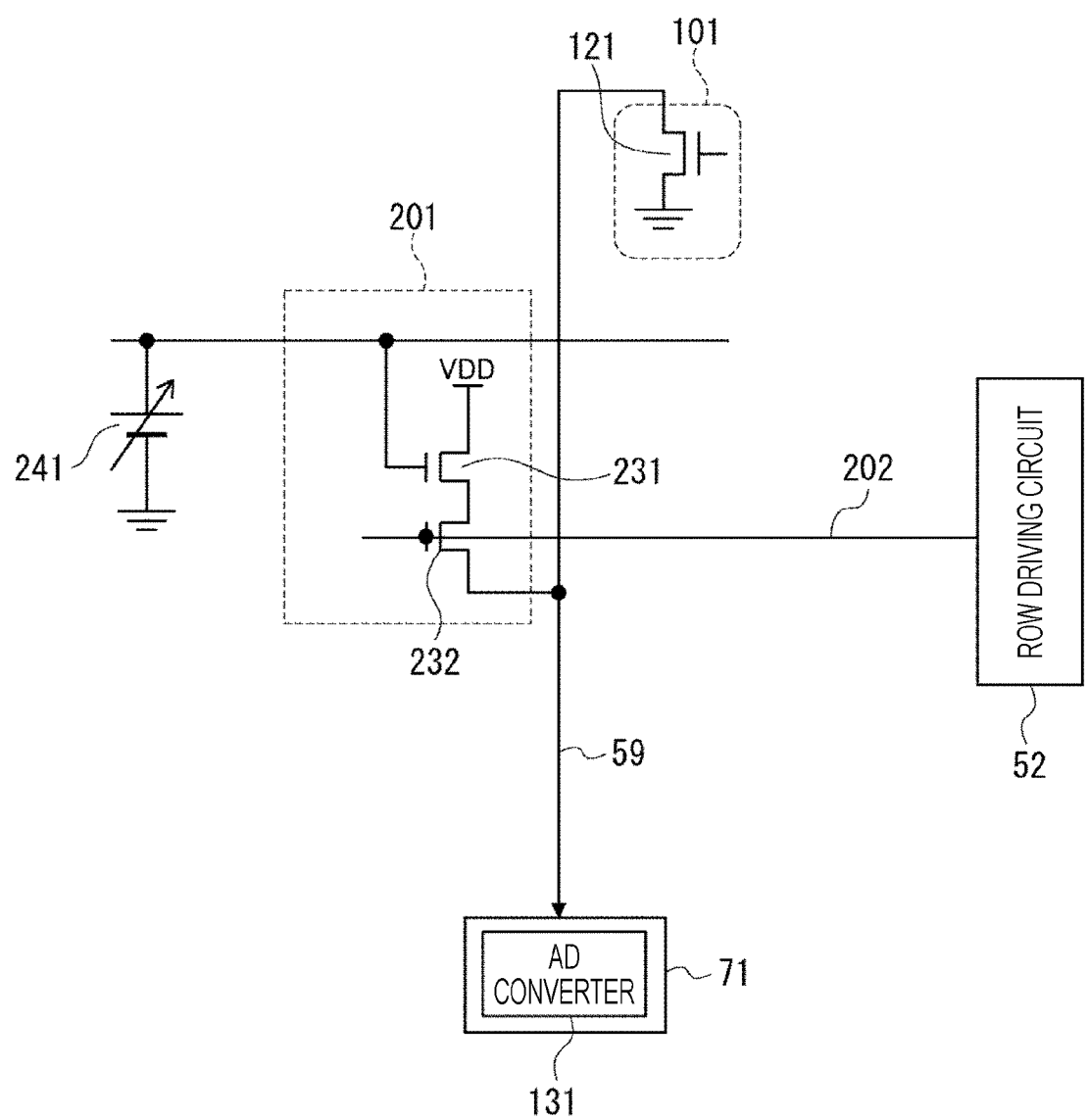
FIG. 11 is a circuit diagram illustrating a first embodiment of a replica pixel.
Figure 15:
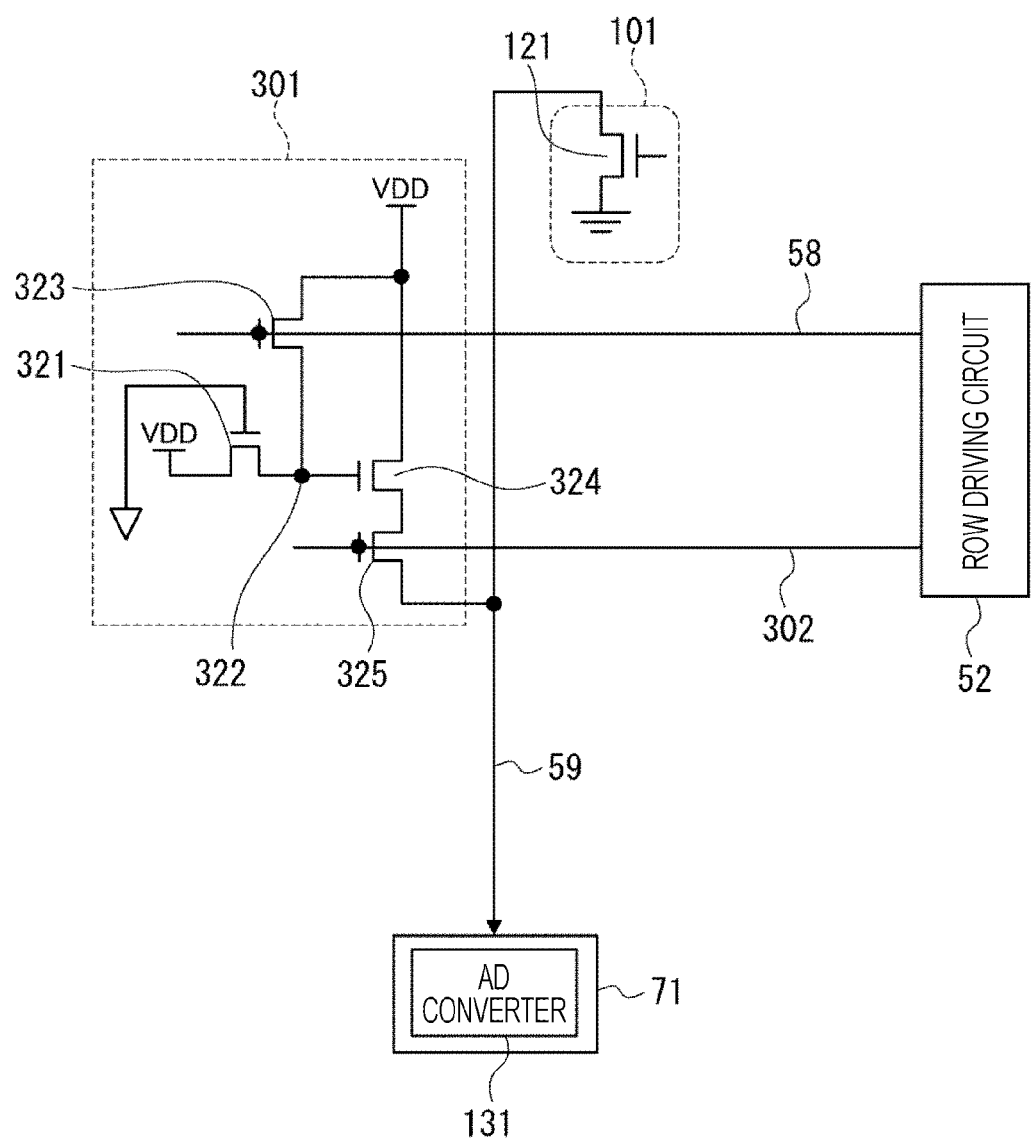
FIG. 15 is a circuit diagram illustrating a second embodiment of the replica pixel.

Furthermore, it is desirable that the configurations of the replica pixel 201 of FIG. 11 and the replica pixel 301 of FIG. 15, are also changed, according to a change in the configuration of the pixel 41.

In addition, in the light detector 23a of FIG. 2 and the light detector 23b of FIG. 9, the pixel signal may be read in unit of n rows of greater than or equal to 2. In a case where the pixel signal is read in unit of n rows, for example, in each of the pixel columns, n vertical signal lines 59a, n vertical signal lines 59b, n detection circuits 71a, n detection circuits 71b, n switches 56a, and n switches 56b may be provided.

Further, in the light detector 23c of FIG. 10, the pixel signal may be read in unit of n rows of greater than or equal to 2. In a case where the pixel signal is read in unit of n rows, for example, in each of the pixel columns, n vertical signal lines 59a, n vertical signal lines 59b, n detection circuits 71a, n detection circuits 71b, n switches 56a, and n switches 56b may be provided.

Furthermore, in the light detector 23c, in a case where the pixel signal is read in unit of n rows, it is not necessary that the replica pixel 201a and the replica pixel 201b are respectively provided in n rows. That is, the number of rows of the pixel 41 and the number of rows of the replica pixel 201, which are read at the same timing, may be different from each other. For example, in a case where the replica pixel 201a and the replica pixel 201b may be provided by one row by one row, the reset signals and the accumulation signals of the pixels 41 of n rows, and the replica signal of the replica pixel 201 of one row, are read at the same timing. Then, for example, the noise detection signal may be multiplied by n, at the time of taking a difference between the pixel light detection signals of n rows and the noise detection signal of one row, read at the same timing.

In addition, in the light detector 23d of FIG. 14, the pixel signal may be read in unit of n rows of greater than or equal to 2. In a case where the pixel signal is read in unit of n rows, for example, in each of the pixel columns, n vertical signal lines 59a, n vertical signal lines 59b, n detection circuits 71a, n detection circuits 71b, n switches 56a, and n switches 56b may be provided.

Furthermore, in the light detector 23d, in a case where the pixel signal is read in unit of n rows, it is not necessary that the replica pixel 301 is provided in each of the rows. That is, the number of rows of the pixel 41 and the number of rows of the replica pixel 201, read at the same timing, may be different from each other. For example, in a case where the replica pixel 301 is provided in every n rows, the reset signals and the accumulation signals of the pixels 41 of n rows, and the replica signal of the replica pixel of one row, are read at the same timing. Then, for example, the noise detection signal may be multiplied by n, at the time of taking a difference between the pixel light detection signals of n rows, and the noise detection signal of one row, read at the same timing.

Further, in the light detector 23d, even in a case where the pixel signal is read in unit of one row, it is not necessary that the replica pixel 301 is provided in each of the rows. That is, the replica pixel 301 may be shared in a plurality of pixel rows.

In addition, in the light detector 23a, it is not necessary that the replica pixels 301 are arranged in the same row as that of the pixel 41. For example, the replica pixel 301 can be arranged between the columns of the pixels 41, or a row of only the replica pixels 301 can be formed between the rows of the pixels 41.

Further, in the light detector 23a to the light detector 23d, for example, the pixel signal may be read in block unit but not in row unit. In this case, in the light detector 23a and the light detector 23b, it is desirable that the number of pixels of the blocks of sampling the accumulation signal at the same timing, is approximately identical to the number of pixels of the blocks of sampling the reset signal. In addition, in this case, in the light detector 23d, it is not necessary that the number of pixels 41 is identical to the number of replica pixels 301 in the block.

In addition, for example, in the replica pixel 201 and the replica pixel 301, the photodiode is provided as with the pixel 41, but it is also possible not to use the photodiode. This is equivalent to the fact that the photodiode is not effectively provided.

Further, the present technology, for example, can be applied to a case where the pixel light detection signal is generated on the basis of a difference between the accumulation signal and the reset signal, in addition to the CDS. Accordingly, for example, the present technology can also be applied to a case where the pixel light detection signal is generated by double data sampling (DDS).

6. Application Example

The technology according to the present disclosure, can be applied to various products. For example, the technology according to the present disclosure may be applied to a surgery room system.

<6-1. Application Example with Respect to Surgery System>

Figure 21:
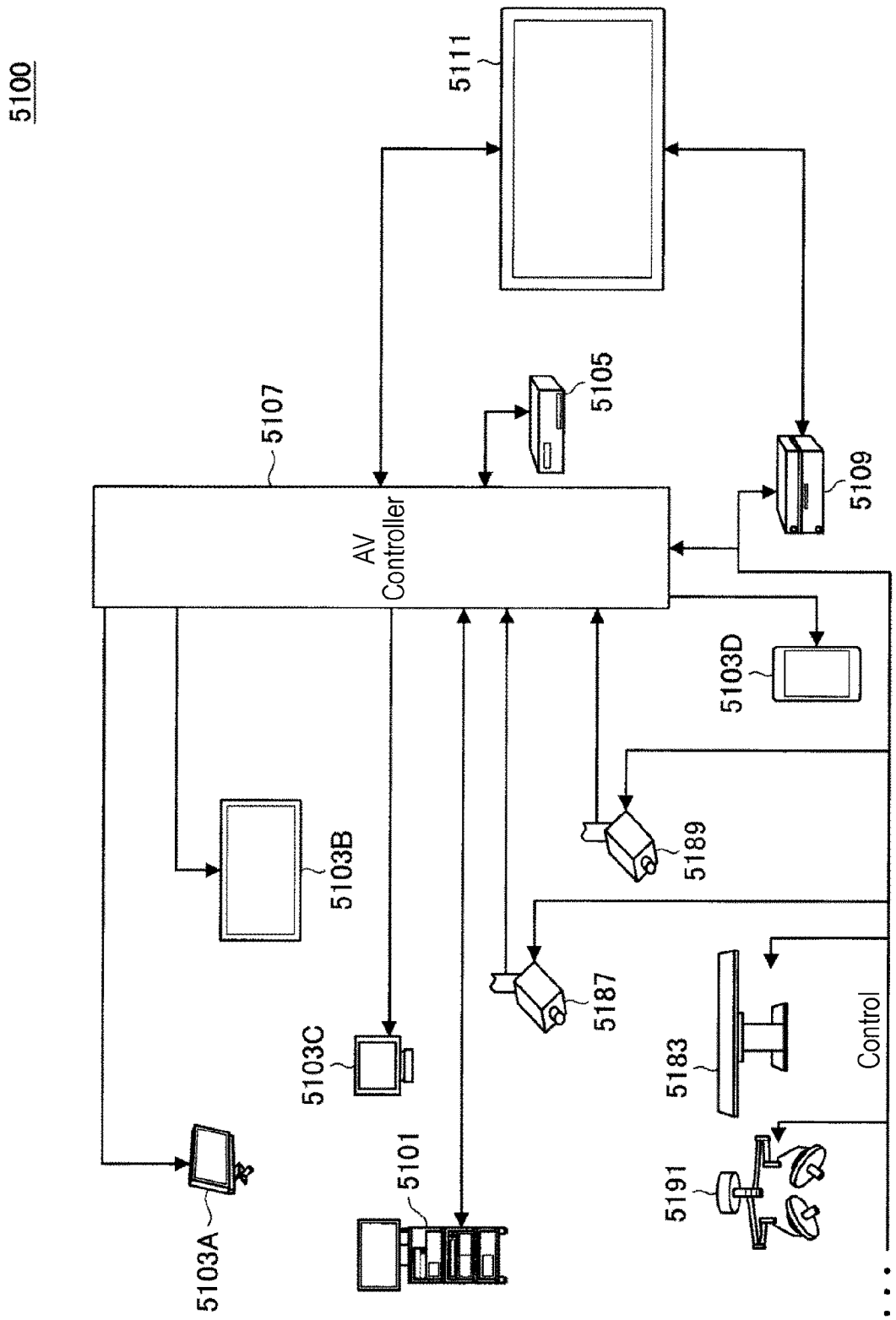
FIG. 21 is a diagram schematically illustrating the overall configuration of a surgery room system.

FIG. 21 is a diagram schematically illustrating the overall configuration of a surgery room system 5100 to which the technology according to the present disclosure can be applied. With reference to FIG. 21, the surgery room system 5100 is configured such that a device group in a surgery room is connected to be capable of cooperating with each other, through an audiovisual controller (an AV controller) 5107 and a surgery room control device 5109.

In the surgery room, various devices can be provided. In FIG. 21, as an example, various device groups 5101 for an endoscopic surgery, a ceiling camera 5187 which is disposed on the ceiling of the surgery room, and images the hands of a surgery operator, a surgery site camera 5189 which is disposed on the ceiling of the surgery room, and images the entire state of the surgery room, a plurality of display devices 5103A to 5103D, a recorder 5105, a patient bed 5183, and an illumination 5191, are illustrated.

Here, in such devices, the device group 5101 belongs to an endoscope surgery system 5113 as described later, and includes an endoscope, a display device displaying an image imaged by the endoscope, and the like. Each of the devices belonging to the endoscope surgery system 5113, is also referred to as medical equipment. On the other hand, the display devices 5103A to 5103D, the recorder 5105, the patient bed 5183, and the illumination 5191, for example, are a device provided in the surgery room, separately from the endoscope surgery system 5113. Each of the devices not belonging to the endoscope surgery system 5113, is also referred to as non-medical equipment. The audiovisual controller 5107 and/or the surgery room control device 5109, cooperatively control the operation of the medical equipment and the non-medical equipment.

The audiovisual controller 5107 integrally controls processing relevant to image display in the medical equipment and the non-medical equipment. Specifically, in the devices of the surgery room system 5100, the device group 5101, the ceiling camera 5187, and the surgery site camera 5189 can be a device having a function of transmitting information to be displayed during the surgery (hereinafter, also referred to as display information) (hereinafter, also referred to as a device of a transmission source). In addition, the display devices 5103A to 5103D can be a device to which the display information is output (hereinafter, also referred to as a device of an output destination). In addition, the recorder 5105 can be a device corresponding to both of the device of the transmission source and the device of the output destination. The audiovisual controller 5107 has a function of controlling the operation of the device of the transmission source and the device of the output destination, of acquiring the display information from the device of the transmission source, of transmitting the display information to the device of the output destination, and of displaying or recording the display information. Furthermore, the display information is various images imaged during the surgery, various information items associated to the surgery (for example, body information of a patient, a test result of the past, information associated with a surgery method, or the like), and the like.

Specifically, information with respect to an image of a surgery portion in body cavity of the patient, which is imaged by the endoscope, can be transmitted to the audiovisual controller 5107 from the device group 5101, as the display information. In addition, information with respect to an image of the hands of the surgery operator, which is imaged by the ceiling camera 5187, can be transmitted from the ceiling camera 5187, as the display information. In addition, information with respect to an image indicating the entire state of the surgery room, which is imaged by the surgery site camera 5189, can be transmitted from the surgery site camera 5189, as the display information. Furthermore, in a case where the other device having an imaging function exists in the surgery room system 5100, the audiovisual controller 5107 may acquire information with respect to an image imaged by the other device from the other device, as the display information.

Alternatively, for example, in the recorder 5105, the information with respect to the image imaged in the past is recorded by the audiovisual controller 5107. The audiovisual controller 5107 is capable of acquiring the information with respect to the image imaged in the past, from the recorder 5105, as the display information. Furthermore, in the recorder 5105, various information items associated to the surgery may be also recorded in advance.

The audiovisual controller 5107 displays the acquired display information (that is, an image captured during the surgery or various information items associated to the surgery) on at least one of the display devices 5103A to 5103D, which are the device of the output destination. In the illustrated example, the display device 5103A is a display device disposed to be suspended from the ceiling of the surgery room, the display device 5103B is a display device disposed on a wall surface of the surgery room, the display device 5103C is a display device disposed on a desk in the surgery room, and the display device 5103D is mobile equipment having a display function (for example, a tablet personal computer (PC)).

In addition, even though it is not illustrated in FIG. 21, the surgery room system 5100 may include a device outside the surgery room. The device outside the surgery room, for example, can be a server connected to a network constructed inside or outside the hospital, or a PC used by a medical staff, a projector disposed in an assembly room of the hospital, and the like. In a case where such an external device is outside the hospital, the audiovisual controller 5107 is capable of displaying the display information on a display device of the other hospital through a teleconference system or the like, in order for a remote medical care.

The surgery room control device 5109 integrally controls processing other than the processing relevant to the image display in the non-medical equipment. For example, the surgery room control device 5109 controls the driving of the patient bed 5183, the ceiling camera 5187, the surgery site camera 5189, and the illumination 5191.

In the surgery room system 5100, a centralized manipulation panel 5111 is provided, a user is capable of applying an instruction with respect to the image display, to the audiovisual controller 5107, or of applying an instruction with respect to the operation of the non-medical equipment, to the surgery room control device 5109, through the centralized manipulation panel 5111. The centralized manipulation panel 5111 has a configuration in which a touch panel is disposed on a display surface of the display device.

Figure 22:
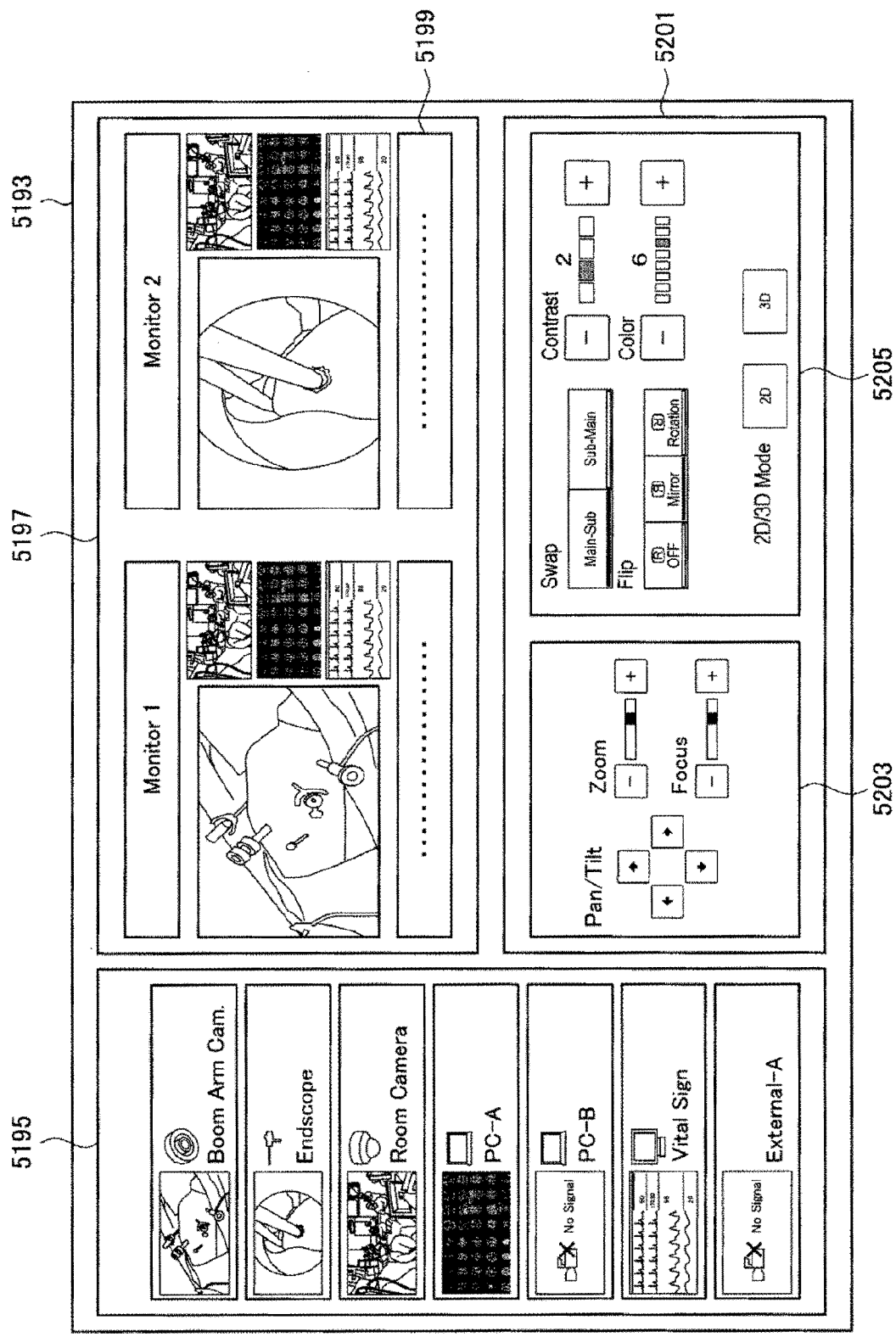
FIG. 22 is a diagram illustrating a display example of a manipulation screen on a centralized manipulation panel.

FIG. 22 is a diagram illustrating a display example of a manipulation screen of the centralized manipulation panel 5111. In FIG. 22, as an example, a manipulation screen corresponding to a case where two display devices are provided in the surgery room system 5100, as the device of the output destination, is illustrated. With reference to FIG. 22, in the manipulation screen 5193, a transmission source selection region 5195, a preview region 5197, and a control region 5201 are provided.

On the transmission source selection region 5195, a transmission source device provided in the surgery room system 5100, and a thumbnail screen indicating display information of the transmission source device, are displayed to be linked to each other. The user is capable of selecting the display information to be displayed on the display device, from any transmission source device displayed on the transmission source selection region 5195.

On the preview region 5197, a preview of a screen to be displayed on two display devices (Monitor 1 and Monitor 2), which are the device of the output destination, is displayed. In the illustrated example, four images are PinP-displayed on one display device. The four images correspond to the display information transmitted from the selected transmission source device in the transmission source selection region 5195. In four images, one image is displayed comparatively large as a main image, and the remaining three images are displayed comparatively small as a sub-image. The user is capable of suitably selecting a region on which four images are displayed, or is capable of switching the main image and the sub-image. In addition, in a lower portion of the region on which four images are displayed, a status display region 5199 is provided, and a status relevant to the surgery (for example, an elapsed time of the surgery, the information of the patient, and the like) can be suitably displayed on the region.

In the control region 5201, a transmission source manipulation region 5203 on which a graphical user interface (GUI) component for performing a manipulation with respect to the device of the transmission source, is displayed, and an output destination manipulation region 5205 on which a GUI component for performing a manipulation with respect to the device of the output destination, is displayed, are provided. In the illustrated example, in the transmission source manipulation region 5203, a GUI component for performing various manipulations (pan, tilt, and zoom) with respect to a camera in the device of the transmission source, having an imaging function, is provided. The user suitably selects the GUI component, and thus, is capable of manipulating the operation of the camera in the device of the transmission source. Furthermore, even though it is not illustrated, in a case where the device of the transmission source, selected in the transmission source selection region 5195, is a recorder (that is, in a case where the image recorded in the recorder in the past, is displayed on the preview region 5197), in the transmission source manipulation region 5203, a GUI component for performing a manipulation such as reproducing, stopping reproducing, rewinding, and fast forwarding of the image, can be provided.

In addition, in the output destination manipulation region 5205, a GUI component for performing various manipulations with respect to the display on the display device which is the device of the output destination (swap, flip, tone adjustment, contrast adjustment, and switching 2D display and 3D display), is provided. The user suitably selects such a GUI component, and thus, is capable of manipulating the display on the display device.

Furthermore, the manipulation screen to be displayed on the centralized manipulation panel 5111 is not limited to the illustrated example, and the user may perform manipulation input with respect to each device, which is provided in the surgery room system 5100, and is capable of being controlled by the audiovisual controller 5107 and the surgery room control device 5109, through the centralized manipulation panel 5111.

Figure 23:
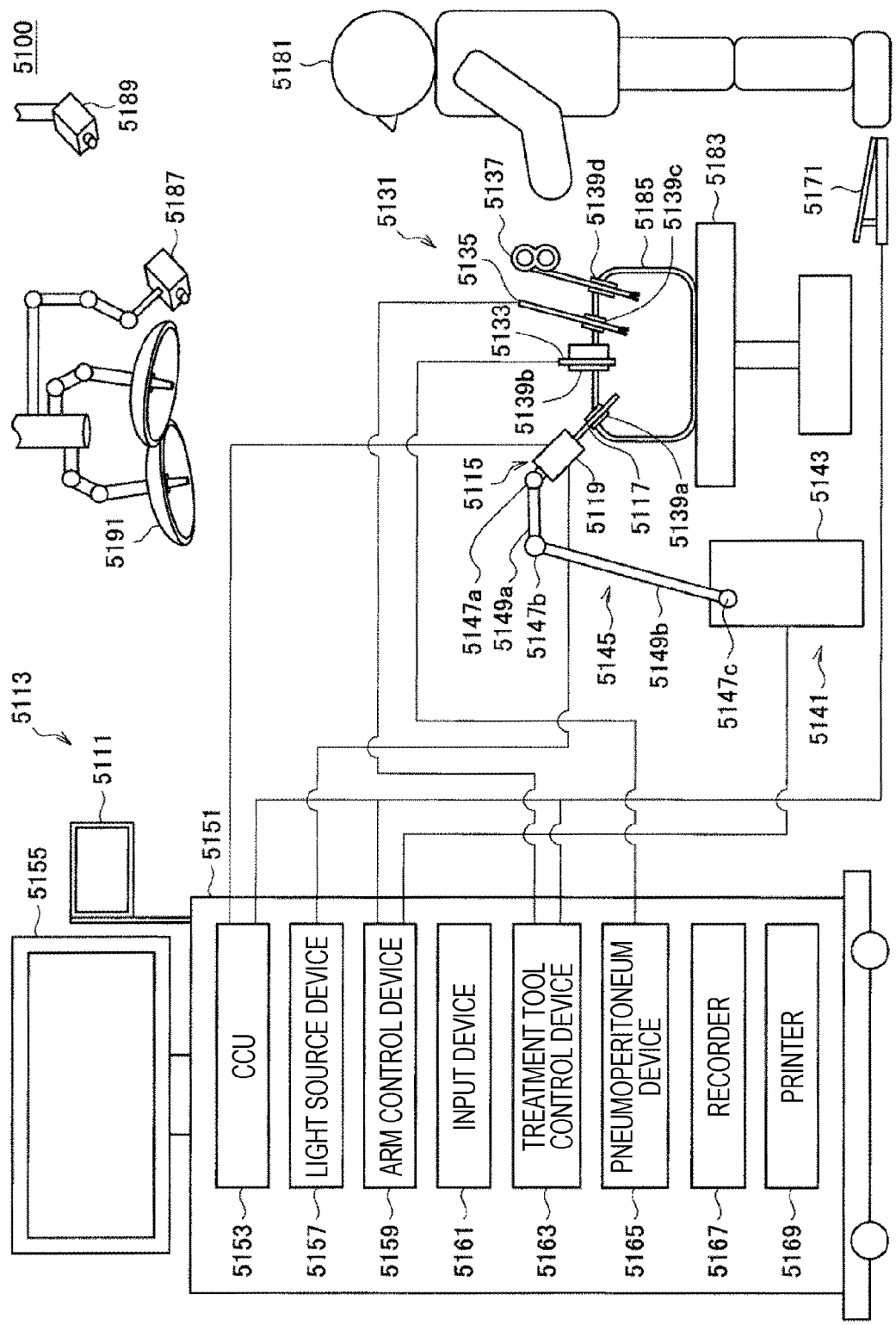
FIG. 23 is a diagram illustrating an example of a state of a surgery to which the surgery room system is applied.

FIG. 23 is a diagram illustrating an example of the state of the surgery to which the surgery room system described above is applied. The ceiling camera 5187 and the surgery site camera 5189 are disposed on the ceiling of the surgery room, and are capable of capturing the hands of a surgery operator (a medical doctor) 5181 performing a treatment with respect to an affected part of a patient 5185 on the patient bed 5183, and the entire state of the surgery room. In the ceiling camera 5187 and the surgery site camera 5189, a magnification adjustment function, a focal point distance adjustment function, a capturing direction adjustment function, and the like can be provided. The illumination 5191 is disposed on the ceiling of the surgery room, and irradiates at least the hands of the surgery operator 5181 with light. The illumination 5191 may suitably adjust an irradiation light amount, a wavelength (a color) of irradiation light, a light irradiation direction, and the like.

As illustrated in FIG. 21, the endoscope surgery system 5113, the patient bed 5183, the ceiling camera 5187, the surgery site camera 5189, and the illumination 5191 are connected to be capable of cooperating with each other, through the audiovisual controller 5107 and the surgery room control device 5109 (not illustrated in FIG. 23). In the surgery room, the centralized manipulation panel 5111 is provided, and as described above, the user is capable of suitably manipulating the device existing in the surgery room, through the centralized manipulation panel 5111.

Hereinafter, the configuration of the endoscope surgery system 5113 will be described in detail. As illustrated, the endoscope surgery system 5113 includes an endoscope 5115, other surgical tools 5131, a support arm device 5141 supporting the endoscope 5115, and a cart 5151 on which various devices for an endoscopic surgery are mounted.

In the endoscope surgery, a tubular perforating tool referred to as trocars 5139*a* to 5139*d*, is tapped on an abdominal wall a plurality of times, instead of performing laparotomy by cutting the abdominal wall. Then, a lens tube 5117 of the endoscope 5115, and the other surgical tools 5131 are inserted into the body cavity of the patient 5185, from the trocars 5139*a* to 5139*d*. In the illustrated example, as the other surgical tools 5131, a pneumoperitoneum tube 5133, an energy treatment tool 5135, and forceps 5137 are inserted into the body cavity of the patient 5185. In addition, the energy treatment tool 5135 is a treatment tool performing incision and ablation of a tissue, sealing of a blood vessel, and the like, according to a high frequency current or an ultrasonic vibration. Here, the illustrated surgical tool 5131 is merely an example, and for example, various surgical tools generally used in the endoscopic surgery, such as tweezers and a retractor, may be used as the surgical tool 5131.

The image of the surgery portion in the body cavity of the patient 5185, captured by the endoscope 5115, is displayed on the display device 5155. The surgery operator 5181, for example, performs a treatment such as excision of the affected part by using the energy treatment tool 5135 or the forceps 5137, while observing the image of the surgery portion displayed on the display device 5155, in real time. Furthermore, even though it is not illustrated, the pneumoperitoneum tube 5133, the energy treatment tool 5135, and the forceps 5137 are supported by the surgery operator 5181, an assistant, or the like, during the surgery.

(Support Arm Device)

The support arm device 5141 includes an arm portion 5145 extending from a base portion 5143. In the illustrated example, the arm portion 5145 includes joint portions 5147*a*, 5147*b*, and 5147*c*, and links 5149*a* and 5149*b*, and is driven according to the control from the arm control device 5159. The endoscope 5115 is supported by the arm portion 5145, and the position and the posture thereof are controlled. With this arrangement, a stable position of the endoscope 5115 can be fixed.

(Endoscope)

The endoscope 5115 includes a lens tube 5117 in which a region of a predetermined length from a tip end, is inserted into the body cavity of the patient 5185, and a camera head 5119 connected to a base end of the lens tube 5117. In the illustrated example, the endoscope 5115 configured as a so-called rigid scope including a rigid lens tube 5117, is illustrated, but the endoscope 5115 may be configured as a so-called flexible scope including a flexible lens tube 5117.

An opening portion into which an objective lens is fitted, is provided on the tip end of the lens tube 5117. A light source device 5157 is connected to the endoscope 5115, and light generated by the light source device 5157 is guided to the tip end of the lens tube by a light guide provided to extend in the lens tube 5117, and is applied towards an observation target in the body cavity of the patient 5185 through the objective lens. Furthermore, the endoscope 5115 may be a direct-viewing scope, or may be an oblique-viewing scope or a lateral-viewing scope.

In the camera head 5119, an optical system and an imaging element are provided, and reflection light (observation light) from the observation target, is condensed in the imaging element by the optical system. The observation light is subjected to the photoelectric conversion by the imaging element, and an electrical signal corresponding to the observation light, that is, an image signal corresponding to an observation image, is generated. The image signal is transmitted to a camera control unit (CCU) 5153, as RAW data. Furthermore, in the camera head 5119, a function of adjusting a magnification and a focal point distance by suitably driving the optical system, is provided.

Furthermore, for example, a plurality of imaging elements may be provided in the camera head 5119, in order to correspond to a stereoscopic view (3D display) or the like. In this case, a plurality of relay optical systems are provided in the lens tube 5117, in order to guide the observation light to each of the plurality of imaging elements.

(Various Devices Mounted on Cart)

The CCU 5153 includes a central processing unit (CPU), a graphics processing unit (GPU), or the like, and integrally controls the operation of the endoscope 5115 and the display device 5155. Specifically, the CCU 5153 performs, for example, various image processings for displaying the image based on the image signal, such as development processing (demosaic processing), with respect to the image signal received from the camera head 5119. The CCU 5153 provides the image signal subjected to the image processing, to the display device 5155. In addition, the audiovisual controller 5107 illustrated in FIG. 21, is connected to the CCU 5153. The CCU 5153 also provides the image signal subjected to the image processing, to the audiovisual controller 5107. In addition, the CCU 5153 transmits a control signal to the camera head 5119, and controls the driving thereof. The control signal is capable of including information associated with an imaging condition such as a magnification or a focal point distance. The information associated with the imaging condition, may be input through an input device 5161, or may be input through the centralized manipulation panel 5111 described above.

The display device 5155 displays an image based on the image signal subjected to the image processing by the CCU 5153, according to the control from the CCU 5153. In a case where the endoscope 5115, for example, corresponds to high-definition capturing such as 4K (the number of horizontal pixels of 3840× the number of vertical pixels of 2160) or 8K (the number of horizontal pixels of 7680× the number of vertical pixels of 4320), and/or corresponds to 3D display, a display device capable of performing high-definition display corresponding to each of 4 K and 8 K, and/or a display device capable of performing 3D display, can be used as the display device 5155. In the case of corresponding to the high-definition capturing such as 4 K or 8 K, a display device having a size of greater than or equal to 55 inches is used as the display device 5155, and thus, more immersion feeling can be obtained. In addition, a plurality of display devices 5155 may be provided having different definitions and sizes, according to a use application.

The light source device 5157, for example, includes a light source such as a light emitting diode (LED), and supplies the irradiation light at the time of capturing the surgery portion, to the endoscope 5115.

The arm control device 5159, for example, includes a processor such as a CPU, and is operated according to a predetermined program, and thus, controls the driving of the arm portion 5145 of the support arm device 5141, according to a predetermined control method.

The input device 5161 is an input interface with respect to the endoscope surgery system 5113. The user is capable of performing the input of various information items, or the input of an instruction with respect to endoscope surgery system 5113, through the input device 5161. For example, the user inputs various information items associated with the surgery, such as the body information of the patient, and the information associated to the surgery method of the surgery, through the input device 5161. In addition, for example, the user inputs an instruction of driving the arm portion 5145, an instruction of changing the imaging condition of the endoscope 5115 (the type of irradiation light, the magnification, the focal point distance, and the like), an instruction of driving the energy treatment tool 5135, and the like, through the input device 5161.

The type of input device 5161 is not limited, and the input device 5161 may be various known input devices. For example, a mouse, a keyboard, a touch panel, a switch, a foot switch 5171 and/or a lever, and the like can be applied as the input device 5161. In a case where the touch panel is used as the input device 5161, the touch panel may be disposed on the display surface of the display device 5155.

Alternatively, the input device 5161, for example, is a device mounted on the user, such as a spectacle type wearable device or a head mounted display (HMD), various inputs are performed according to the gesture or a visual line of the user, which is detected by such a device. In addition, the input device 5161 includes a camera capable of detecting the motion of the user, and various inputs are performed according to the gesture or the visual line of the user detected from a video imaged by the camera. Further, the input device 5161 includes a microphone capable of picking up the sound of the user, and various inputs are performed according to the sound through the microphone. Thus, the input device 5161 is configured such that various information items can be input in a non-contact manner, and thus, in particular, a user belonging to a clean area (for example, the surgery operator 5181) is capable of manipulating the equipment belonging to an unclean area, in a non-contact manner. In addition, the user is capable of manipulating the equipment without releasing the hands from the possessed surgical tool, and thus, convenience of the user is improved.

The treatment tool control device 5163 controls the driving of the energy treatment tool 5135 for the cauterization and the incision of the tissue, the sealing of the blood vessel, or the like. In order to ensure a visual field of the endoscope 5115 and to ensure a working space of the surgery operator, the pneumoperitoneum device 5165 sends gas into the body cavity through the pneumoperitoneum tube 5133 such that the body cavity of the patient 5185 is inflated. The recorder 5167 is a device capable of recording various information items associated with the surgery. The printer 5169 is a device capable of printing various information items associated with the surgery, in various formats such as a text, an image, or a graph.

Hereinafter, in the endoscope surgery system 5113, a particularly characteristic configuration will be described in more detail.

(Support Arm Device)

The support arm device 5141 includes the base portion 5143 which is a base, and the arm portion 5145 extending from the base portion 5143. In the illustrated example, the arm portion 5145 includes the plurality of joint portions 5147a, 5147b, and 5147c, and the plurality of links 5149a and 5149b joined by the joint portion 5147b, but in FIG. 23, for the sake of simplicity, the configuration of the arm portion 5145 is simply illustrated. Actually, the shape of the joint portions 5147a to 5147c and the links 5149a and 5149b, the number of joint portions 5147a to 5147c and links 5149a and 5149b, the arrange of the joint portions 5147a to 5147c and the links 5149a and 5149b, a rotation axis direction of the joint portions 5147a to 5147c, and the like are suitably set such that the arm portion 5145 has a desired freedom degree. For example, the arm portion 5145 can be preferably configured to have a freedom degree of greater than or equal to 6. With this arrangement, the endoscope 5115 can be freely moved within a movement range of the arm portion 5145, and thus, it is possible to insert the lens tube 5117 of the endoscope 5115 into the body cavity of the patient 5185 from a desired direction.

In the joint portions 5147a to 5147c, an actuator is provided, and the joint portions 5147a to 5147c can be rotated around a predetermined rotation axis by driving the actuator. The driving of the actuator is controlled by the arm control device 5159, and thus, a rotation angle of each of the joint portions 5147a to 5147c is controlled, and the driving of the arm portion 5145 is controlled. With this arrangement, the position and the posture of the endoscope 5115 can be controlled. At this time, the arm control device 5159 is capable of controlling the driving of the arm portion 5145, according to various known control methods such as force control or position control.

For example, the surgery operator 5181 performs suitable manipulation input through the input device 5161 (including the foot switch 5171), and thus, the driving of the arm portion 5145 may be suitably controlled by the arm control device 5159, according to the manipulation input, and the position and the posture of the endoscope 5115 may be controlled. According to the control, the endoscope 5115 on the tip end of the arm portion 5145, can be moved to an arbitrary position from an arbitrary position, and then, can be fixedly supported in the position after the movement. Furthermore, the arm portion 5145 may be manipulated by a so-called master-slave system. In this case, the arm portion 5145 can be remotely manipulated by the user, through the input device 5161 provided in a location separated from the surgery room.

In addition, in a case where the force control is applied, so-called power assist control may be performed, in which the arm control device 5159 receives an external force from the user, and drives the actuator of each of the joint portions 5147a to 5147c such that the arm portion 5145 is smoothly moved according to the external force. With this arrangement, when the user moves the arm portion 5145 while being directly in contact with the arm portion 5145, it is possible to move the arm portion 5145 with a comparatively light force. Accordingly, it is possible to more intuitively move the endoscope 5115 by a simpler manipulation, and to improve the convenience of the user.

Here, in general, in the endoscopic surgery, the endoscope 5115 is supported by a medical doctor referred to as a scopist. In contrast, the position of the endoscope 5115 can be more reliably fixed by using the support arm device 5141, without manual work, and thus, it is possible to stably obtain the image of the surgery portion, and to smoothly perform the surgery.

Furthermore, the arm control device 5159 may not be provided in the cart 5151. In addition, the arm control device 5159 may not be one device. For example, the arm control device 5159 may be provided in each of the joint portions 5147a to 5147c of the arm portion 5145 of the support arm device 5141, and a plurality of arm control devices 5159 may cooperate with each other, and thus, the driving control of the arm portion 5145 may be realized.

(Light Source Device)

The light source device 5157 supplies the irradiation light at the time of capturing the surgery portion, to the endoscope 5115. The light source device 5157, for example, includes a white light source including an LED, a laser light source, or a combination thereof. At this time, in a case where the white light source includes a combination of RGB laser light sources, it is possible to control an output intensity and an output timing of each color (each wavelength) with a high accuracy, and thus, it is possible to adjust a white balance of the imaged image in the light source device 5157. In addition, in this case, laser light from each of the RGB laser light sources is applied to the observation target in time division, and the driving of the imaging element of the camera head 5119 is controlled in synchronization with an irradiation timing, and thus, it is also possible to image an image corresponding to each of RGB in time division. According to such a method, it is possible to obtain a color image without providing a color filter in the imaging element.

In addition, the driving of the light source device 5157 may be controlled such that the intensity of the light to be output is changed for each predetermined time. The driving of the imaging element of the camera head 5119 is controlled in synchronization with a timing when the intensity of the light is changed, images are acquired in time division, and the images are synthesized, and thus, it is possible to generate an image of a high dynamic range, without so-called black defects and overexposure.

In addition, the light source device 5157 may be configured to supply light of a predetermined wavelength band corresponding to special light imaging. In the special light imaging, for example, light of a narrow band is applied, compared to irradiation light at the time of performing usual observation by using wavelength dependency of absorbing light in the body tissue (that is, white light), and thus, so-called narrow band imaging of capturing a predetermined tissue of a blood vessel or the like in a superficial portion of a mucous membrane with a high contrast, is performed. Alternatively, in the special light imaging, fluorescent light imaging of obtaining an image by fluorescent light generated by being irradiated with excited light, may be performed. In the fluorescent light imaging, for example, the body tissue is irradiated with the excited light, and the fluorescent light from the body tissue is observed (autofluorescent light imaging), or a reagent such as indian cyanine green (ICG) is locally injected into the body tissue, and the body tissue is irradiated with excited light corresponding to a fluorescent light wavelength of the reagent, and thus, a fluorescent image is obtained. The light source device 5157 can be configured to supply the narrow band light and/or the excited light corresponding to such special light imaging.

(Camera Head and CCU)

Figure 24:
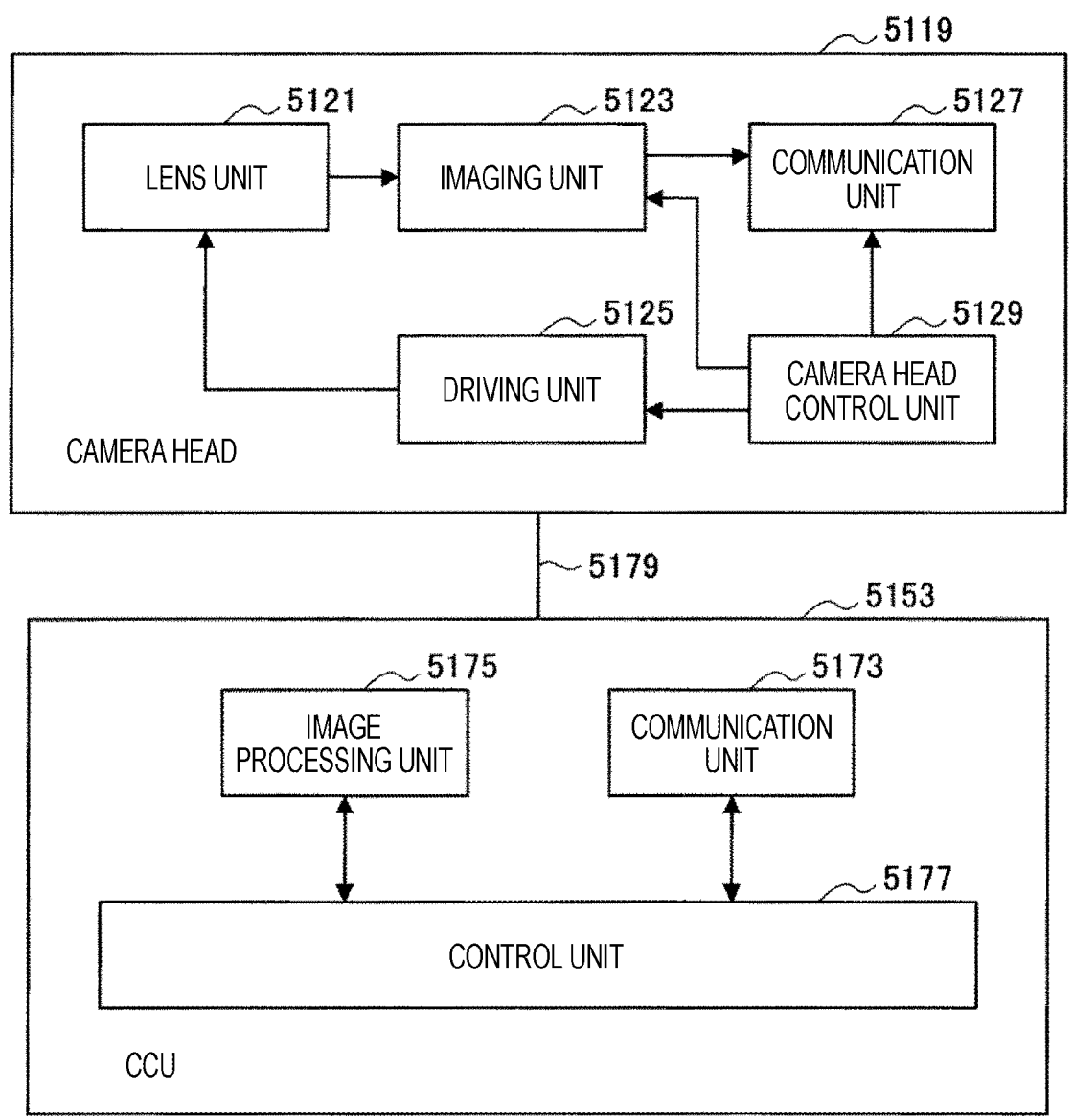
FIG. 24 is a block diagram illustrating an example of a functional configuration of a camera head and a CCU illustrated in FIG. 23.

The function of the camera head 5119 and the CCU 5153 of the endoscope 5115 will be described in more detail, with reference to FIG. 24. FIG. 24 is a block diagram illustrating an example of a functional configuration of the camera head 5119 and the CCU 5153 illustrated in FIG. 23.

With reference to FIG. 24, the camera head 5119 includes a lens unit 5121, an imaging unit 5123, a driving unit 5125, a communication unit 5127, and a camera head control unit 5129, as the function thereof. In addition, the CCU 5153 includes a communication unit 5173, an image processing unit 5175, and a control unit 5177, as the function thereof. The camera head 5119 and the CCU 5153 are connected to be capable of bidirectionally communicating with each other through a transmission cable 5179.

First, the functional configuration of the camera head 5119 will be described. The lens unit 5121 is an optical system provided in a connection portion with the lens tube 5117. Observation light incorporated from a tip end of the lens tube 5117, is guided to the camera head 5119, and is incident on the lens unit 5121. The lens unit 5121 includes a combination of a plurality of lenses including a zoom lens and a focus lens. Optical characteristics of the lens unit 5121 are adjusted such that the observation light is condensed on a light receiving surface of an imaging element of the imaging unit 5123. In addition, the zoom lens and the focus lens are configured such that the position of the zoom lens and the focus lens on an optical axis can be moved in order to adjust the magnification and a focal point of the imaged image.

The imaging unit 5123 includes an imaging element, and is arranged on the later stage of the lens unit 5121. The observation light passing through the lens unit 5121, is condensed on the light receiving surface of the imaging element, and an image signal corresponding to the observation image is generated by the photoelectric conversion. The image signal generated by the imaging unit 5123, is provided to the communication unit 5127.

For example, a complementary metal oxide semiconductor (CMOS) type image sensor, which is capable of performing color capturing having a Bayer array, is used as the imaging element configuring the imaging unit 5123. Furthermore, for example, an element capable of corresponding to high-definition image capturing of greater than or equal to 4 K, may be used as the imaging element. The image of the surgery portion is obtained with a high definition, and thus, the surgery operator 5181 is capable of more specifically grasping the state of the surgery portion, and the surgery is capable of smoothly progressing.

In addition, the imaging element configuring the imaging unit 5123 includes a pair of imaging elements for acquiring each of an image signal for a right eye and an image signal for a left eye, corresponding to the 3D display. The 3D display is performed, and thus, the surgery operator 5181 is capable of more accurately grasping the depth of the biological tissue in the surgery portion. Furthermore, in a case where the imaging unit 5123 has a multi-plate type configuration, a plurality of lens units 5121 are provided corresponding to each of the imaging elements.

In addition, the imaging unit 5123 may not be provided in the camera head 5119. For example, the imaging unit 5123 may be provided immediately after the objective lens, in the lens tube 5117.

The driving unit 5125 includes an actuator, and moves the zoom lens and the focus lens of the lens unit 5121 along the optical axis by a predetermined distance, according to the control from the camera head control unit 5129. With this arrangement, it is possible to suitably adjust the magnification and the focal point of the image imaged by the imaging unit 5123.

The communication unit 5127 includes a communication device for transmitting and receiving various information items with respect to the CCU 5153. The communication unit 5127 transmits the image signal obtained from the imaging unit 5123 to the CCU 5153 through the transmission cable 5179, as the RAW data. At this time, in order to display the imaged image of the surgery portion with a low latency, it is preferable that the image signal is transmitted through optical communication. This is because at the time of the surgery, the surgery operator 5181 performs the surgery while observing the state of the affected part by the imaged image, and thus, in order for a more secure and reliable surgery, a moving image of the surgery portion is required to be displayed in real time to the maximum extent. In a case where the optical communication is performed, in the communication unit 5127, a photoelectric conversion module converting an electrical signal into an optical signal, is provided. The image signal is converted into the optical signal by the photoelectric conversion module, and then, is transmitted to the CCU 5153 through the transmission cable 5179.

In addition, the communication unit 5127 receives a control signal for controlling the driving of the camera head 5119, from the CCU 5153. The control signal, for example, includes information associated with the imaging condition, such as information of designating a frame rate of the imaged image, information of designating an exposure value at the time of the imaging, and/or information of designating the magnification and the focal point of the imaged image. The communication unit 5127 provides the received control signal to the camera head control unit 5129. Furthermore, the control signal from the CCU 5153 may be transmitted through the optical communication. In this case, in the communication unit 5127, a photoelectric conversion module converting the optical signal into an electrical signal, is provided, and the control signal is converted into the electrical signal by the photoelectric conversion module, and then, is provided to the camera head control unit 5129.

Furthermore, the imaging condition such as the frame rate or the exposure value, the magnification, and the focal point, described above, is automatically set by the control unit 5177 of the CCU 5153, on the basis of the acquired image signal. That is, a so-called auto exposure (AE) function, an auto focus (AF) function, and an auto white balance (AWB) function are provided in the endoscope 5115.

The camera head control unit 5129 controls the driving of the camera head 5119, on the basis of the control signal received from the CCU 5153 through the communication unit 5127. For example, the camera head control unit 5129 controls the driving of the imaging element of the imaging unit 5123, on the basis of the information of designating the frame rate of the imaged image and/or the information of designating the exposure at the time of the imaging. In addition, for example, the camera head control unit 5129 suitably moves the zoom lens and the focus lens of the lens unit 5121 through the driving unit 5125, on the basis of the information of designating the magnification and the focal point of the imaged image. Further, the camera head control unit 5129 may have a function of storing information for identifying the lens tube 5117 or the camera head 5119.

Furthermore, the lens unit 5121, the imaging unit 5123, and the like, are arranged in a sealed structure having high airtightness and waterproof properties, and thus, it is possible for the camera head 5119 to have resistance with respect to an autoclave sterilization treatment.

Next, the functional configuration of the CCU 5153 will be described. The communication unit 5173 includes a communication device for transmitting and receiving various information items with respect to the camera head 5119. The communication unit 5173 receives the image signal to be transmitted from the camera head 5119, through the transmission cable 5179. At this time, as described above, the image signal can be preferably transmitted through optical communication. In this case, in the communication unit 5173, a photoelectric conversion module converting an optical signal into an electrical signal, is provided corresponding to the optical communication. The communication unit 5173 provides the image signal converted into the electrical signal, to the image processing unit 5175.

In addition, the communication unit 5173 transmits the control signal for controlling the driving of the camera head 5119, to the camera head 5119. The control signal may be transmitted through the optical communication.

The image processing unit 5175 performs various image processings with respect to the image signal which is the RAW data transmitted from the camera head 5119. For example, various known signal processings such as development processing, high-image quality processing (band emphasizing processing, super-resolution processing, noise reduction (NR) processing and/or shake correction processing, or the like), and/or magnification processing (electron zoom processing), are included as the image processing. In addition, the image processing unit 5175 performs detection processing with respect to the image signal, in order to perform AE, AF, and AWB.

The image processing unit 5175 includes a processor such as a CPU or a GPU, and the processor is operated according to a predetermined program, and thus, the image processing or the detection processing, described above, can be performed. Furthermore, in a case where the image processing unit 5175 includes a plurality of GPUs, the image processing unit 5175 suitably divides information associated with the image signal, and performs the image processing in parallel, by the plurality of GPUs.

The control unit 5177 performs various controls relevant to the imaging of the surgery portion of the endoscope 5115, and the display of the imaged image. For example, the control unit 5177 generates the control signal for controlling the driving of the camera head 5119. At this time, in a case where the imaging condition is input by the user, the control unit 5177 generates the control signal on the basis of the input of the user. Alternatively, in a case where the AE function, the AF function, and the AWB function are provided in the endoscope 5115, the control unit 5177 suitably calculates an optimal exposure value, a focal point distance, and a white balance, according to the result of the detection processing of the image processing unit 5175, and generates the control signal.

In addition, the control unit 5177 displays the image of the surgery portion on the display device 5155, on the basis of the image signal subjected to the image processing by the image processing unit 5175. At this time, the control unit 5177 recognizes various objects in the surgery portion image, by using various image recognition technologies. For example, the control unit 5177 detects the shape, the color, or the like of the edge of the object included in the surgery portion image, and thus, it is possible to recognize a surgical tool such as forceps, a specific biological portion, bleed, mist at the time of using the energy treatment tool 5135, and the like. When the image of the surgery portion is displayed on the display device 5155, the control unit 5177 displays various surgery support information items to be superimposed on the image of the surgery portion, by using a recognition result. The surgery support information is displayed to be superimposed, and is presented to the surgery operator 5181, and thus, a more secure and reliable surgery is capable of progressing.

The transmission cable 5179 connecting the camera head 5119 and the CCU 5153 together, is an electrical signal cable corresponding to the communication of the electrical signal, an optical fiber corresponding to the optical communication, or a composite cable thereof.

Here, in the illustrated example, the communication is performed in a wired manner, by using the transmission cable 5179, but the communication between the camera head 5119 and the CCU 5153, may be performed in a wireless manner. In a case where the communication between the camera head 5119 and the CCU 5153 is performed in a wireless manner, it is not necessary that the transmission cable 5179 is laid in the surgery room, and thus, a problem can be solved, in which the movement of the medical staff in the surgery room is hindered by the transmission cable 5179.

An example of the surgery room system 5100 to which the technology according to the present disclosure can be applied, has been described. Furthermore, here, a case where the medical system to which the surgery room system 5100 is applied, is the endoscope surgery system 5113, has been described as an example, but the configuration of the surgery room system 5100 is not limited to such an example. For example, the surgery room system 5100 may be applied to a flexible endoscope system for a test or a microscope surgery system, instead of the endoscope surgery system 5113.

The technology according to the present disclosure, for example, can be preferably applied to a case in the surgery system 5100 described above, a radiation is detected, or an image using a radiation is generated. For example, it is possible to increase a detection accuracy of the radiation, or to improve image quality of the image using the radiation, by using the light detectors 23a to 23d described above. With this arrangement, for example, it is possible to improve a diagnosis accuracy, or to more smoothly perform the surgery.

Furthermore, the embodiment of the technology according to the present disclosure, are not limited to the embodiments described above, and various modifications can be made within a range not departing from the gist of the technology according to the present disclosure.

<6-2. Combination Example of Configurations>

In addition, for example, the technology according to the present disclosure is also capable of taking the following configurations.

(1)

A detection device, including:

a pixel array portion in which a plurality of first pixels including a photoelectric conversion unit, and a plurality of second pixels not including a photoelectric conversion unit, are arranged; and a driving unit configured to drive the first pixel and the second pixel.

(2)

The detection device according to (1), in which the second pixels are arranged in a region in which the first pixels are arranged.

(3)

The detection device according to (2), in which the second pixels are arranged between the adjacent first pixels in a row in which the first pixels of performing sampling at the same timing, are arranged.

(4)

The detection device according to (3), in which a control line of supplying a first selection signal for selecting the first pixel in the row, is different from a control line of supplying a second selection signal for selecting the second pixel in the row.

(5)

The detection device according to any of (2) to (4), in which the second pixel has a configuration in which at least the photoelectric conversion unit is deleted from the first pixel, and a transistor corresponding to a transfer transistor transferring a charge of the photoelectric conversion unit of the first pixel, is constantly turned off.

(6)
The detection device according to (1),
in which the second pixels are arranged out of a region in which the first pixels are arranged.

(7)
The detection device according to (6),
in which the second pixel includes:
a first transistor corresponding to an amplification transistor of the first pixel; and
a second transistor corresponding to a selection transistor of the first pixel, and
a predetermined voltage is applied to a gate of the first transistor.

(8)
The detection device according to any of (1) to (7), further including:
a detection unit configured to perform sampling of a reset signal indicating a reset level of the first pixel, and an accumulation signal indicating an accumulated charge amount, and sampling of a replica signal, the replica signal being a signal of the second pixel.

(9)
The detection device according to (8),
in which the driving unit performs first driving of driving the first pixel and the second pixel such that a timing for sampling the reset signal of a first pixel group including the plurality of first pixels, is matched to a timing for sampling a first replica signal of a second pixel group including the plurality of second pixels, and a timing for sampling the accumulation signal of the first pixel group, is matched to a timing for sampling a second replica signal of the second pixel group.

(10)
The detection device according to (9),
in which the driving unit drives the first pixel and the second pixel such that sampling is performed in unit of a predetermined number of rows of the pixel array portion, and
the first pixel group includes the first pixels in the predetermined number of rows, and the second pixel group includes the second pixels in the predetermined number of rows.

(11)
The detection device according to (9) or (10),
in which the driving unit is capable of switching the first driving to second driving of driving the first pixel and the second pixel such that the second pixel is fixed to be in a non-selected state, the sampling of the reset signal and the accumulation signal of each of the first pixels is performed in a predetermined order, and a timing for sampling the accumulation signal of one of a third pixel group and a fourth pixel group, and a timing for sampling the reset signal of the other of the third pixel group and the fourth pixel group, back and forth in a sampling order, are matched to each other.

(12)
The detection device according to any of (9) to (11), further including:
an output control unit configured to generate a first differential signal based on a difference between the accumulation signal and the reset signal of one or the plurality of first pixels, and a second differential signal based on a difference between the second replica signal and the first replica signal of one or the plurality of second pixels.

(13)
The detection device according to (12), in which the output control unit generates a third differential signal based on a difference between the first differential signal and the second differential signal.

(14)
Electronic equipment, including:
a detection device; and
a signal processing unit configured to process a signal of the detection device,
in which the detection device includes:
a pixel array portion in which a plurality of first pixels including a photoelectric conversion unit, and a plurality of second pixels not including a photoelectric conversion unit, are arranged; and
a driving unit configured to drive the first pixel and the second pixel.

(15)
A detection device, including:
a pixel array portion in which a plurality of pixels are arranged;
a detection unit configured to perform sampling of a reset signal indicating a reset level of each of the pixels, and an accumulation signal indicating an accumulated charge amount; and
a driving unit configured to drive the pixel such that the sampling of the reset signal and the accumulation signal of each of the pixels is performed in a predetermined order, and a timing for sampling the accumulation signal of one of a first pixel group and a second pixel group, and a timing for sampling the reset signal of the other of the first pixel group and the second pixel group, back and forth in a sampling order, are matched to each other.

(16)
The detection device according to (15),
in which the number of pixels of the first pixel group is approximately identical to the number of pixels of the second pixel group.

(17)
The detection device according to (16),
in which the driving unit drives the pixel such that sampling of a signal of each of the pixels is performed in unit of a predetermined number of rows, and
the number of rows of the first pixel group is identical to the number of rows of the second pixel group.

(18)
The detection device according to any of (15) to (17), further including:
an output control unit configured to generate a differential signal based on a difference between the accumulation signal and the reset signal of one or the plurality of pixels.

(19)
Electronic equipment, including:
a detection device; and
a signal processing unit configured to process a signal of the detection device,
in which the detection device includes:
a pixel array portion in which a plurality of pixels are arranged;
a plurality of detection units configured to perform sampling of a reset signal indicating a reset level of each of the pixels, and an accumulation signal indicating an accumulated charge amount; and
a driving unit configured to drive the pixels such that the sampling of the reset signal and the accumulation signal of each of the pixels is performed in a predetermined order, and a timing for sampling the accumulation signal one of a first pixel group and a second pixel group, and a timing for sampling the reset signal of the other of the first pixel group and the second pixel group, back and forth in a sampling order, are matched to each other.

REFERENCE SIGNS LIST

1 Radiation counter device
11 Light receiving unit
12 Data processing unit
21 Scintillator
23 Light detector
31, 31a to 31d Pixel array portion
31Ab, 31Ac Region
41, 41a, 41b Pixel
51 Timing control circuit
52 Row driving circuit
54 Detection unit
55 Column driving circuit
56a, 56b Switch
57 Output control circuit
58 Control line
59a, 59b Vertical signal line
71a, 71b Detection circuit
111 Photodiode
112 Accumulation node
113 Transfer transistor
114 Detection node
115 Reset transistor
116 Amplification transistor
117 Selection transistor
151a, 151b Dummy pixel
201a, 201b Replica pixel
202 Control line
231 Amplification transistor
232 Selection transistor
241 Variable source
301a, 301b Replica pixel
302 Control line
321 Transfer transistor
322 Detection node
323 Reset transistor
324 Amplification transistor
325 Selection transistor
401 Flow cytometer
412 Laser light source
413 Photodiode
421 Laser light
421A irradiation spot
422 Forward-scattered light
423 Detection light

The invention claimed is:

1. A detection device, comprising:
a pixel array portion in which a plurality of first pixels including a photoelectric conversion unit, and a plurality of second pixels not including a photoelectric conversion unit, are arranged;
a driving unit configured to drive the first pixels and the second pixels; and
a detection unit configured to perform sampling of a reset signal indicating a reset level of the first pixels, an accumulation signal indicating an accumulated charge amount, and a replica signal, the replica signal being a signal of the second pixels,
wherein the driving unit performs a first driving of driving the first pixels and the second pixels such that a timing for sampling the reset signal of a first pixel group including the plurality of first pixels, is matched to a timing for sampling a first replica signal of a second pixel group including the plurality of second pixels, and a timing for sampling the accumulation signal of the first pixel group, is matched to a timing for sampling a second replica signal of the second pixel group, and
wherein the driving unit is capable of switching the first driving to a second driving of driving the first pixels and the second pixels such that the second pixels are fixed to be in a non-selected state, the sampling of the reset signal and the accumulation signal of each of the first pixels is performed in a predetermined order, and a timing for sampling the accumulation signal of one of a third pixel group and a fourth pixel group, and a timing for sampling the reset signal of the other of the third pixel group and the fourth pixel group, back and forth in a sampling order, are matched to each other.

2. The detection device according to claim 1, wherein the second pixels are arranged in a region in which the first pixels are arranged.

3. The detection device according to claim 2, wherein the second pixels are arranged between adjacent first pixels in a row in which the first pixels perform sampling at a same time are arranged.

4. The detection device according to claim 3,
wherein a control line of supplying a first selection signal for selecting the first pixels in the row, is different from a control line of supplying a second selection signal for selecting the second pixels in the row.

5. The detection device according to claim 2,
wherein the second pixels include a transfer transistor that is constantly turned off.

6. The detection device according to claim 1, wherein the second pixels are arranged out of a region in which the first pixels are arranged.

7. The detection device according to claim 6,
wherein the each of the second pixels includes:
a first transistor corresponding to an amplification transistor of each of the first pixels; and
a second transistor corresponding to a selection transistor of each of the first pixels, and
a predetermined voltage is applied to a gate of the first transistor.

8. The detection device according to claim 1,
wherein the driving unit drives the first pixels and the second pixels such that sampling is performed in a unit of a predetermined number of rows of the pixel array portion, and
the first pixel group includes the first pixels in the predetermined number of rows, and the second pixel group includes the second pixels in the predetermined number of rows.

9. The detection device according to claim 1, further comprising:
an output control unit configured to generate a first differential signal based on a difference between the accumulation signal and the reset signal of one or the plurality of first pixels, and a second differential signal based on a difference between the second replica signal and the first replica signal of one or the plurality of second pixels.

10. The detection device according to claim 9,
wherein the output control unit generates a third differential signal based on a difference between the first differential signal and the second differential signal.

11. The detection device according to claim 1, wherein each of the second pixels is provided at a location further remote from the detection unit than the first pixels in a vertical direction.

12. Electronic equipment, comprising:
a detection device; and
a signal processing unit configured to process a signal of the detection device,
wherein the detection device includes:
a pixel array portion in which a plurality of first pixels including a photoelectric conversion unit, and a plurality of second pixels not including a photoelectric conversion unit, are arranged;
a driving unit configured to drive the first pixels and the second pixels; and
a detection unit configured to perform sampling of a reset signal indicating a reset level of the first pixels, an accumulation signal indicating an accumulated charge amount, and a replica signal, the replica signal being a signal of the second pixels,
wherein the driving unit performs a first driving of driving the first pixels and the second pixels such that a timing for sampling the reset signal of a first pixel group including the plurality of first pixels, is matched to a timing for sampling a first replica signal of a second pixel group including the plurality of second pixels, and a timing for sampling the accumulation signal of the first pixel group, is matched to a timing for sampling a second replica signal of the second pixel group, and
wherein the driving unit is capable of switching the first driving to a second driving of driving the first pixels and the second pixels such that the second pixels are fixed to be in a non-selected state, the sampling of the reset signal and the accumulation signal of each of the first pixels is performed in a predetermined order, and a timing for sampling the accumulation signal of one of a third pixel group and a fourth pixel group and a timing for sampling the reset signal of the other of the third pixel group and the fourth pixel group, back and forth in a sampling order, are matched to each other.

13. The electronic equipment according to claim 12, wherein the second pixels are arranged between adjacent first pixels in a row in which the first pixels perform sampling at a same time are arranged.

14. The electronic equipment according to claim 12, wherein the second pixels are arranged out of a region in which the first pixels are arranged.

15. The electronic equipment according to claim 12, wherein each of the second pixels is provided at a location further remote from the detection unit than the first pixels in a vertical direction.

16. A detection device, comprising:
a pixel array portion in which a plurality of pixels is arranged;
a detection unit configured to perform sampling of a reset signal indicating a reset level of each of the pixels, and an accumulation signal indicating an accumulated charge amount; and
a driving unit configured to drive the pixels such that the sampling of the reset signal and the accumulation signal of each of the pixels is performed in a predetermined order, and a timing for sampling the accumulation signal of one of a first pixel group and a second pixel group, and a timing for sampling the reset signal of the other of the first pixel group and the second pixel group, back and forth in a sampling order, are matched to each other.

17. The detection device according to claim 16,
wherein a number of pixels of the first pixel group is approximately identical to a number of pixels of the second pixel group.

18. The detection device according to claim 17,
wherein the driving unit drives the pixels such that sampling of a signal of each of the pixels is performed in a unit of a predetermined number of rows, and
the number of rows of the first pixel group is identical to the number of rows of the second pixel group.

19. The detection device according to claim 16, further comprising:
an output control unit configured to generate a differential signal based on a difference between the accumulation signal and the reset signal of one or the plurality of pixels.

20. Electronic equipment, comprising:
a detection device; and
a signal processing unit configured to process a signal of the detection device,
wherein the detection device includes:
a pixel array portion in which a plurality of pixels is arranged;
a plurality of detection units configured to perform sampling of a reset signal indicating a reset level of each of the pixels, and an accumulation signal indicating an accumulated charge amount; and
a driving unit configured to drive the pixels such that the sampling of the reset signal and the accumulation signal of each of the pixels is performed in a predetermined order, and a timing for sampling the accumulation signal of one of a first pixel group and a second pixel group, and a timing for sampling the reset signal of the other of the first pixel group and the second pixel group, back and forth in a sampling order, are matched to each other.

* * * * *